(12) United States Patent
Kim et al.

(10) Patent No.: US 7,026,688 B2
(45) Date of Patent: Apr. 11, 2006

(54) FIELD EFFECT TRANSISTORS HAVING MULTIPLE STACKED CHANNELS

(75) Inventors: Sung-Min Kim, Incheon-metrocity (KR); Dong-Gun Park, Gyeonggi-do (KR); Chang-Sub Lee, Gyeonggi-do (KR); Jeong-Dong Choe, Gyeonggi-do (KR); Shin-Ae Lee, Gyeonggi-do (KR); Seong-Ho Kim, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 11/119,786

(22) Filed: May 2, 2005

(65) Prior Publication Data
US 2005/0189583 A1      Sep. 1, 2005

Related U.S. Application Data

(63) Continuation of application No. 10/610,607, filed on Jul. 1, 2003.

(30) Foreign Application Priority Data

Oct. 1, 2002      (KR) ............................ 2002-0059886

(51) Int. Cl.
*H01L 29/76* (2006.01)
*H01L 29/94* (2006.01)

(52) U.S. Cl. ...................... 257/331; 257/332; 257/401

(58) Field of Classification Search ................ 257/331, 257/332, 401
See application file for complete search history.

(56) References Cited

U.S. PATENT DOCUMENTS

| 4,996,574 | A | 2/1991 | Shirasaki |
| 5,221,849 | A | 6/1993 | Goronkin et al. |
| 5,412,224 | A | 5/1995 | Goronkin et al. |
| 5,583,362 | A | 12/1996 | Maegawa |
| 5,965,914 | A | 10/1999 | Miyamoto |
| 6,190,234 | B1 | 2/2001 | Swedek et al. |

(Continued)

FOREIGN PATENT DOCUMENTS

EP      1 056 135 A1      11/2000

(Continued)

OTHER PUBLICATIONS

Combined Search and Examination Report Under Sections 17 and 18(3), GB 0231985.4, Mar. 17, 2004.

(Continued)

*Primary Examiner*—Zandra V. Smith
*Assistant Examiner*—Kiesha Rose
(74) *Attorney, Agent, or Firm*—Myers Bigel Sibley & Sajovec

(57) ABSTRACT

Integrated circuit field effect transistor devices include a substrate having a surface and an active channel pattern on the surface. The active channel pattern includes channels that are stacked upon one another and are spaced apart from one another to define at least one tunnel between adjacent channels. A gate electrode surrounds the channels and extends through the at least one tunnel. A pair of source/drain regions also is provided. Integrated circuit field effect transistors are manufactured, by forming a pre-active pattern on a surface of a substrate. The pre-active pattern includes a series of interchannel layers and channel layers stacked alternately upon each other. Source/drain regions are formed on the substrate at opposite ends of the pre-active pattern. The interchannel layers are selectively removed to form tunnels. A gate electrode is formed in the tunnels and surrounding the channels.

17 Claims, 41 Drawing Sheets

U.S. PATENT DOCUMENTS

| | | |
|---|---|---|
| 6,413,802 B1 | 7/2002 | Hu et al. |
| 6,440,806 B1 | 8/2002 | Xiang |
| 2002/0149031 A1 | 10/2002 | Kim et al. |
| 2004/0056285 A1 | 3/2004 | Cabral et al. |

FOREIGN PATENT DOCUMENTS

| | | |
|---|---|---|
| JP | 11-8390 A | 1/1999 |
| JP | 2000-340793 A | 12/2000 |
| KR | 95002202 B1 | 3/1995 |

OTHER PUBLICATIONS

Notice to Submit Response, Korean Patent Application No. 10-2002-0059886, Sep. 2, 2004.

Translation of an Official Letter as Issued by the German Patent and Trademark Office, Application No. 103 39 920. 8-33, Nov. 4, 2004.

FIELD EFFECT TRANSISTORS HAVING MULTIPLE STACKED CHANNELS

CROSS-REFERENCE TO RELATED APPLICATIONS

This application is a continuation of application Ser. No. 10/610,607, filed Jul. 1, 2003, entitled *Field Effect Transistors Having Multiple Stacked Channels*, which itself claims the benefit of Korean Patent Application No. 2002-0059886, filed Oct. 1, 2002, the disclosure of which is hereby incorporated herein by reference in its entirety as if set forth fully herein.

FIELD OF THE INVENTION

The present invention relates to integrated circuit devices and methods of manufacturing the same. More particularly, the present invention relates to field effect transistors and methods of manufacturing the same.

BACKGROUND OF THE INVENTION

Integrated circuit field effect transistors are widely used in logic, memory, processor and other integrated circuit devices. As is well known to those having skill in the art, an integrated circuit field effect transistor includes spaced apart source and drain regions, a channel therebetween and a gate electrode adjacent the channel. Integrated circuit field effect transistors are often referred to as Metal Oxide Semiconductor Field Effect Transistors (MOSFETs) or simply as MOS devices. Although these terms will be used in the present application, they are used to generally denote integrated circuit field effect transistors and are not limited to field effect transistors having metal gates or oxide gate insulators.

As the integration density of integrated circuit field effect transistors continues to increase, the size of the active region and the channel length may continue to decrease. With the reduction in the channel length of the transistor, the influence of the source/drain upon the electric field or potential in the channel region may become considerable. This is called the "short channel effect". Further, with the scaling down of the active size, the channel width decreases which may increase a threshold voltage. This is called the "narrow width effect".

Various structures have been developed in attempts to improve or maximize the device performance, while reducing the sizes of elements formed on a substrate. For example, there are vertical transistor structures known as a fin structure, a DELTA (fully Depleted Lean-channel TrAnsistor) structure and GAA (Gate All Around) structure.

For example, U.S. Pat. No. 6,413,802 discloses a FinFET device. As noted in the Abstract of this patent, a FinFET device is fabricated using conventional planar MOSFET technology. The device is fabricated in a silicon layer overlying an insulating layer (e.g., SIMOX) with the device extending from the insulating layer as a fin. Double gates are provided over the sides of the channel to provide enhanced drive current and effectively suppress short channel effects. A plurality of channels can be provided between a source and a drain for increased current capacity. In one embodiment, two transistors can be stacked in a fin to provide a CMOS transistor pair having a shared gate.

An example of a MOS transistor having DELTA structure is disclosed in U.S. Pat. No. 4,996,574. As noted in the Abstract of this patent, a metal-insulator-semiconductor transistor comprises an insulator layer, a semiconductor body provided on the insulator layer and comprising a source region, a drain region and a channel region extending in a first direction between and interconnecting the source region and the drain region, a gate insulator film provided on the semiconductor body so as to cover the channel region except for the part of the channel region in contact with the insulator layer, and a gate electrode of a conductive material provided in contact with the gate insulator film so as to cover the channel region underneath the gate insulator film except for the part of the channel region in contact with the insulator layer. The channel region has a width substantially smaller than twice the maximum extension of the depletion region formed in the channel region.

An example of a thin film transistor having the GAA structure is disclosed in U.S. Pat. No. 5,583,362. In typical MOS transistors of GAA structure, the SOI layer serves as an active pattern and a gate electrode is formed surrounding a channel region of the active pattern of which the surface is covered with a gate-insulating layer.

SUMMARY OF THE INVENTION

Integrated circuit field effect transistor devices according to some embodiments of the present invention include a substrate having a surface and an active channel pattern on the surface. The active channel pattern comprises a plurality of channels that are stacked upon one another and are spaced apart from one another to define at least one tunnel, a respective one of which is between respective adjacent ones of the channels. A gate electrode surrounds the plurality of channels and extends through the at least one tunnel. A pair of source/drain regions also is provided, a respective one of which is on the surface at a respective one of opposite sides of the active channel pattern and is electrically connected to the plurality of channels.

In some embodiments, the plurality of channels comprises first and second opposite sides and third and fourth opposite sides, wherein a respective one of the source/drain regions are located at a respective one of the first and second opposite sides, and wherein the gate electrode surrounds the plurality of channels on the third and fourth opposite sides and extends through the at least one tunnel. In other embodiments, at least three channels and two tunnels are provided wherein the tunnels extend parallel to the surface to define a series of alternating channels and tunnels that are stacked on the surface in a direction that is orthogonal to the surface. In yet other embodiments, the channels comprise a single crystalline semiconductor film such as silicon. In some embodiments, the source/drain regions have a uniform doping profile in a direction perpendicular to the plurality of channels.

Integrated circuit field effect transistors are manufactured, according to some embodiments of the present invention, by forming a pre-active pattern on a surface of a substrate. The pre-active pattern comprises a series of interchannel layers and channel layers stacked alternately upon each other. Source/drain regions are formed on the substrate at opposite ends of the pre-active pattern. The plurality of interchannel layers are selectively removed to form a plurality of tunnels passing through the pre-active pattern, to thereby define an active channel pattern comprising the tunnels and a plurality of channels comprising the channel layers. A gate electrode is formed in the tunnels and surrounding the channels.

In some embodiments, the source/drain regions are formed by etching spaced apart regions of the pre-active pattern and forming source/drain regions in the etched regions. The spaced apart regions may be etched to define first and second opposite sides of the pre-active patterns, and a respective one of the source/drain regions may be formed at a respective one of the first and second opposite sides. The tunnels may pass through the pre-active pattern from third to fourth sides thereof, so that the gate electrode surrounds the channels on the third and fourth sides.

According to some embodiments of the present invention, multiple thin channels can be formed from one active pattern and the gate electrode surrounds the channels. Since the plurality of thin channels are stacked vertically, areas occupied by the channel region and the source/drain regions may be reduced as compared to, for example, a conventional fin-type MOS transistor.

Further, in some embodiments, the source/drain regions have a uniform doping profile in a direction perpendicular to the plurality of channels, so that uniform source/drain junction capacitance can be maintained even though the number and area of the channels increase. Thus, while reducing the junction capacitance, the current can be increased to enhance the operating speed of the device.

Finally, in some embodiments of the present invention, after alternately stacking the plurality of channel layers and the plurality of interchannel layers to form the active pattern, regions of the active pattern where source/drain regions are to be formed are etched away. The etched regions can be provided with an epitaxial single crystalline film or a conductive material to form the source/drain regions. Since the horizontal length of the interchannel layer may be limited within a length region of the gate, it can reduce or prevent the tunnels from extending horizontally when the interchannel layers are isotropically etched to form the tunnels in a subsequent process. Thus, a highly integrated MOS transistor having a gate length smaller than a channel width can be realized in some embodiments of the present invention.

DETAILED DESCRIPTION

Figure 1A:
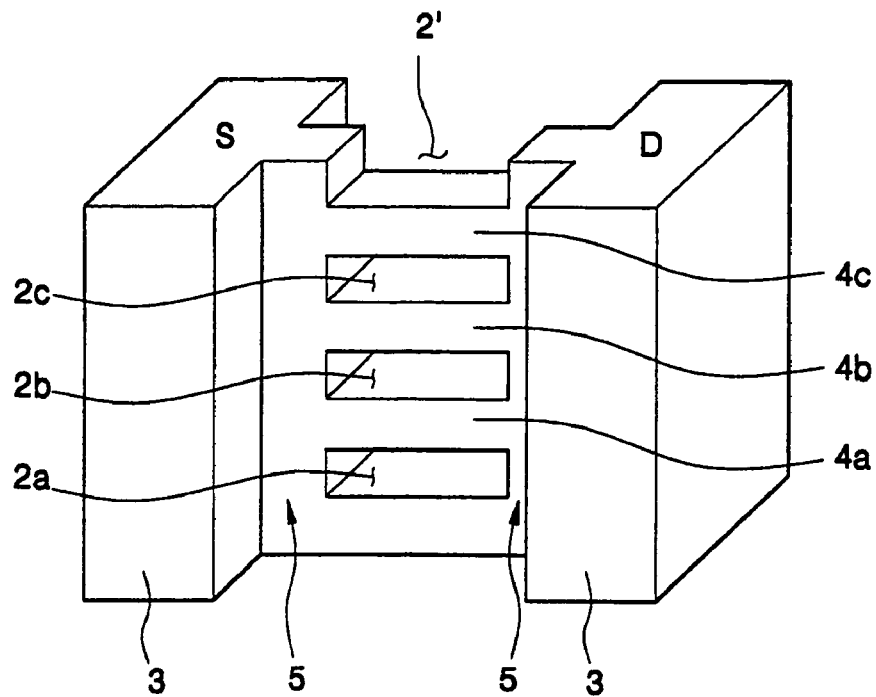
FIGS. 1A and 1B are perspective views showing an active pattern and a gate electrode of a MOS transistor having multiple channels in accordance with some embodiments of the present invention, respectively.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element such as a layer, region or substrate is referred to as being "on" another element, it can be directly on the other element or intervening elements may also be present. It will be understood that when an element is referred to as being "connected" or "coupled" to another element, it can be directly connected or coupled to the other element or intervening elements may be present. It will be understood that if part of an element, such as a surface of a conductive line, is referred to as "outer," it is closer to the outside of the substrate than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements.

Figure 1B:
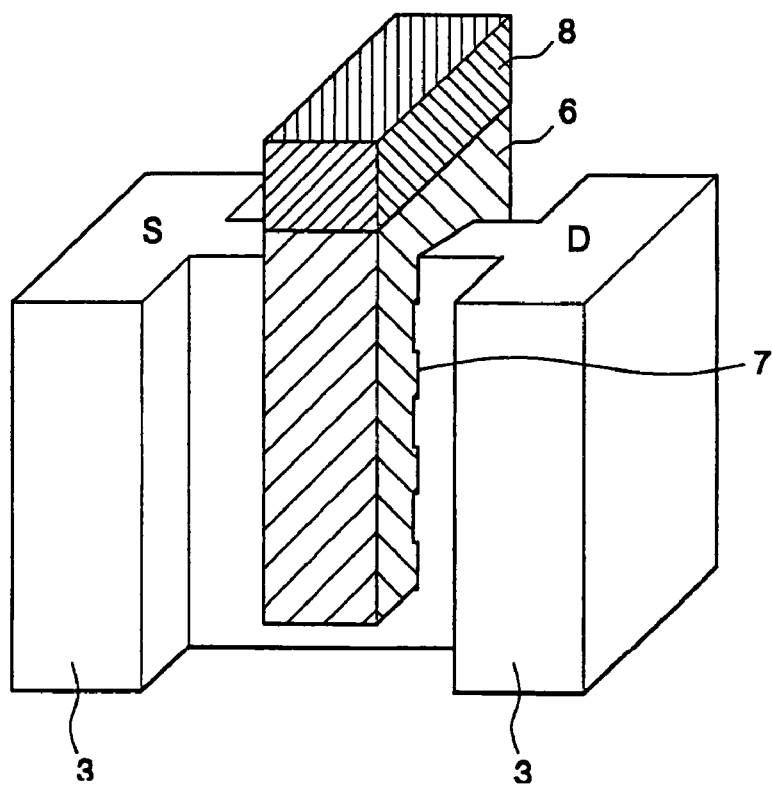

FIGS. 1A and 1B are perspective views showing an active pattern and a gate electrode of a MOS transistor having multiple channels, respectively, in accordance with some embodiments of the present invention.

Referring to FIG. 1A, an active pattern formed on a surface of an integrated circuit substrate such as a semiconductor substrate (not shown) includes a plurality of channels 4a, 4b and 4c formed in a vertical direction. Though three channels 4a, 4b and 4c are shown in the embodiment, two channels may be formed or the number of channels may be more than three.

The channels 4a, 4b and 4c have a vertically stacked structure with a narrow width. A plurality of tunnels 2a, 2b and 2c are formed between the channels 4a, 4b and 4c. Source/drain regions 3 are formed at the both sides of the active pattern so as to be connected to the plurality of channels 4a, 4b and 4c.

The source/drain regions 3 are formed to have a width wider than that of the channels 4a, 4b and 4c. Between the source/drain regions 3 and the channels 4a, 4b, 4c, there may be formed source/drain extension layers 5 connecting the source/drain regions 4 to the channels 4a, 4b and 4c.

Particularly, the active pattern comprises the source/drain regions 3 of a rectangular parallelepiped shape having a relatively wide width on the both sides of the active pattern. It will be understood, however, that the active pattern may have any polygonal shape, and that the sides and vertices need not be equal. A channel region having a width narrower than the rectangular parallelepiped shape is formed between the source/drain regions 3 to connect the source/drain regions 3 to each other. The channel region includes two source/drain extension layers 5 connected to the source/drain regions 3. Two source/drain extension layers 5 are connected to each other by the plurality of channels 4a, 4b and 4c formed in a vertical direction. The plurality of tunnels 2a, 2b and 2c are formed between the channels 4a, 4b and 4c. The lowest tunnel 2a is formed between the lowest channel layer 4a and the underlying surface portion of the semiconductor substrate. A groove 2' of a tunnel shape is formed on the uppermost channel 4c.

Referring to FIG. 1B, a gate electrode 6 is formed on the active pattern. While extending through and/or filling up the plurality of tunnels 2a, 2b and 2c and the tunnel groove 2', the gate electrode 6 is formed to surround the plurality of channels 4a, 4b and 4c in a vertical direction (i.e., a direction perpendicular to the forming direction of the source/drain regions on the plan). A gate-insulating layer 7 is formed between the gate electrode 6 and the plurality of channels 4a, 4b and 4c.

The semiconductor substrate comprises silicon (Si), silicon germanium (SiGe), silicon-on-insulator (SOI), silicon germanium-on-insulator (SGOI) and/or other conventional substrates. In some embodiments, the semiconductor substrate comprises a single crystalline Si.

The channels 4a, 4b and 4c comprise a single crystalline semiconductor film, such as silicon film. The source/drain regions 3 comprise a selective epitaxial single crystalline film or a conductive film such as a polysilicon film, a metal film, a metal silicide film, etc. In case of using the selective epitaxial single crystalline film or the polysilicon film, an impurity is ion-implanted in the source/drain regions 3 so that the source/drain regions 3 are conductive.

In case of forming the source/drain extension layers 5 between the channels 4a, 4b and 4c and the source/drain regions 3 as shown in the figure, in some embodiments the source/drain regions 3 comprise a conductive film such as a polysilicon film, a metal film, a metal silicide film, etc. and the source/drain extension layer 3 comprises a selective epitaxial single crystalline film.

The gate electrode 6 comprises a polysilicon film and may include a gate stack layer 8 formed on the top surface of the gate electrode 6. The gate stack layer 8 comprises a metal silicide for reducing a gate resistance and/or an insulating material for capping the gate electrode 6. The gate-insulating layer 7 comprises a thermal oxide film or an ONO film.

In a MOS transistor of some embodiments of the present invention, the plurality of thin channels 4a, 4b and 4c are connected to the source/drain regions 3 and the source/drain regions 3 are formed to have a uniform doping profile in a direction perpendicular to the plurality of channels 4a, 4b and 4c, which can maintain the uniform source/drain junction capacitance even though the number of the channels increases. So, while reducing or minimizing the junction capacitance, the current can increase to enhance the device speed.

Further, the MOS transistor having a gate electrode smaller than a channel width may be provided in some embodiments because the gate electrode 6 surrounds the plurality of channels 4a, 4b and 4c, which can result in an improvement in the device integration.

In addition, in some embodiments, regions of the active pattern where source/drain regions are to be formed are etched away, in which the active pattern comprises a plurality of interchannel layers serving as the tunnel 2 and a plurality of channel layers serving as the channels 4a, 4b and 4c which are stacked alternately with each other. Then, the etched regions are provided with and/or filled up with an epitaxial single crystalline film and/or a conductive material to form the source/drain regions 3. Accordingly, only active pattern of the channel region may remain, so that a horizontal length of the tunnel 2 filled with the gate electrode may be limited within a gate length region to thereby obtain a highly integrated MOS transistor having a smaller gate length than a channel width.

Embodiment 1

Figure 2A:
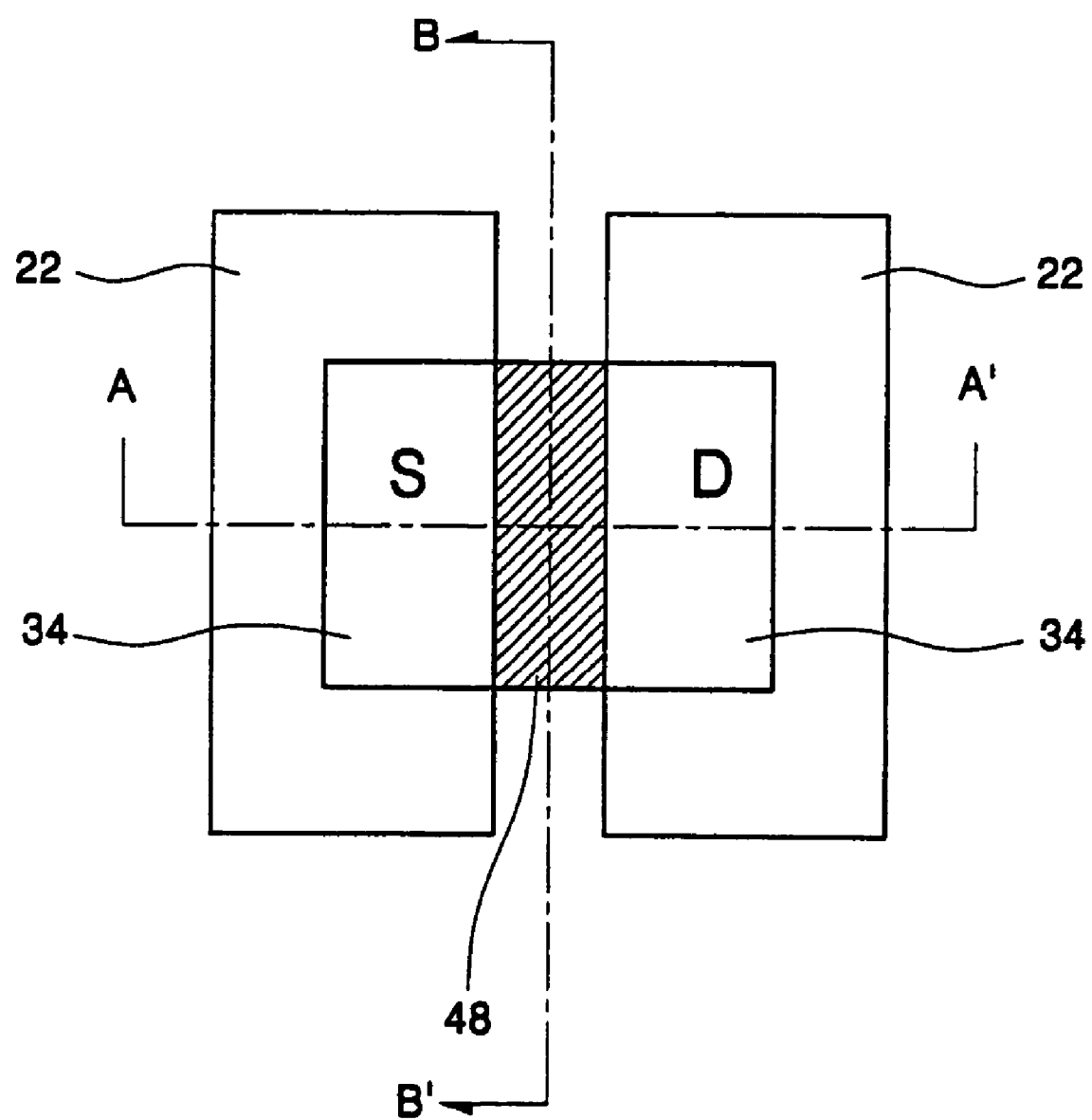
FIG. 2A is a plan view of a device in accordance with first embodiments of the present invention.
Figure 2B:
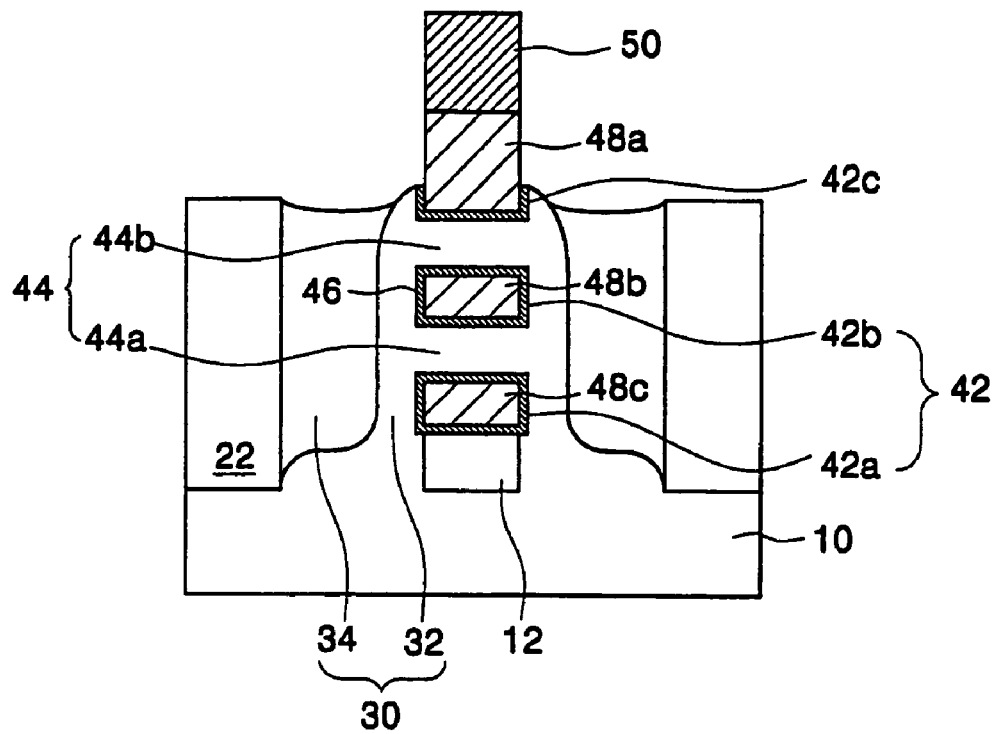
FIGS. 2B and 2C are cross-sectional views of the device of FIG. 2A taken along lines AA' and BB' of FIG. 2A, respectively.
Figure 2C:
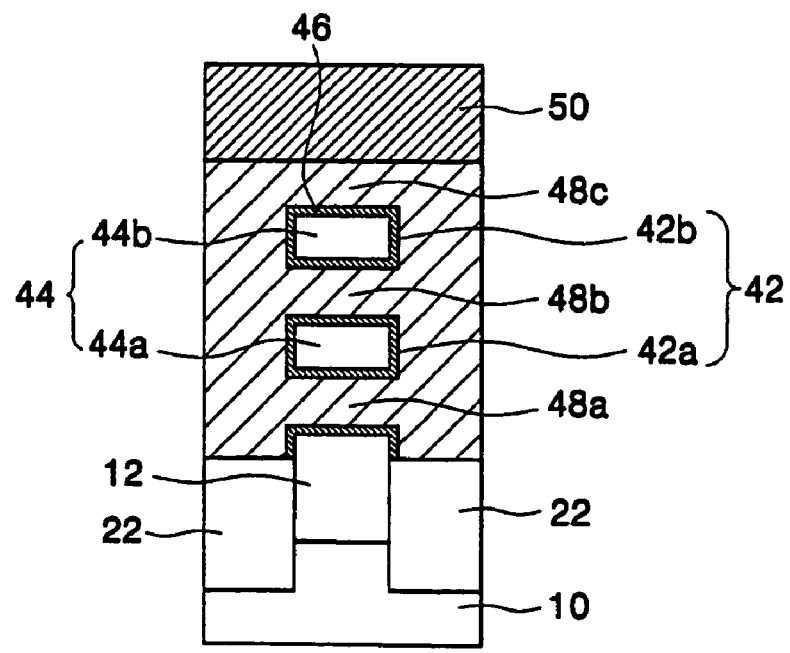

FIG. 2A is a plan view of a semiconductor device in accordance with first embodiments of the present invention. FIGS. 2B and 2C are cross-sectional views of the semiconductor device taken along lines AA' and BB' of FIG. 2A, respectively.

Referring to FIGS. 2A to 2C, an active pattern 30 including multiple channels 44 having a plurality of channels 44a and 44b formed vertically in the upside direction is formed on a main surface of a substrate 10 comprising silicon (Si), silicon germanium (SiGe), silicon-on-insulator (SOI), silicon germanium-on-insulator (SGOI) and/or other conventional materials/layers. Source/drain regions 34 are formed so as to be connected to the channels 44a and 44b at opposite sides of the active pattern 30. Between the source/drain regions 34 and the plurality of channels 44a and 44b, there are formed source/drain extension layers 32 connected to the source/drain regions 34 and connected to the channels 44 and 44b. That is, the source/drain extension layers 32 serve as a bridge linking the source/drain regions 34 to the plurality of channels 44a and 44b.

A plurality of tunnels 42 is formed between the plurality of channels 44a and 44b. The lowest tunnel 42a is formed between the lowest channel layer 44a and the underlying surface portion of the semiconductor substrate, i.e., a heavily doped impurity region 12 of the substrate 10. A groove 42c of a tunnel shape is formed on the uppermost channel 44b.

The channels 44a and 44b may comprise a semiconductor material such as single crystalline Si, while the source/drain regions 34 may comprise a conductive material such as polysilicon, metal, metal silicide, etc. Here, the source/drain extension layers 32 are formed to be extended from the channels 44a and 44b using the same material as in the channels 44a and 44b. In some embodiments, the source/drain extension layers 32 are comprised of selective epitaxial single crystalline Si.

On the active pattern 30, there is formed a gate electrode 48 extending through and/or filling up the tunnel 42 including the plurality of tunnels 42a and 42b formed between the channels 44a and 44b and surrounding the channels 44a and 44b in a vertical direction. A gate-insulating layer 46 is formed between the gate electrode 48 and the channels 44a and 44b, i.e., on the inner surfaces of the tunnel 42 and on the inner sidewalls and bottom surfaces of the groove 42 of a tunnel shape. In some embodiments, the gate electrode 48 comprises a polysilicon and a gate stack layer 50 of a metal silicide for reducing a gate resistance is formed on the top surface of the gate electrode 48.

Field regions 22 are formed so as to surround the source/drain regions 34 except the channel region of the plurality of channels 44a and 44b. A heavily doped region 12 is formed in the main surface portion of the substrate 10 below the active pattern 30, i.e., below the lowest channel 44a. The heavily doped region 12 can reduce or prevent the operation of a bottom transistor causing a short channel effect.

Figure 3A:
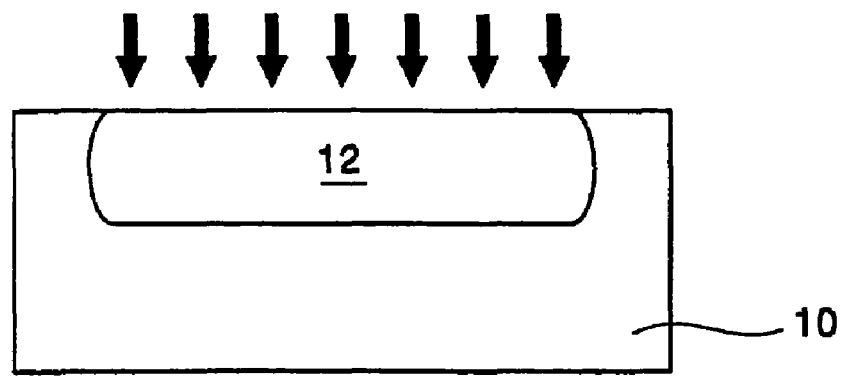
FIGS. 3A to 3R are cross-sectional views illustrating methods of manufacturing a device according to the first embodiments of the present invention.
Figure 3B:
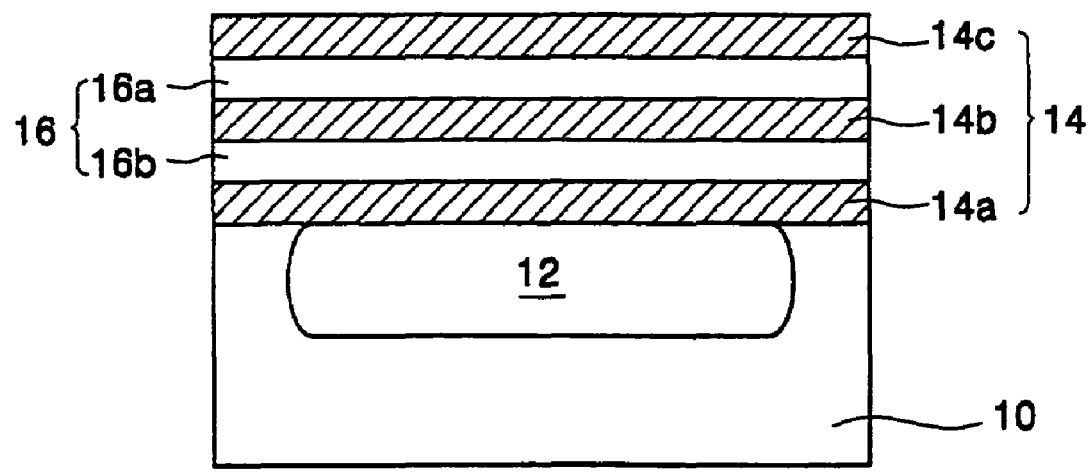
Figure 3C:
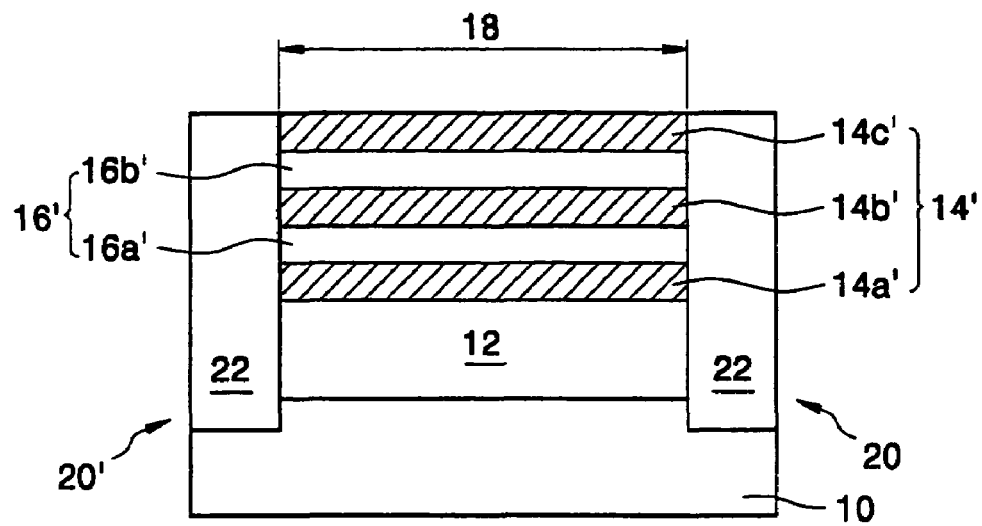
Figure 3D:
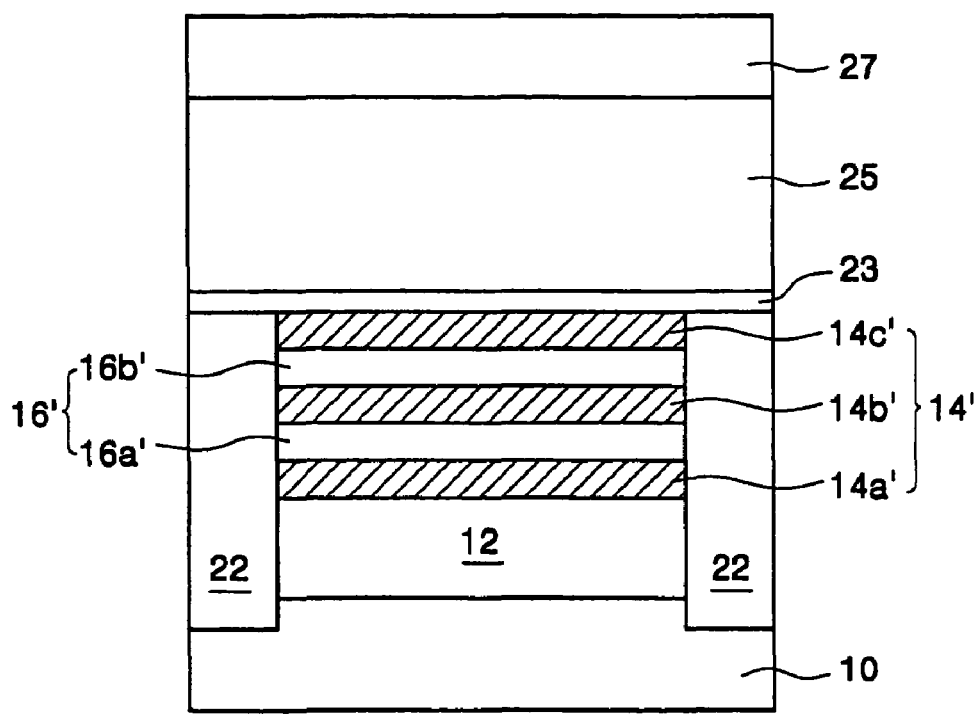
Figure 3E:
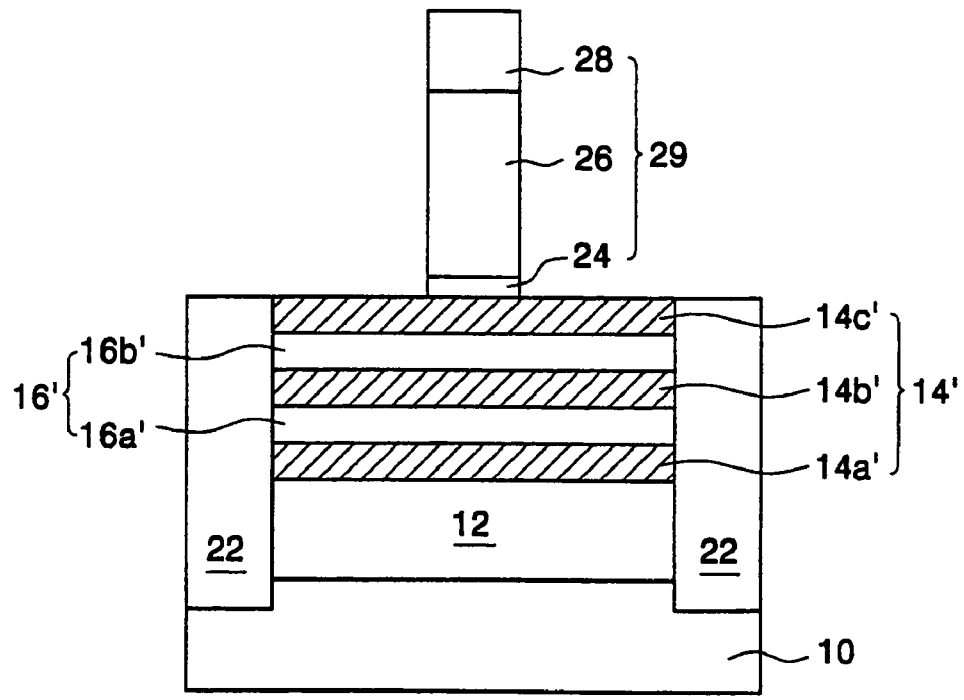
Figure 3F:
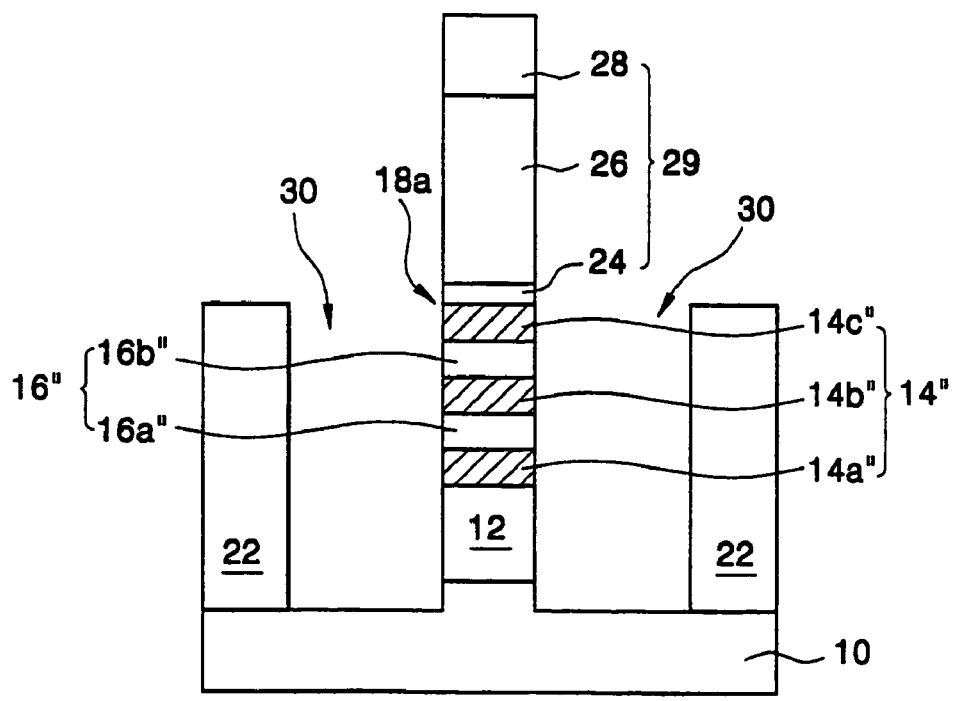
Figure 3G:
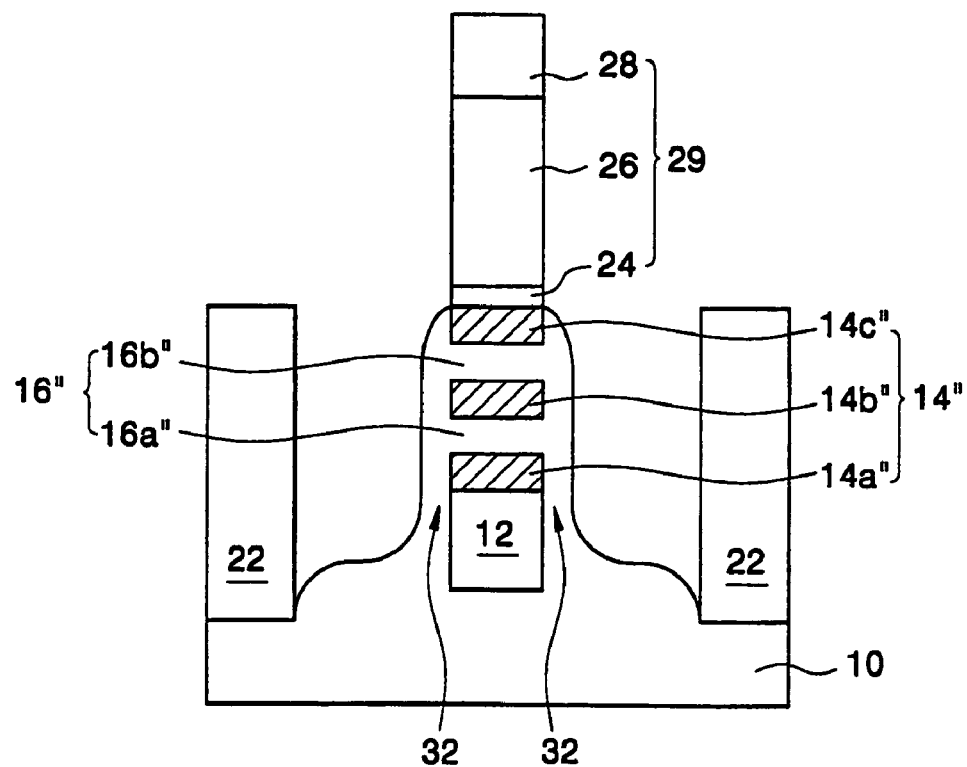
Figure 3H:
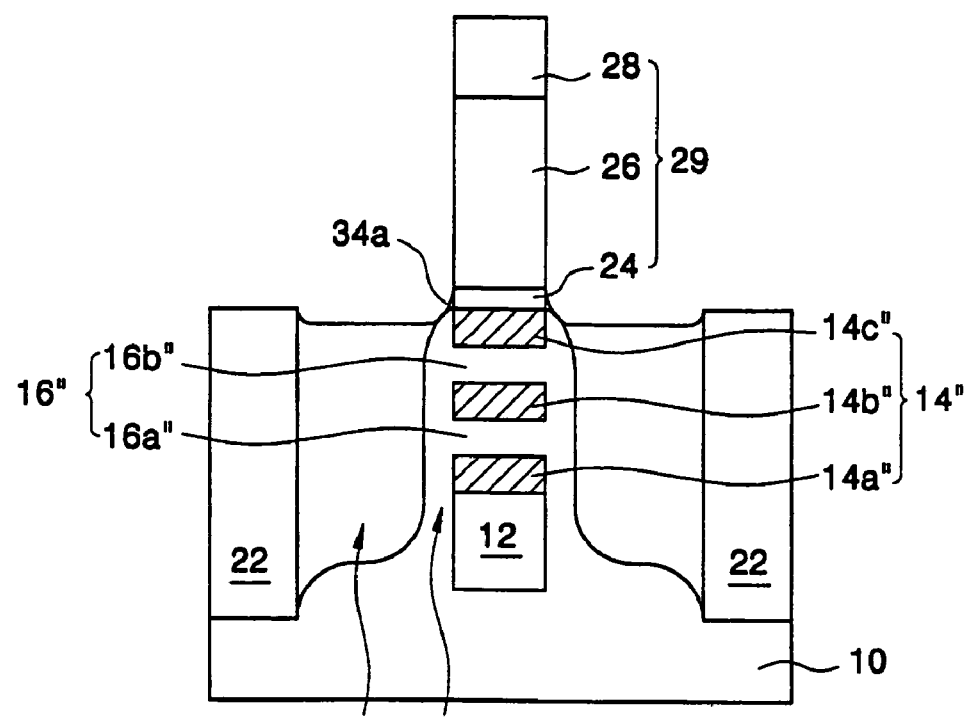
Figure 3I:
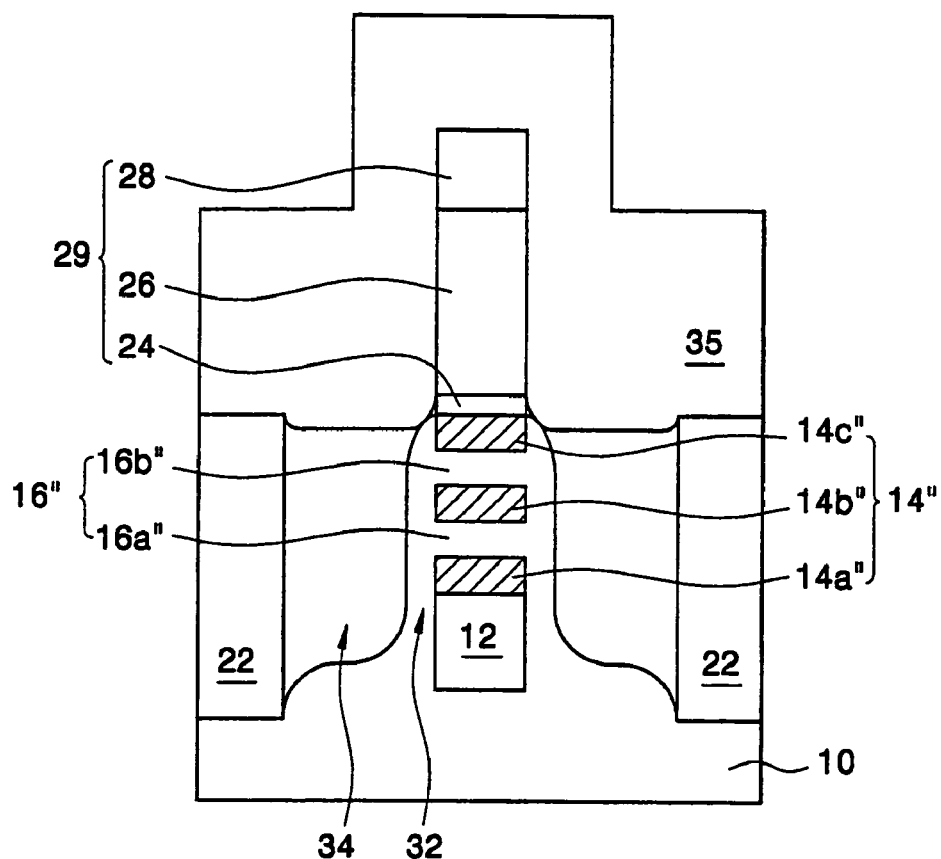
Figure 3J:
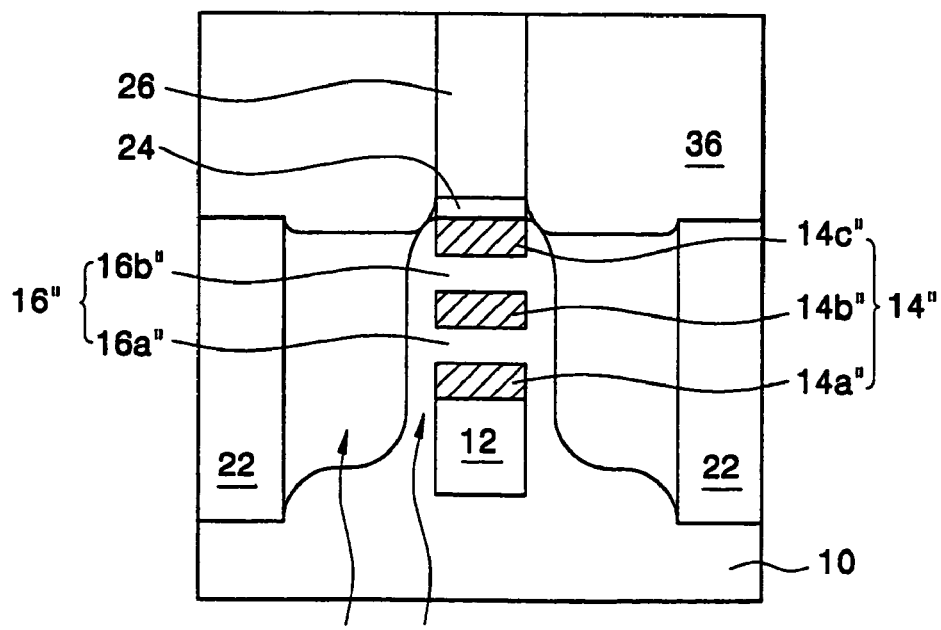
Figure 3K:
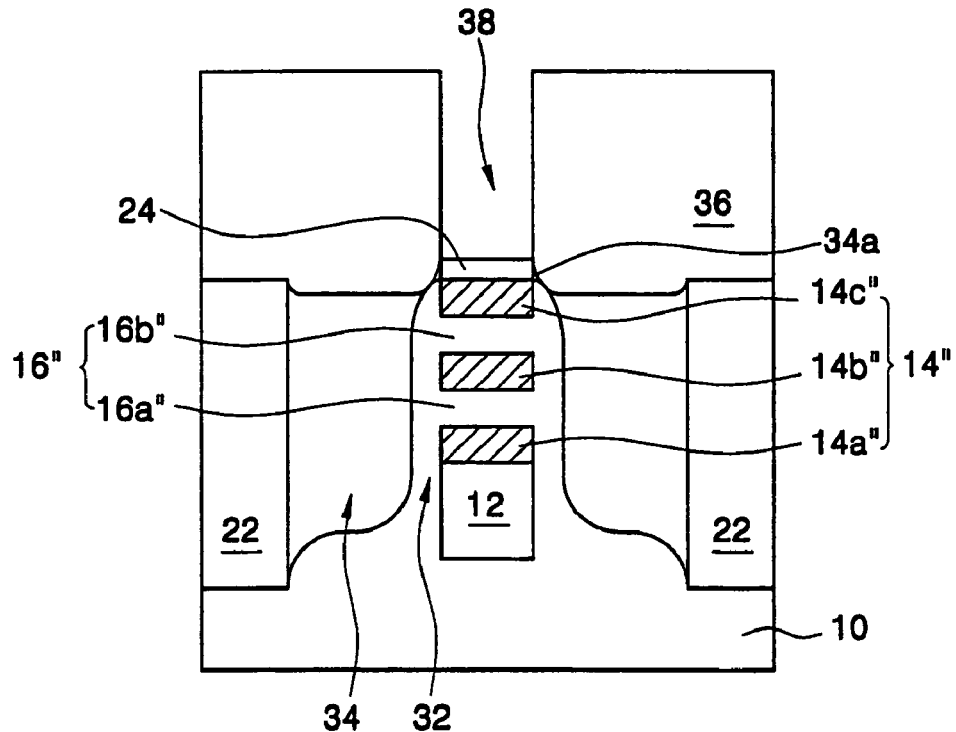
Figure 3L:
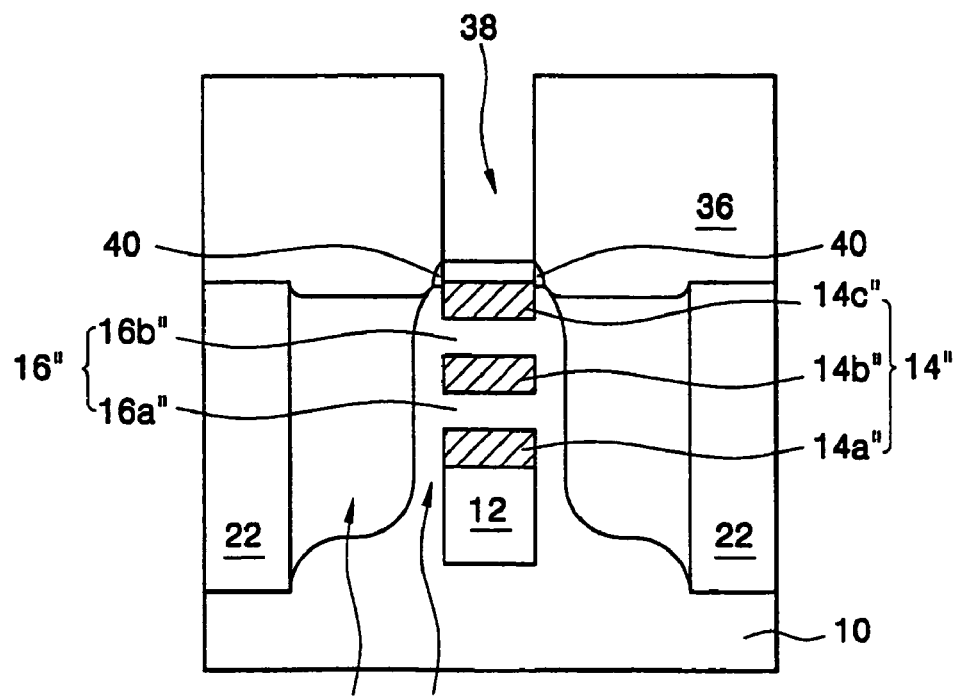
Figure 3M:
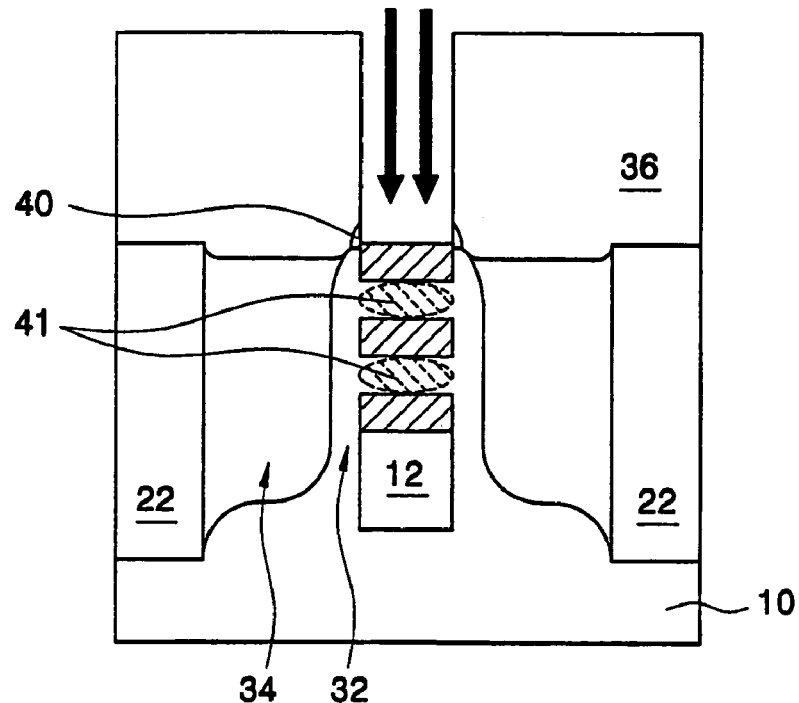
Figure 3N:
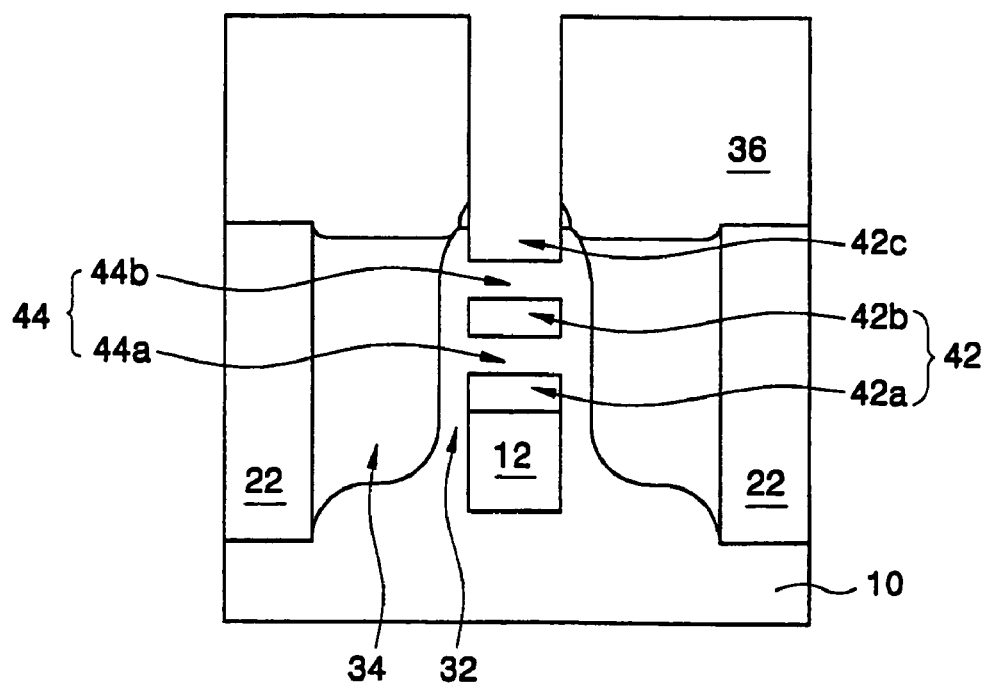
Figure 3O:
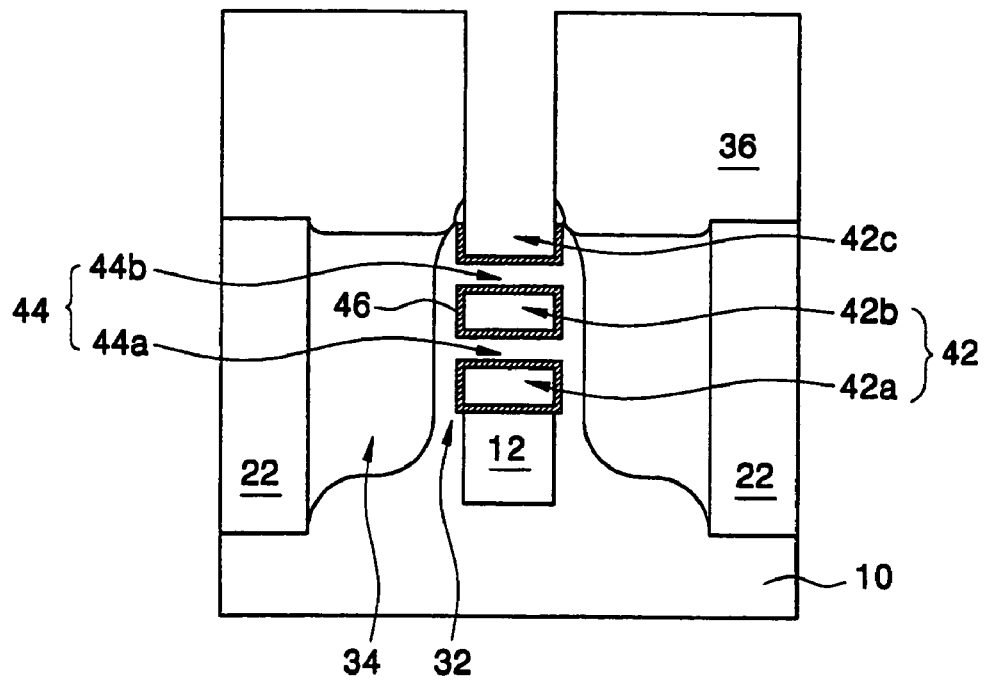
Figure 3P:
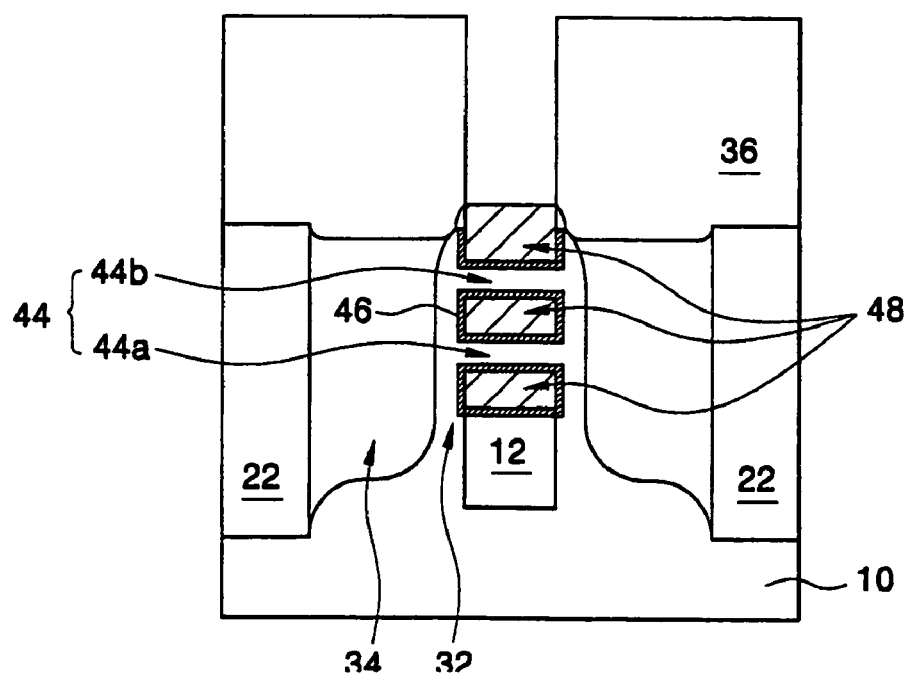
Figure 3Q:
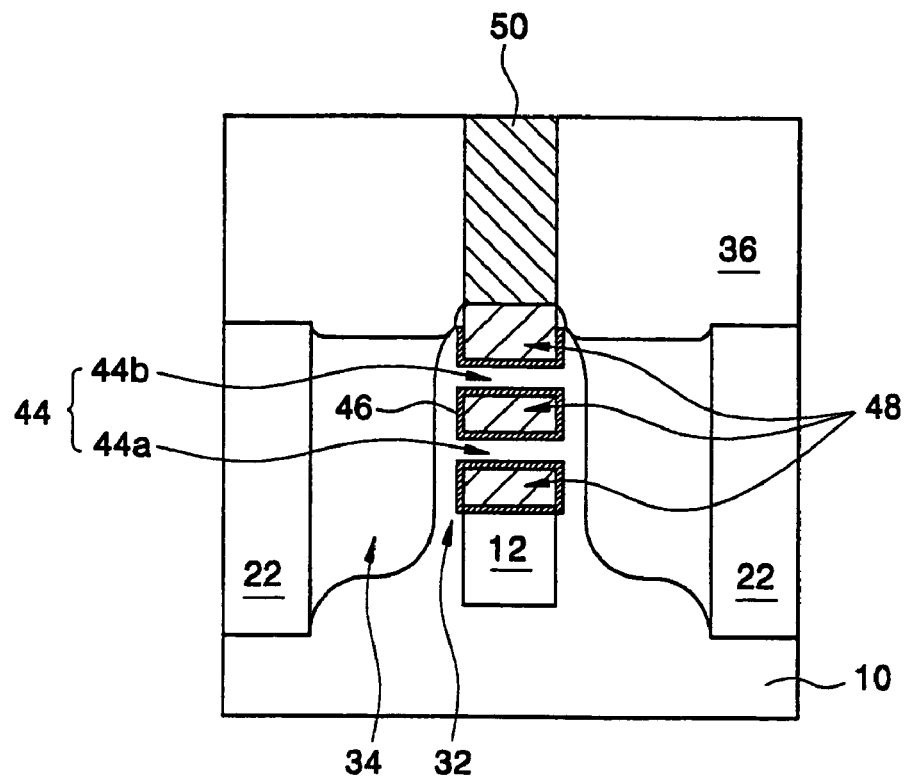
Figure 3R:
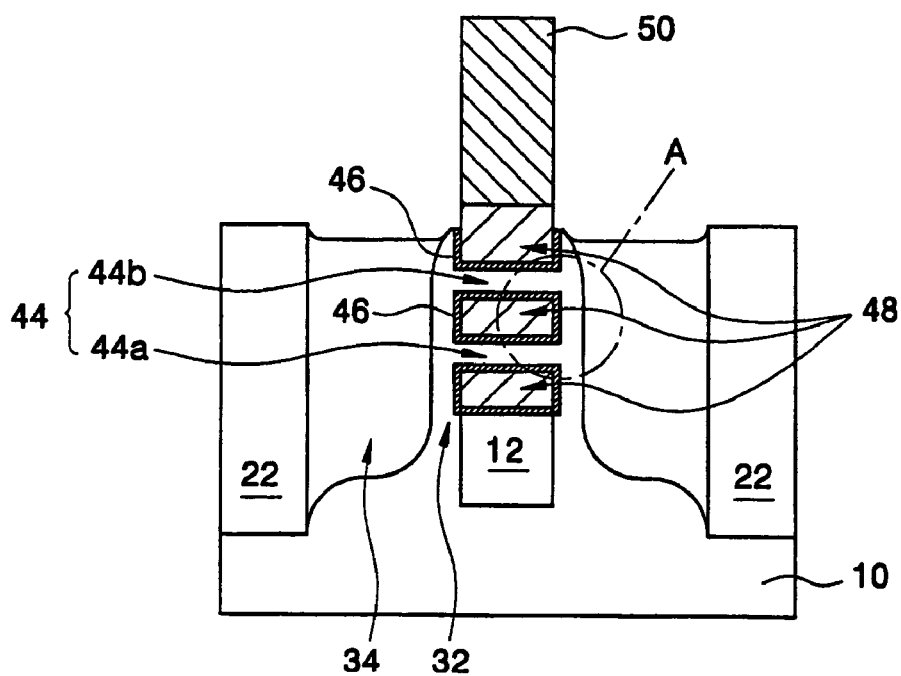

FIGS. 3A to 3R are cross-sectional views illustrating methods of manufacturing a semiconductor device according to the first embodiments of the present invention. FIGS. 4A to 4G are perspective views illustrating some steps of the methods of manufacturing a semiconductor device according to the first embodiments of the present invention.

Referring to FIG. 3A, an impurity of the same conductivity type as that of a substrate 10 is ion-implanted into a main surface of the substrate 10 to form a heavily doped region (well region) 12 which can reduce or prevent the operation of a bottom transistor. The substrate 10 comprises silicon (Si), silicon germanium (SiGe), silicon-on-insulator (SOI), silicon germanium-on-insulator (SGOI) and/or other conventional substrates/layers. In some embodiments, the semiconductor substrate 10 comprises single crystalline Si.

Referring to FIG. 3B, a plurality of interchannel layers 14 and a plurality of channel layers 16 are stacked alternately upon each other on the substrate 10. First, a first interchannel layer 14a is formed on the substrate 10, and then, a first channel layer 16a is formed on the first interchannel layer 14a. An uppermost interchannel layer 16c is formed at an uppermost position.

The channel layers 16 and the interchannel layers 14 are comprised of single crystalline semiconductor materials having an etch selectivity with respect to each other. In some embodiments, the channel layers 16 are formed from a single crystalline Si epitaxial film having a thickness of about 300 Å and the interchannel layers 14 are formed from a single crystalline Ge or a single crystalline SiGe epitaxial film having a thickness of about 300 Å.

The repeating number and thickness of the channel layers 16 and the interchannel layers 14 can be controlled in accordance with a purpose of a transistor to be formed. In some embodiments, the channel layers 16 and the interchannel layers 14 are stacked alternately with each other such that the total thickness becomes about 1000~1500 Å. Here, in order to perform a channel doping, the channel layers 16 may be formed of a doped single crystalline Si epitaxial film.

Referring to FIG. 3C, the plurality of channel layers 16 and the plurality of interchannel layers 14 are patterned through a photolithography process to form a pre-active pattern 18 having a first channel layer pre-pattern (or first channel layer preliminary pattern) 16' and a first interchannel layer pre-pattern (or first interchannel layer preliminary pattern) 14'. The first channel layer pre-pattern 16' comprises a plurality of first channel layer patterns 16a' and 16b'. The first interchannel layer pre-pattern 14' comprises a plurality of interchannel layer patterns 14a', 14b' and 14c'. The etching process is performed for sufficient time to form an isolation trench 20 having a depth deeper than that of the impurity region 12 in the substrate 10.

Next, an oxide layer is deposited by a chemical vapor deposition (CVD) method so as to fill up the isolation trench 20. The deposited oxide layer is planarized by an etch-back process or a chemical mechanical polishing (CMP) process until the surface of the pre-active pattern 18 is exposed, thereby forming field regions 22 surrounding the pre-active pattern 18.

Referring to FIG. 3D, an etch-stopping layer 23, a dummy gate layer 25 and an anti-reflective layer 27 are successively stacked on the substrate 10 including the pre-active pattern 18. The etch-stopping layer 23 is formed to a thickness of about 100~200 Å by a material having an etch selectivity with respect to the dummy gate layer 25, such as silicon nitride. The etch-stopping layer 23 plays a role of reducing or preventing the underlying pre-active pattern from being etched during etching the dummy gate layer 25. The dummy gate layer 25 for defining a gate region is formed to a thickness of about 1000 Å by silicon oxide. The anti-reflective layer 27 for reducing or preventing the reflection of light from the lower substrate during a photolithography process is formed to a thickness of about 300 Å by using silicon nitride.

Referring to FIG. 3E, through a photolithography process, the anti-reflective layer 27, the dummy gate layer 25 and the etch-stopping layer 23 are successively dry-etched away to form a gate hard mask 29 having an anti-reflective layer pattern 28, a dummy gate pattern 26 and an etch-stopping layer pattern 24. The gate hard mask 29 has a width of about 0.2~0.3 μm and plays a role of self-aligning the source/drain regions to the channel region.

Referring to FIG. 3F, using the gate hard mask 29 as an etching mask, the exposed pre-active pattern 18 is etched away until the surface of the substrate 10 is exposed, thereby defining regions 30 where the source/drain regions are to be formed. Thus, only the channel region of the pre-active pattern 18 remains. At this time, the etching process is preformed for sufficient time to etch the upper portion of the semiconductor substrate 10 to below the projected range of the heavily doped region 12.

As a result, there are formed an active channel pattern 18a including a second channel layer pattern 16" and a second interchannel layer pattern 14" under the gate hard mask 29 as shown in the figure. The second channel layer pattern 16" is comprised of a plurality of second channel layer patterns 16a" and 16b" and the second interchannel layer pattern 14" is comprised of a plurality of interchannel layer patterns 14a"', 14b" and 14b'".

In a conventional GAA structure where the active region is not etched and utilized as the source/drain regions, the tunnel may extend horizontally to increase the length of the gate electrode when isotropically etching the interchannel layer. In contrast, in some embodiments of the present invention, the regions of the active pattern where the source/drain regions are to be formed are etched and then, the etched regions are filled up with a conductive material to form the source/drain. Accordingly, since the horizontal length of the interchannel layers 14 constituting the active channel pattern 18a can be limited within the gate length region, it can reduce or prevent tunnels from extending horizontally when the second interchannel layers 14" are isotropically etched to form the tunnels in a subsequent process. So, a highly integrated MOS transistor having a gate length smaller than a channel width can be obtained.

Referring to FIG. 3G, a selective epitaxial single crystalline film is partially grown to a thickness of about 300~400 Å on the surfaces of the etched regions 30 of the semiconductor substrate 10 and on the side of the active channel pattern 18a, thereby forming source/drain extension layers 32. Here, the selective epitaxial single crystalline film is doped by a tilted ion implantation so that each of the second channel layer patterns 16a" and 16b" have a uniform source/ drain impurity concentration. In some cases, with or without performing the ion implantation, a dopant is solid-phase diffused from source/drain regions that are heavily doped in a subsequent annealing process to thereby form the source/drain extension layers 32 having a uniform source/drain doping concentration with respect to each of the channel layers 16.

Referring to FIG. 3H, a conductive material is deposited on the source/drain extension layers 32, and in some embodiments so as to completely fill up the etched regions 30, thereby forming a conductive film. Then, the conductive film is etched back to the surface of the active channel pattern 18a to form the source/drain regions 34 comprising the heavily doped conductive film only within the etched regions 30. In some embodiments, the conductive material comprises doped polysilicon, metal and/or metal silicide. As described above, in some embodiments, the source/drain regions 34 have a uniform doping profile vertically along the active channel pattern 18a because the source/drain regions 34 are formed by deposition. Here, tails 34a of the conductive film for the source/drain may remain under the side of the gate hard mask 29.

Optionally, in order to reduce the surface roughness of the source/drain extension layers 32 comprising the epitaxial single crystalline film and to recrystallize the source/drain extension layers 32, a heat treatment may be performed at a high temperature in a hydrogen ($H_2$) ambient before depositing the conductive film.

Referring to FIG. 3I, silicon nitride is deposited so as to cover the gate hard mask 29 on the source/drain regions 34 and the field regions 22, thereby forming a mask layer 35. Preferably, the mask layer 35 comprises the same material as that of the uppermost layer constituting the gate hard mask 29, i.e., the anti-reflective layer pattern 28. Here, before depositing the mask layer 35, an oxide layer may be formed by oxidizing the surface portions of the source/drain regions 34 and the exposed surface portion of the active channel pattern 18a of the channel region through a thermal oxidation process. This oxide layer serves as a stress-buffering layer.

Figure 4A:
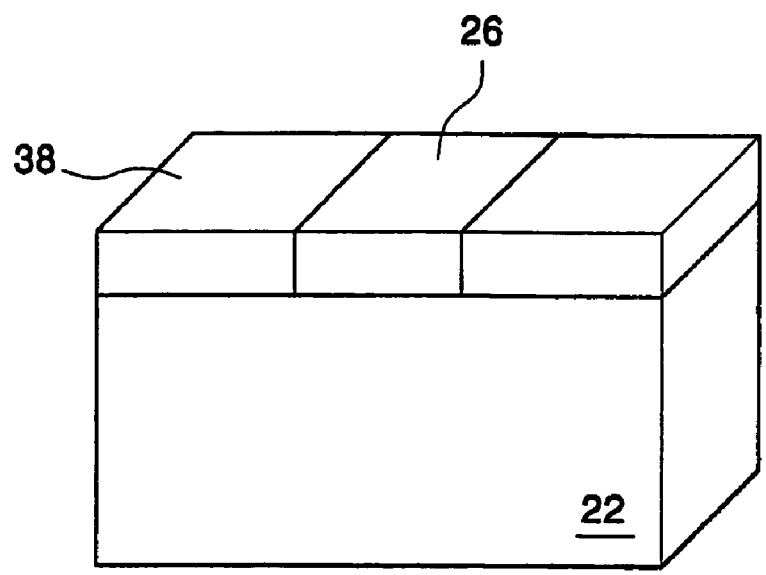
FIGS. 4A to 4G are perspective views illustrating some steps of methods of manufacturing a device according to the first embodiments of the present invention.

Referring to FIG. 3J, until the surface of the dummy gate pattern 26 is exposed, the mask layer 35 is removed by etch-back or chemical mechanical polishing to form mask patterns 36 exposing the dummy gate pattern 26. FIG. 4A is a perspective side view particularly illustrating the step as shown in FIG. 3J.

Figure 4B:
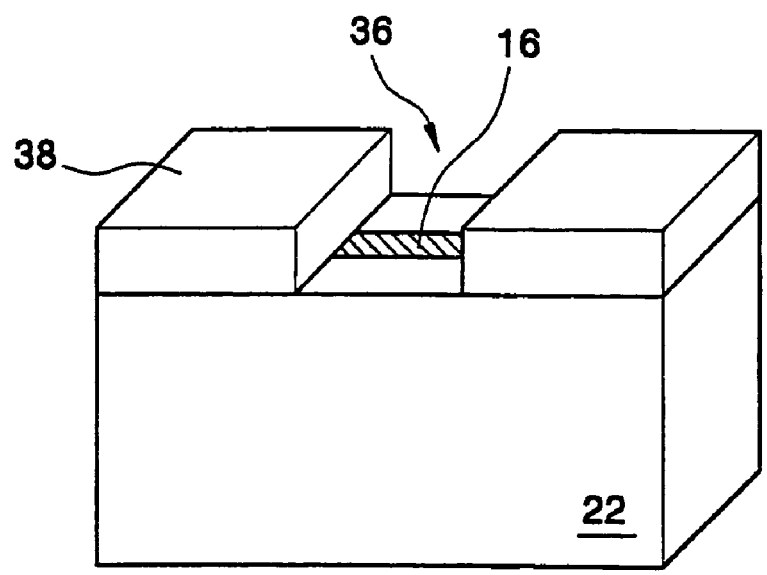

Referring to FIG. 3K, using the mask patterns 26, the dummy gate pattern 26 is selectively removed to form a gate trench 38. The etch-stopping layer pattern 24 reduces or prevents the underlying pre-active pattern 18 from being etched during the etching process of removing the dummy gate pattern 26. FIG. 4B is a perspective side view particularly illustrating the step as shown in FIG. 3K.

Referring to FIG. 3L, if the conductive tails 34a remain under the sides of the gate hard mask 29, an oxidation process and/or a wet etching process is executed to remove the conductive tails 34a. In some embodiments, the oxidation process is carried out to convert the conductive tails 34a into the insulating layers 40, thereby preventing the conductive tails 34a from being short-circuited with a gate electrode to be formed in a subsequent process.

Referring to FIG. 3M, the etch-stopping layer pattern 24 exposed through the gate trench 38 is removed.

When the active channel pattern 18a of the channel region is not doped with impurities, a channel ion implantation is locally performed through the gate trench 38 to thereby dope the active channel pattern 18a of the channel region with impurities. In some embodiments, the channel ion implantation is carried out such that the projected range is formed within each of the second channel layer patterns 16a" and 16b". Here, the reference numeral 41 indicates the channel ion-implanted regions. Further, in some embodiments, the channel ion implantation is executed such that each of the second channel layer patterns 16a" and 16b" may have different doping concentrations from each other, thereby obtaining a transistor that may be operated according to the applied gate voltage.

Figure 4C:
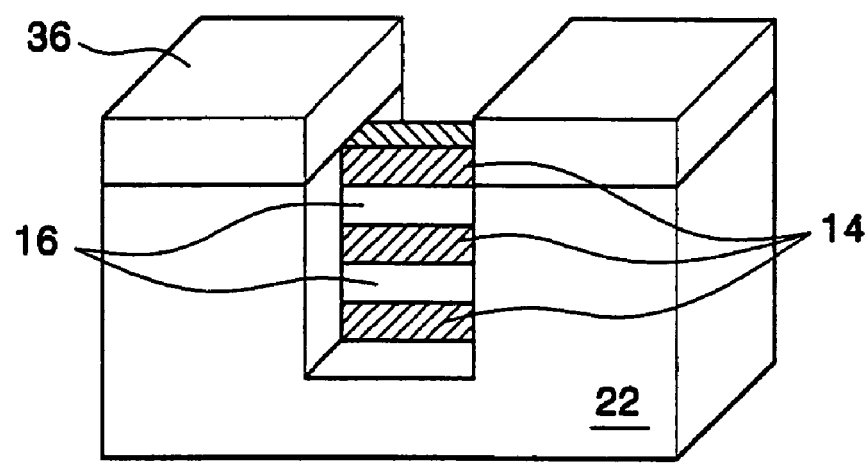

Next, using the source/drain regions 34 as an etching mask, the field regions 22 are selectively etched away to expose the sides of the active channel pattern 18a of the channel region, as shown in FIG. 4C. FIG. 4C is a perspective side view particularly showing a portion that is not shown in the cross-sectional view of FIG. 3M.

Referring to FIG. 3N, through an isotropic etching process, the plurality of interchannel layer patterns 14a", 14b" and 14c" are selectively removed to form a plurality of tunnels 42a and 42b passing through the active channel pattern 18a and a tunnel groove 42c in a tunnel shape, the tunnel groove 42c being located at an uppermost position. Here, the second channel layer patterns 16a" and 16b" form a plurality of channels 44a and 44b. Preferably, the plurality of tunnels 42a and 42b and the plurality of channels 44a and 44b are formed to have the same width as that of the dummy gate pattern 26 within a range of about 50%.

Figure 4D:
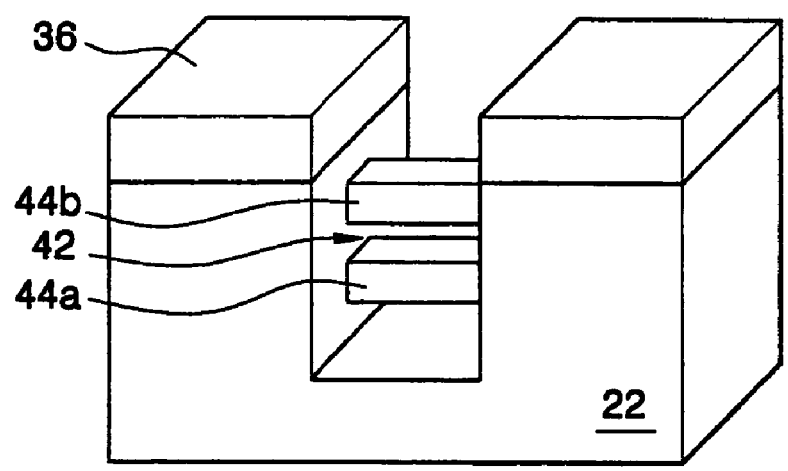

FIG. 4D is a perspective side view particularly illustrating the step as shown in FIG. 3N. As shown, the side surface portions of the source/drain extension layers 32 are partially exposed through the tunnels 42a and 42b.

Figure 4E:
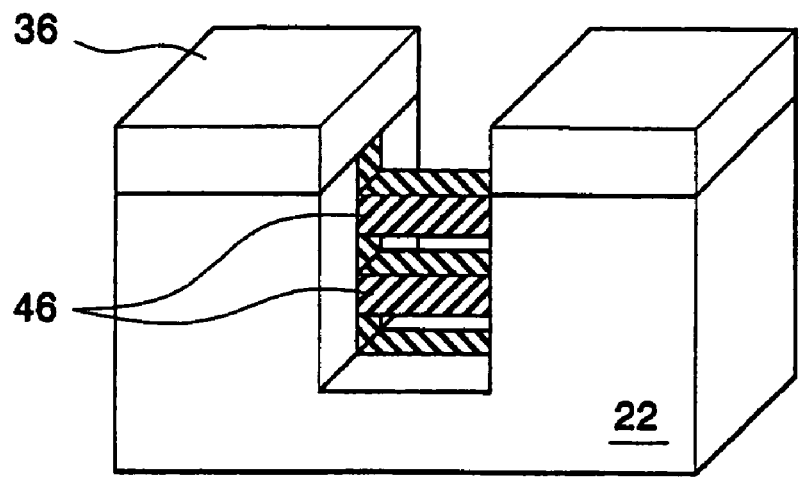

Referring to FIG. 3O, a thermal oxidation process is carried out to form a gate-insulating layer 46 to a thickness of about 10~70 Å on the surfaces of the plurality of channels 44a and 44b and the inner surface of the tunnel groove 42c. FIG. 4E is a perspective side view particularly illustrating the step as shown in FIG. 3O. As shown in the figure, the gate-insulating layer 46 is also continuously formed on a portion of the surfaces of the source/drain extension layers 32 exposed by the channels.

Here, in order to reduce the surface roughness of the channels 44a and 44b, a heat treatment may be performed at a high temperature in a hydrogen ($H_2$) or argon (Ar) ambient before forming the gate-insulating layer 46, thereby decreasing the roughness between the gate-insulating layer 46 and the channels. Alternatively, the gate-insulating layer 46 may be comprised of silicon oxynitride.

Figure 4F:
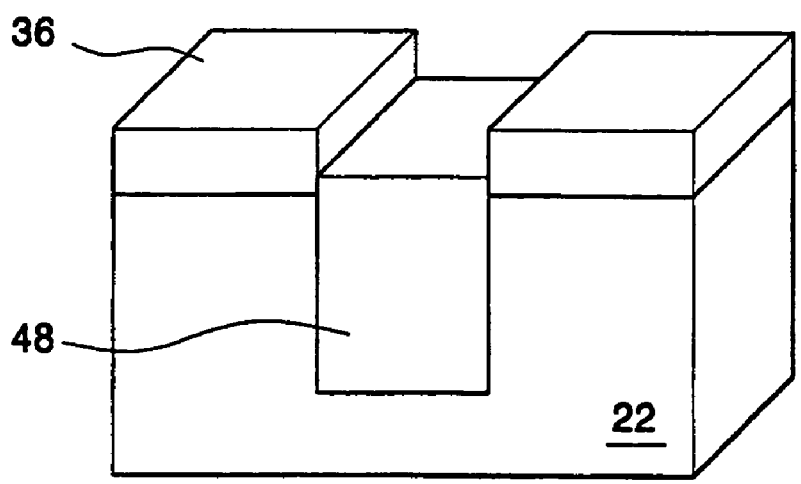

Referring to FIG. 3P, a gate electrode 48 is formed so as to fill up the plurality of tunnels 42a and 42b and the tunnel groove 42c and to surround the plurality of channels 44a and 44b. In some embodiments, the gate electrode 48 comprises doped polysilicon. FIG. 4F is a perspective side view particularly showing the step as shown in FIG. 3P.

Figure 4G:
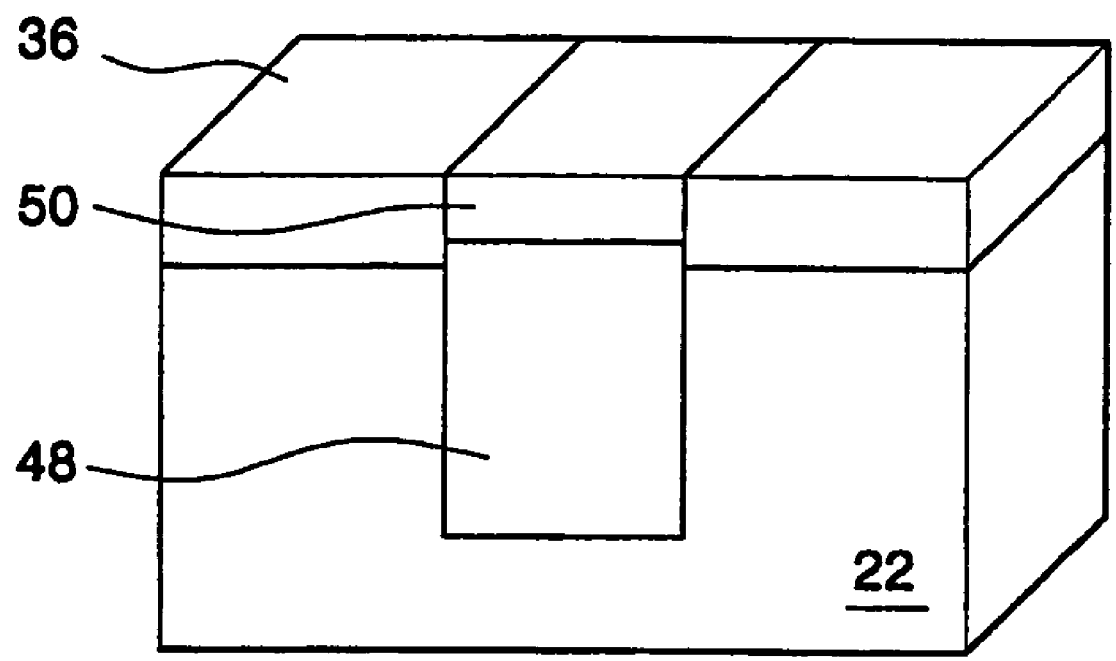

Referring to FIG. 3Q, a gate stack layer 50 including a metal silicide for reducing a gate resistance is formed on the polysilicon gate electrode 48. Here, the gate stack layer 50 may be comprised of an insulating material for capping the gate, e.g., silicon oxide or silicon nitride. FIG. 4G is a perspective side view illustrating the step as shown in FIG. 3Q.

Referring to FIG. 3R, the mask patterns 36 are removed and then, subsequent processes such as metal interconnection are carried out to complete a vertical MOS transistor having multiple channels. In some cases, the mask patterns 36 may remain to serve as an insulating interlayer.

Embodiment 2

Figure 5:
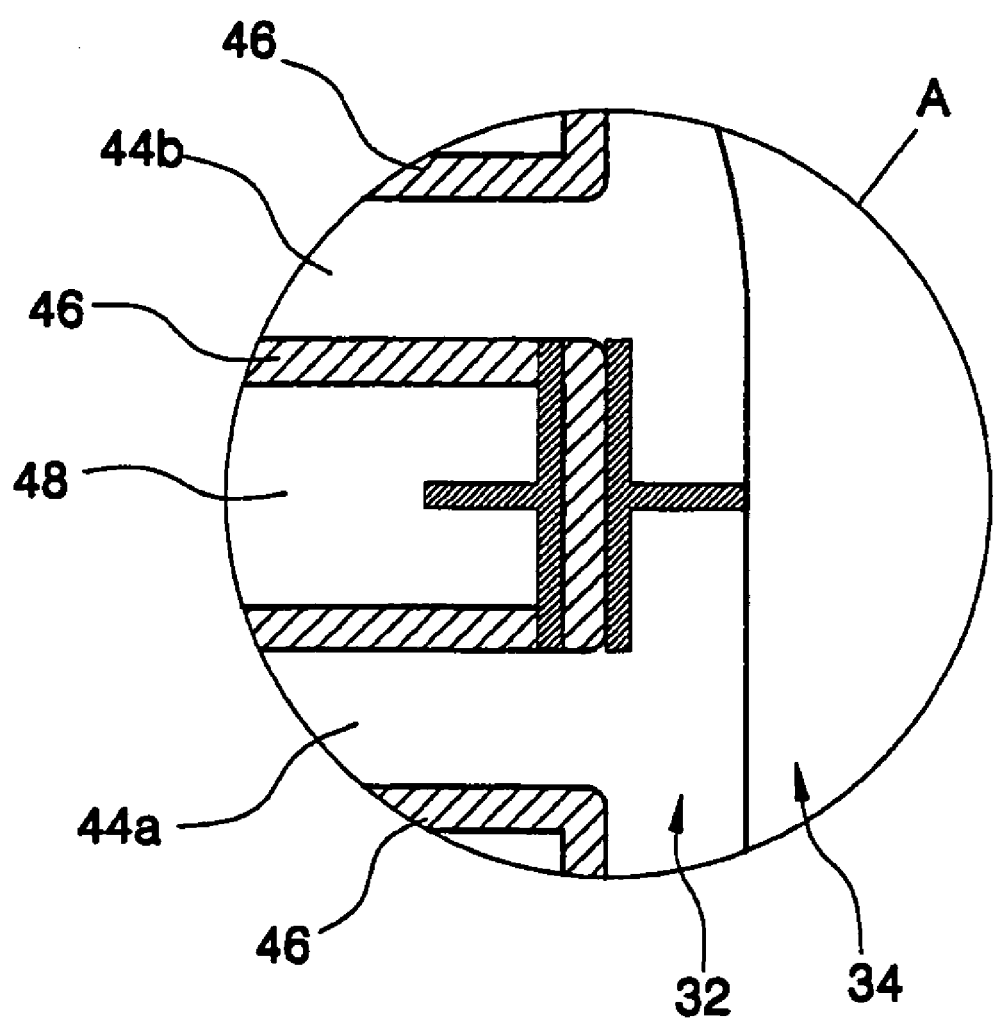
FIG. 5 is an enlarged view of a portion "A" in FIG. 3R.

FIG. 5 is an enlarged view showing a portion "A" in FIG. 3R. Referring to FIG. 5, in the vertical MOS transistor in Embodiment 1, the gate-insulating layer 46 exists between the gate electrode 48 and the source/drain regions 34 (specifically, source/drain extension layers 32) to thereby cause an overlap capacitance between the gate electrode 48 and the source/drain regions 34 as shown by a capacitor symbol (⊢⊣). A vertical MOS transistor of the present embodiments is presented to reduce or suppress the generation of the above overlap capacitance.

Figure 6A:
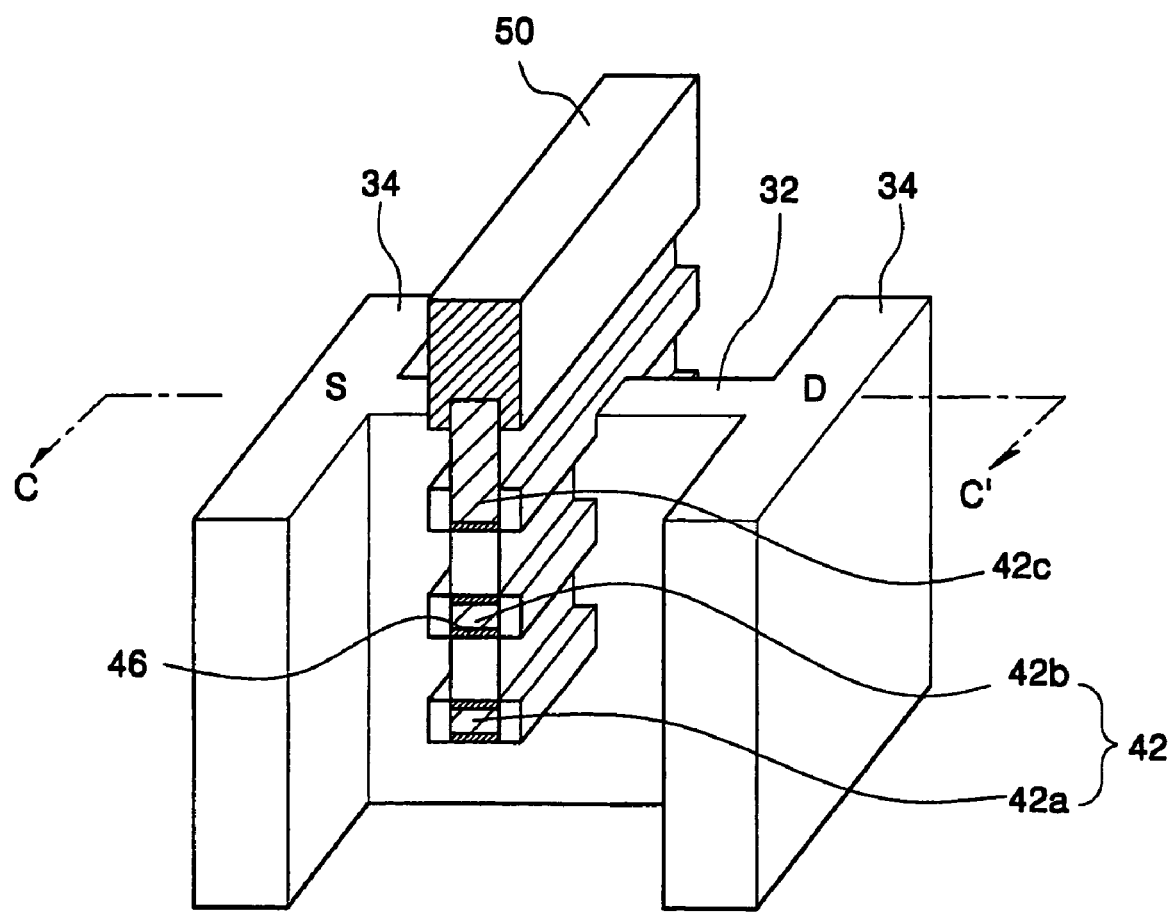
FIGS. 6A and 6B are a perspective view and a cross-sectional view, respectively, of a device in accordance with second embodiments of the present invention
Figure 6B:
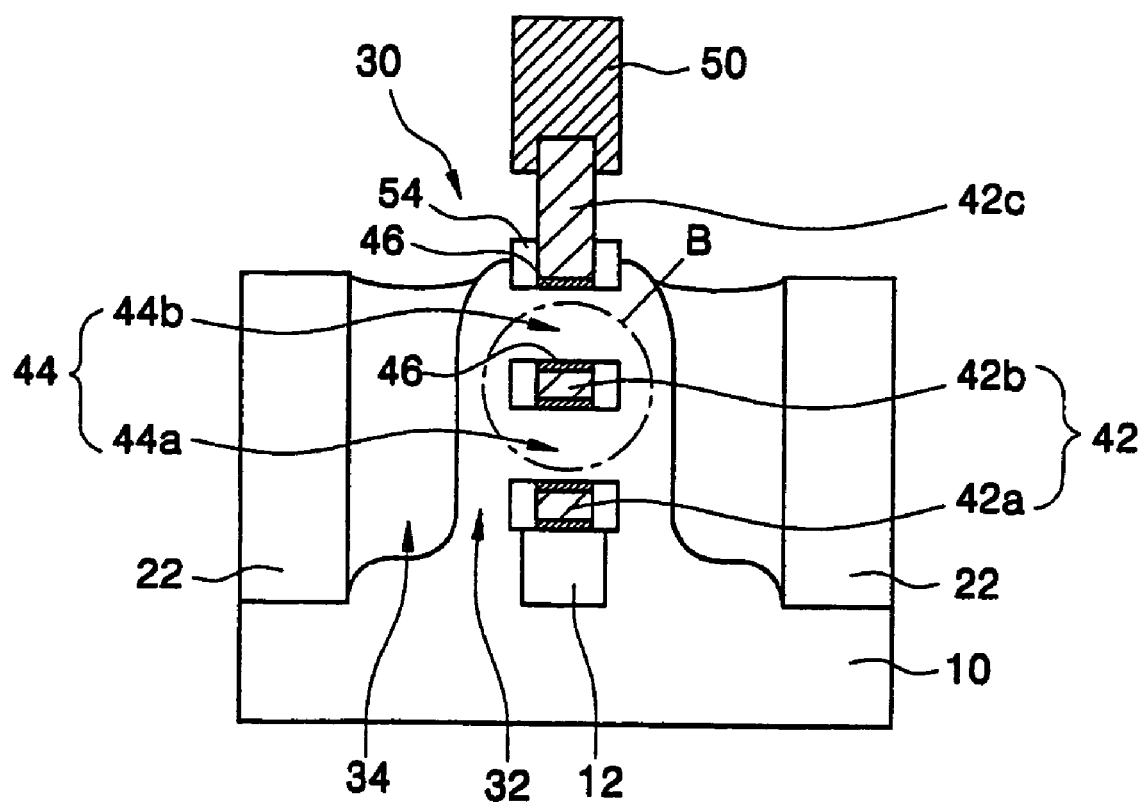

FIG. 6A is a perspective view of a semiconductor device in accordance with the present embodiment and FIG. 6B is a cross-sectional view taken along line C–C' of FIG. 6A. In the present embodiment, gate spacers 54 comprising an insulating material are formed between the gate electrode 48 and the source/drain regions 34 so as to reduce or prevent an increase in the overlap capacitance (see FIG. 5) between the gate electrode 48 and the source/drain regions 34. In the present embodiment, the same elements as those in Embodiment 1 are indicated by the same numerals.

Referring to FIGS. 6A and 6B, an active pattern 30 including a plurality of channels 44a and 44b formed vertically in the upward direction are formed on a main surface of a substrate 10 comprised of silicon (Si), silicon germanium (SiGe), silicon-on-insulator (SOI), silicon germanium-on-insulator (SGOI) and/or other conventional substrates/layers. Source/drain regions 34 are connected with the plurality of channels 44a and 44b on both sides of the active pattern 30. Between the source/drain regions 34 and the plurality of channels 44a and 44b, there are formed source/drain extension layers 32 connected to the source/drain regions 34 and connected to the channels 44 and 44b.

Between each of the channels 44a and 44b, there are formed a plurality of tunnels 42 having a length shorter than the channel length. The lowest tunnel 42a is formed between the lowest channel layer 44a and the underlying surface portion of the substrate, i.e., an impurity-doped region 12. A tunnel groove 42c having a tunnel shape is formed on the uppermost channel 44b.

Figure 6C:
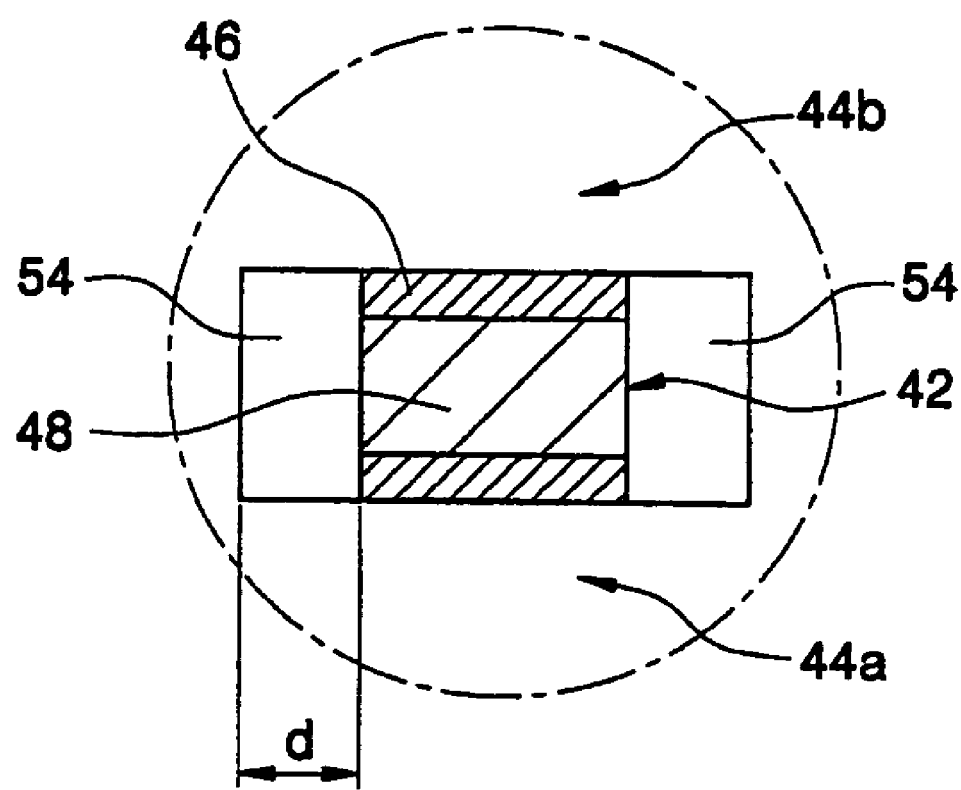
FIG. 6C is an enlarged view of a portion "B" of FIG. 6B.

FIG. 6C is an enlarged view showing a portion "B" in FIG. 6B. Upon both sidewalls of the tunnel 42 and both sidewalls of the tunnel groove 42, two gate spacers 54 of an insulating layer are formed so that each of the gate spacers has a thickness (d) corresponding half the difference between the length of the channels 44a and 44b and the length of the tunnel 42 as shown in FIG. 6C. Over the active pattern 30, there is formed a gate electrode 48 extending through and/or filling up the plurality of tunnels 42a and 42b and the tunnel groove 42c and surrounding the plurality of channels 44a and 44b. A gate-insulating layer 46 is formed between the gate electrode 48 and the plurality of channels 44a and 44b, i.e., on the upper surface and the lower surface of the tunnel 42 and the lower surface of the tunnel groove 42c except for the sidewalls of the tunnel and the sidewalls of the tunnel groove.

In some embodiments, the gate electrode 48 comprises a polysilicon and a gate stack layer 50 composed of a metal silicide and is formed on the top surface of the gate electrode 48. The gate stack layer 50 is formed to surround the upper portion of the sidewalls of the gate electrode 48, thereby making the notched gate electrode. Field regions 22 are formed so as to surround the source/drain regions 34 except the channel region including the plurality of channels 44a and 44b.

Heavily doped region 12 is formed in the main surface portion of the substrate 10 below the active pattern 30 so as to reduce or prevent the operation of a bottom transistor.

Figure 7A:
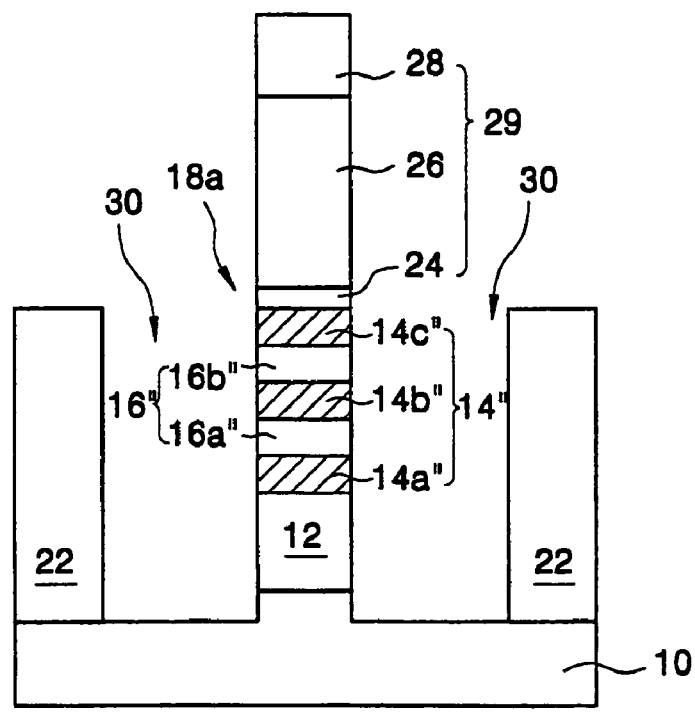
FIGS. 7A to 7M are cross-sectional views illustrating methods of manufacturing a device according to the second embodiments of the present invention.

FIGS. 7A to 7M are cross-sectional views illustrating methods of manufacturing a semiconductor device according to the second embodiments of the present invention. Referring to FIG. 7A, in the same manner as shown in FIGS. 3A to 3F of Embodiment 1, a pre-active pattern 18, in which a plurality of interchannel layers 14 and a plurality of channel layers 16 are stacked alternately with each other, and field regions 22 surrounding the pre-active pattern 18 are formed on a substrate 10. In some embodiments, the interchannel layers 14 comprise single crystalline Ge or single crystalline SiGe film, while the plurality of channel layers 16 comprise single crystalline Si film.

Next, a gate hard mask for self-aligning source/drain regions to the channel region is formed on the pre-active pattern 18. The gate hard mask has an etch-stopping layer pattern 24, a dummy gate pattern 26 and an anti-reflective layer pattern 28 which are successively stacked.

Using the gate hard mask, the pre-active pattern 18 is etched away until the surface of the substrate 10 is exposed, thereby defining regions 30 where the source/drain regions are to be formed. By doing so, only the channel region of the pre-active pattern 18 remains. The etching process is further preformed for sufficient time to etch the upper portion of the semiconductor substrate 10 to below the projected range of the heavily doped region 12.

As a result, an active channel pattern 18a having a second channel layer pattern 16'' and a second interchannel layer pattern 14'' is formed under the gate hard mask 29 as shown in the figure. The second channel layer pattern 16'' is comprised of a plurality of second channel layer patterns 16a'' and 16b'' and the second interchannel layer pattern 14'' is comprised of a plurality of interchannel layer patterns 14a'', 14b'' and 14c''.

Figure 7B:
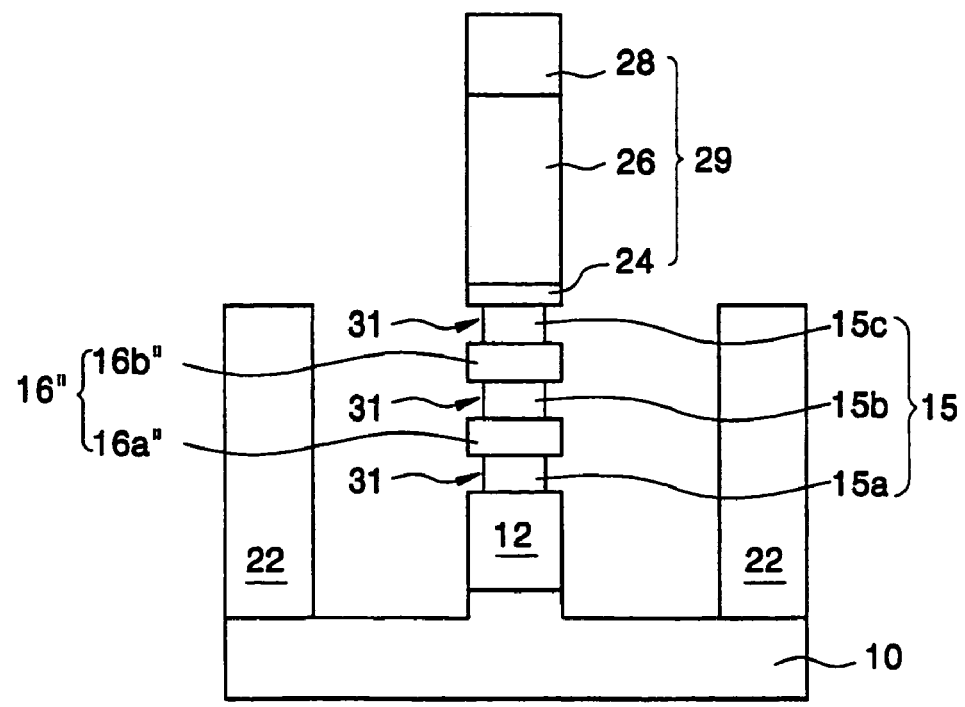

Referring to FIG. 7B, the second interchannel layer patterns 14'' are selectively lateral-etched through the exposed sides of the active channel pattern 18a, thereby forming undercut regions 31. A width of the undercut region 31 is formed to a depth of about 500~700 Å from the sidewall surface of the original active channel pattern 18a. Accordingly, a plurality of third interchannel layer patterns 15a, 15b and 15c shorter than the length of the second channel layer patterns 16a'' and 16b'' are formed from the plurality of second interchannel layer patterns 14a'', 14b'' and 14c''.

Figure 7C:
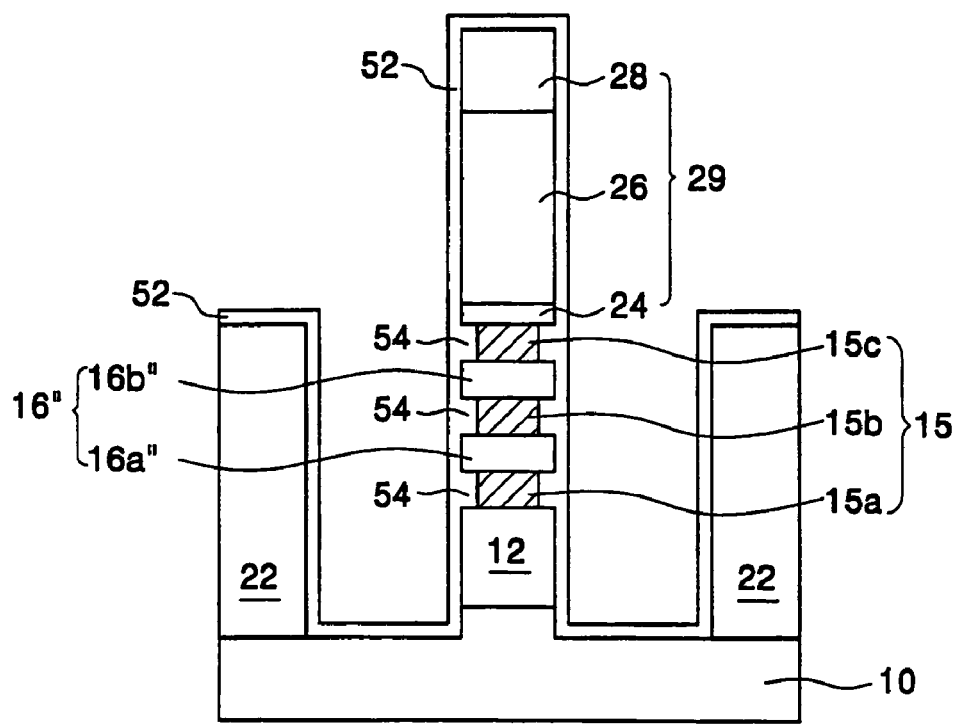

Referring to FIG. 7C, an insulating layer 52 is deposited so as to be formed in or fill up the undercut regions 31 on the entire surface of the resultant structure. Particularly, an insulating material such as silicon oxide is deposited so as to fill up the undercut regions 31 of the active channel pattern 18a through a chemical vapor deposition method, thereby forming the insulating layer 52 covering the entire surface of the resultant structure, i.e., the entire inner surface of the etched regions 30 including the sidewalls and the surface of the active channel pattern 18a.

Figure 7D:
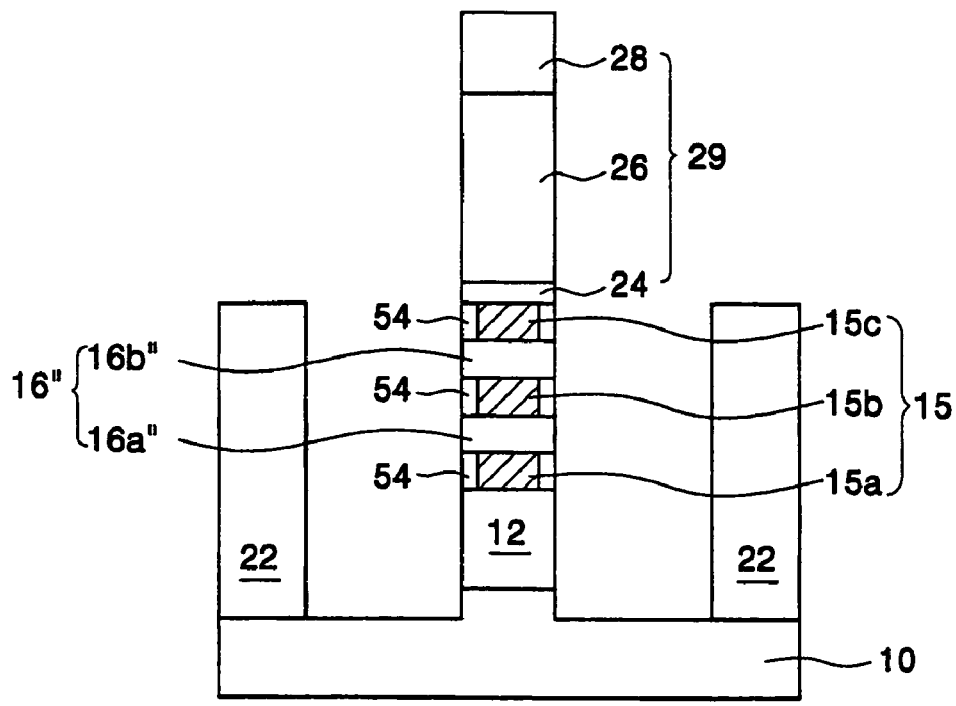

Referring to FIG. 7D, the insulating layer 52 is etched back to form gate spacers 54 comprised of an insulating material such silicon oxide filling up only the undercut regions 31.

Figure 7E:
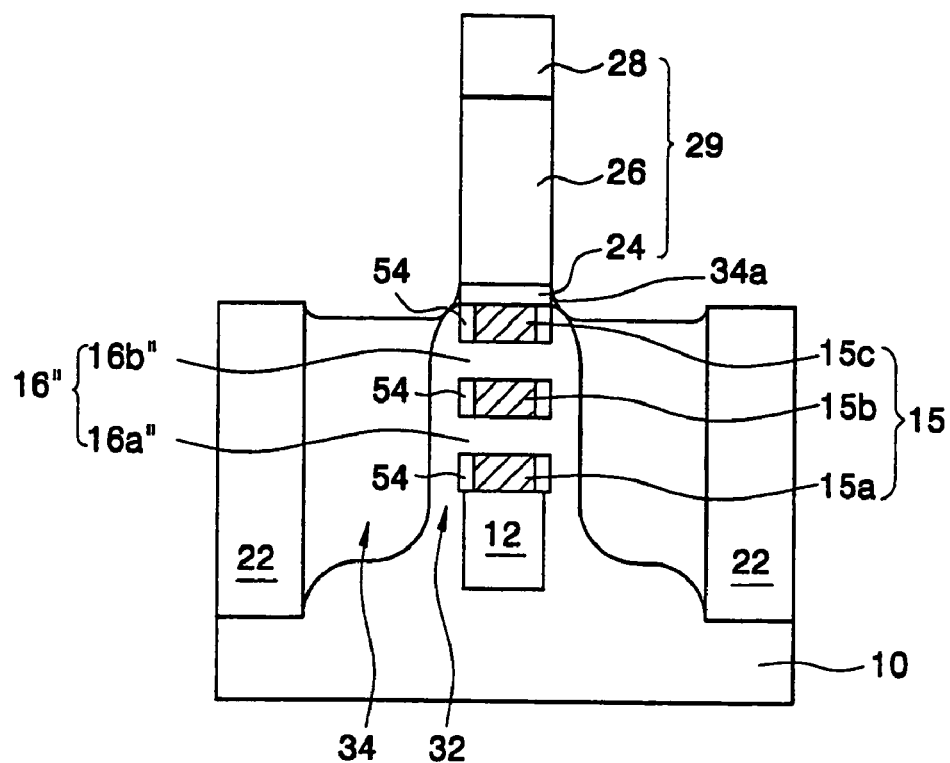

Referring to FIG. 7E, in the same manner as shown in FIG. 3G of Embodiment 1, a selective epitaxial single crystalline film is partially grown on the surfaces of the etched regions 30 and the sides of the active channel pattern 18a, thereby forming source/drain extension layers 32.

Then, in the same manner as shown in FIG. 3H of Embodiment 1, a conductive film such as doped polysilicon, metal or metal silicide is deposited on the entire surface of the resultant structure including the source/drain extension layers 32 and then, the conductive film is etched back to form source/drain regions 34 filling up the etched regions 30.

Here, before depositing the conductive film, a tilted ion implantation may be executed to dope the source/drain extension layers 32 of the selective epitaxial single crystalline film with impurities. Alternatively or in addition, the source/drain extension layers 32 can be doped by solid-phase diffusing a dopant from the source/drain regions in a subsequent annealing process. In either case, the source/drain extension layers 32 and the source/drain regions 34 can have a uniform doping profile in a direction perpendicular to the channel region.

Figure 7F:
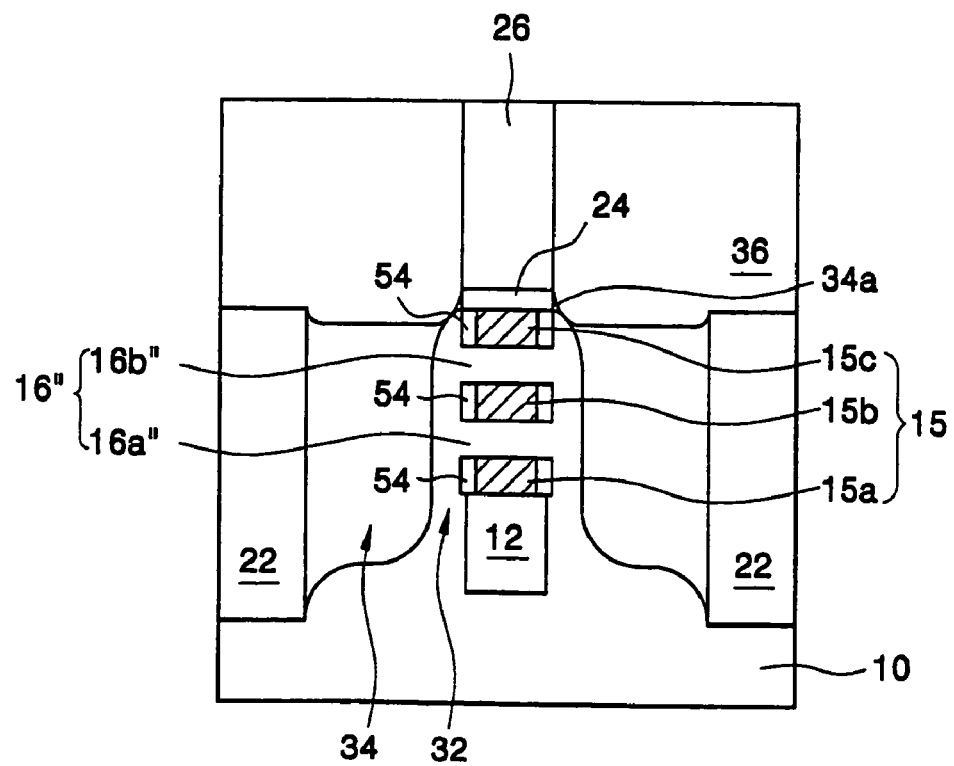

Referring to FIG. 7F, in the same manner as shown in FIG. 3I of Embodiment 1, silicon nitride is deposited on the source/drain regions 34, the active channel pattern 18a of the channel region and the substrate 10, thereby forming a mask layer. Then, in the same manner as in FIG. 3J of Embodiment 1, the mask layer is planarized until the surface of the dummy gate pattern 26 is exposed, thereby forming a mask pattern 36 exposing the dummy gate pattern 26.

Figure 7G:
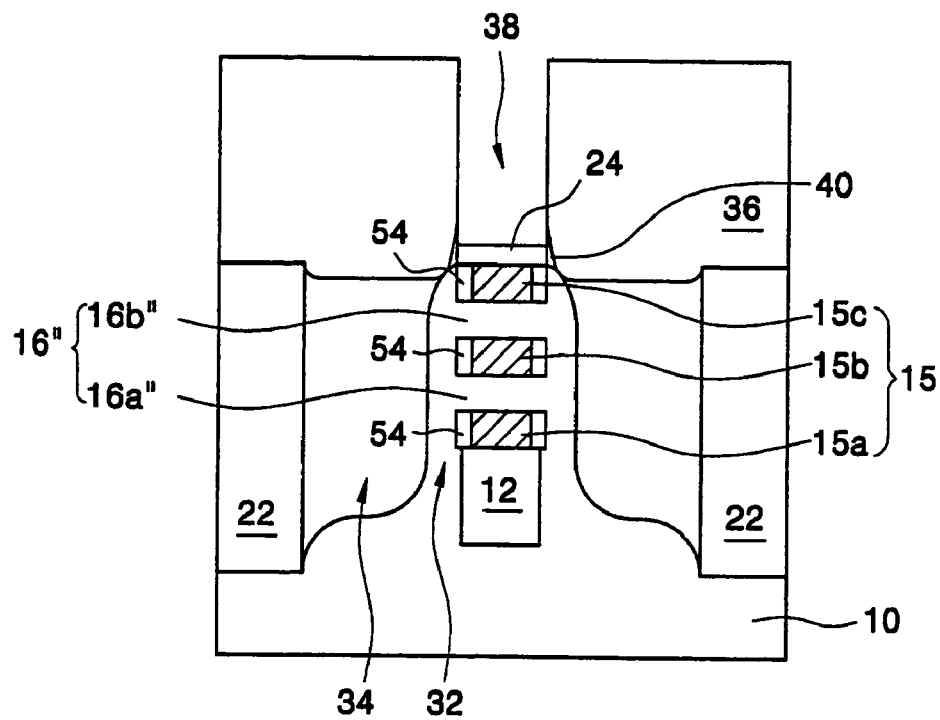

Referring to FIG. 7G, in the same manner as shown in FIG. 3K of Embodiment 1, the dummy gate pattern 26 is selectively removed by using the mask pattern 36, thereby forming a gate trench 38. Here, the etch-stopping layer pattern 24 prevents the underlying active channel pattern 18a from being etched during the etching process of removing the dummy gate pattern 26. If conductive tails 34a for source/drain remain under the sides of the gate pattern 26, an oxidation process may be carried out to convert the conductive tails 34a into insulating layers 40 of silicon oxide in the same manner as in FIG. 3L of Embodiment 1.

Figure 7H:
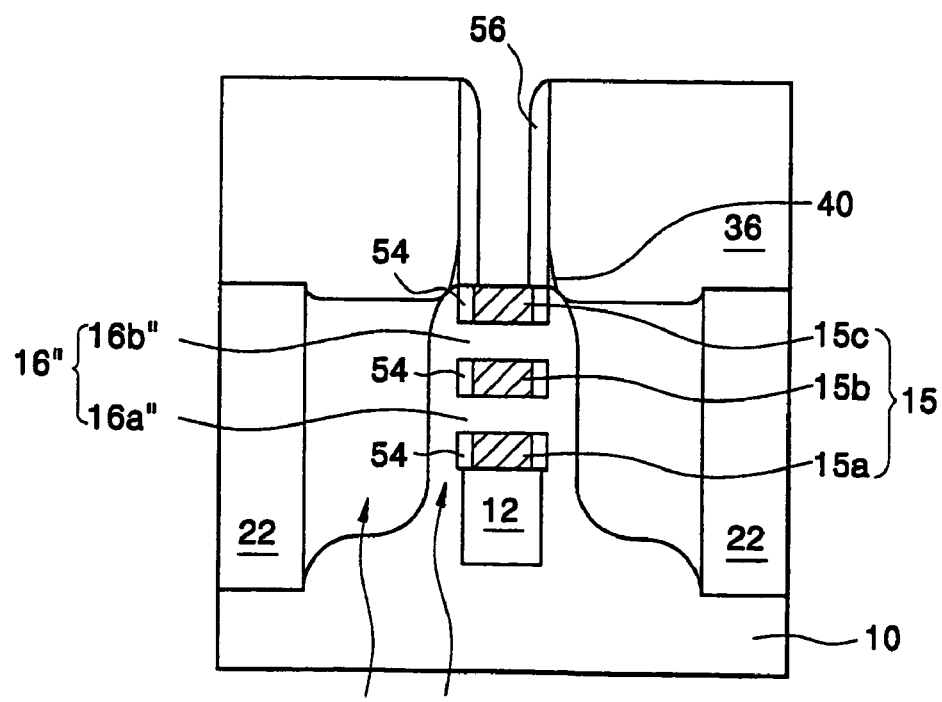

Referring to FIG. 7H, the etch-stopping layer pattern 24 exposed through the gate trench 38 is removed in the same manner as shown in FIG. 3M of Embodiment 1. If the active channel pattern 18a of the channel region is not doped, an impurity is locally ion-implanted through the gate trench 38 to thereby dope the active channel pattern 18a of the channel region with impurities. In some embodiments, the channel ion implantation is carried out such that the projected range is formed within each of the channel layers 16". Alternatively, in other embodiments, the channel ion implantation is executed such that each of the second channel layer patterns 16a" and 16b" has a different doping concentration from each other, thereby successively operating the transistors according to the applied gate voltage.

Silicon oxide is deposited on the entire surface of the resultant structure by a chemical vapor deposition method, thereby forming an insulating layer with the same thickness equal to or somewhat larger than the width of the width of the undercut region 31, e.g., about 500~700 Å thick. Then, the insulating layer is etched back to form insulating layer spacers 56 on the inner sidewalls of the gate trench 38. The insulating layer spacers 56 control the channel width and the gate width.

Figure 7I:
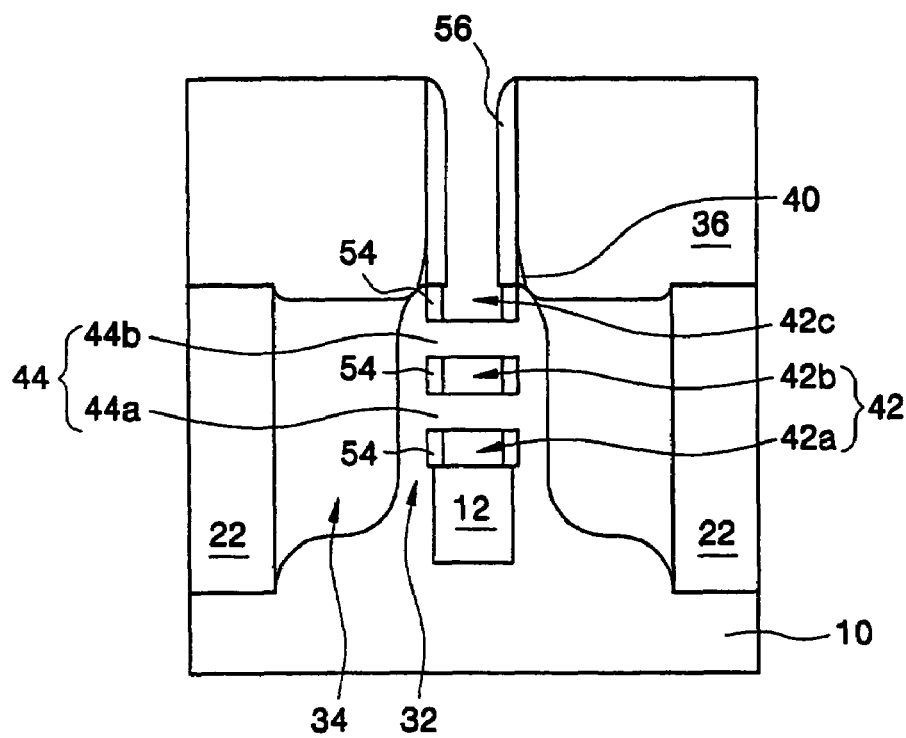

Referring to FIG. 7I, in the same manner as shown in FIG. 3N of Embodiment 1, the field regions 22 are selectively etched using the source/drain regions 34 as an etching mask, thereby exposing the sides of the active channel pattern 18a of the channel region. Then, the plurality of third interchannel layer patterns 15a, 15b and 15c are selectively removed through an isotropic etching process, thereby forming a plurality of tunnels 42a and 42b passing through the active channel pattern 18a and a tunnel groove 42c located at an uppermost position. Here, the second channel layer patterns 16a" and 16b" form a plurality of channels 44a and 44b. The tunnels 42a and 42b are formed to have a length shorter than the horizontal length of the channels 44a and 44b due to the gate spacers 54 formed on the sidewalls thereof.

Figure 7J:
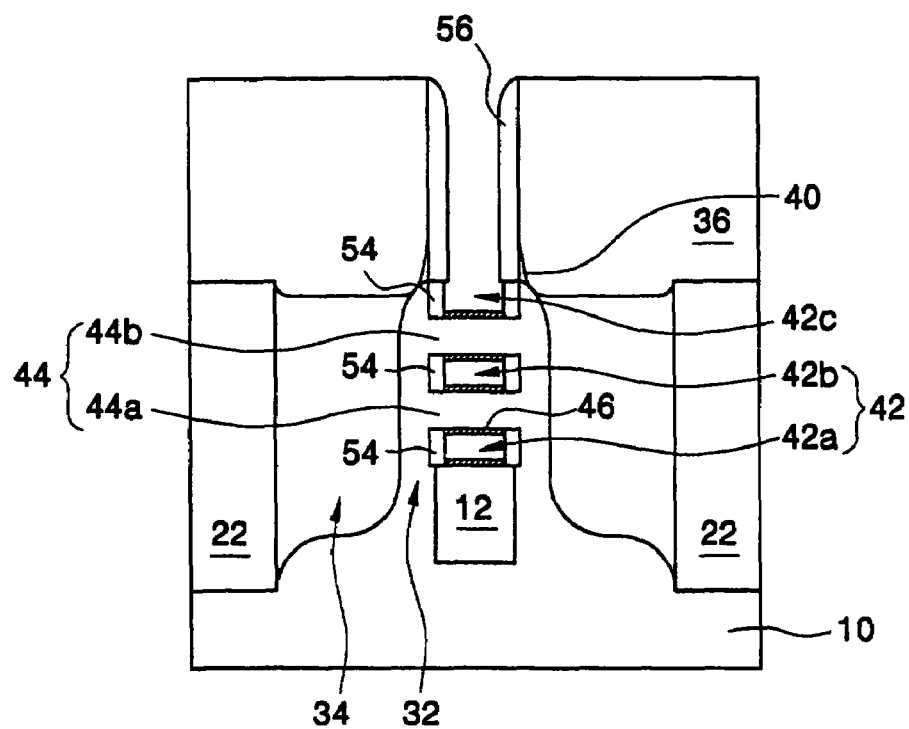

Referring to FIG. 7J, in the same manner as shown in FIG. 3O of Embodiment 1, a thermal oxidation process is carried out to form a gate-insulating layer 46 on the surface portions of the plurality of channels 44a and 44b (particularly, the upper surface and the lower surface of the plurality of tunnels 42a and 42b and the bottom surface of the tunnel groove 42c). Here, in order to reduce the surface roughness of the channels 44a and 44b, a heat treatment may be performed at a high temperature in a hydrogen ($H_2$) or argon (Ar) ambient before forming the gate-insulating layer 46.

Figure 7K:
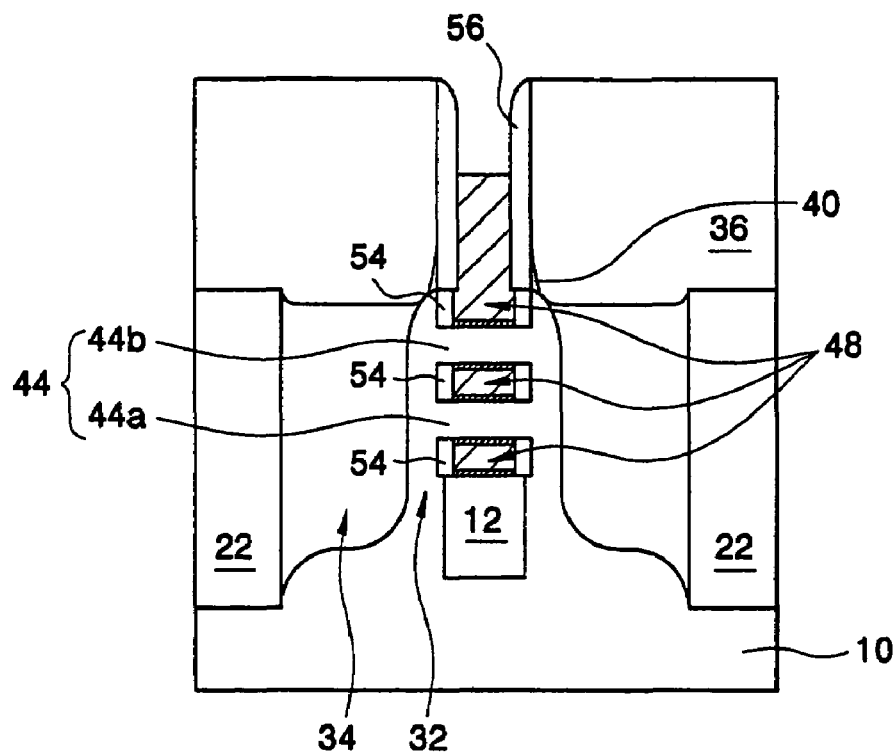

Referring to FIG. 7K, in the same manner as shown in FIG. 3P of Embodiment 1, a gate electrode 48 is formed so as to fill up the tunnels 42a and 42b and the tunnel groove 42c and to surround the channels 44a and 44b. In some embodiments, the gate electrode 48 comprises a doped polysilicon.

Figure 7L:
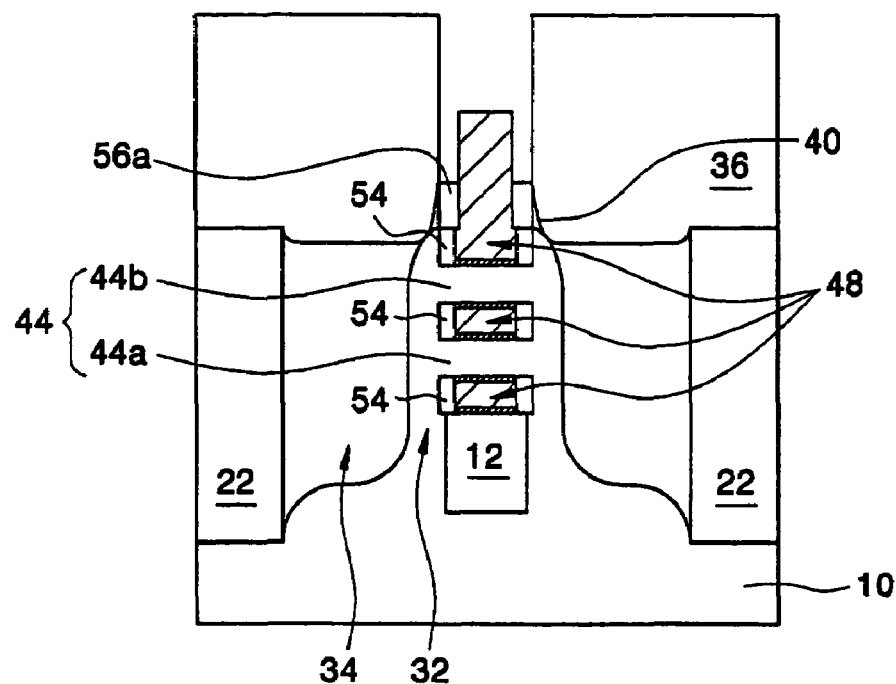

Referring to FIG. 7L, the insulating layer spacers 56 are selectively removed to expose the top surface and a portion of the sidewalls of the gate electrode 48. That is, spacer residues 56a remain on the lower portion of the sidewalls of the gate electrode 48.

Figure 7M:
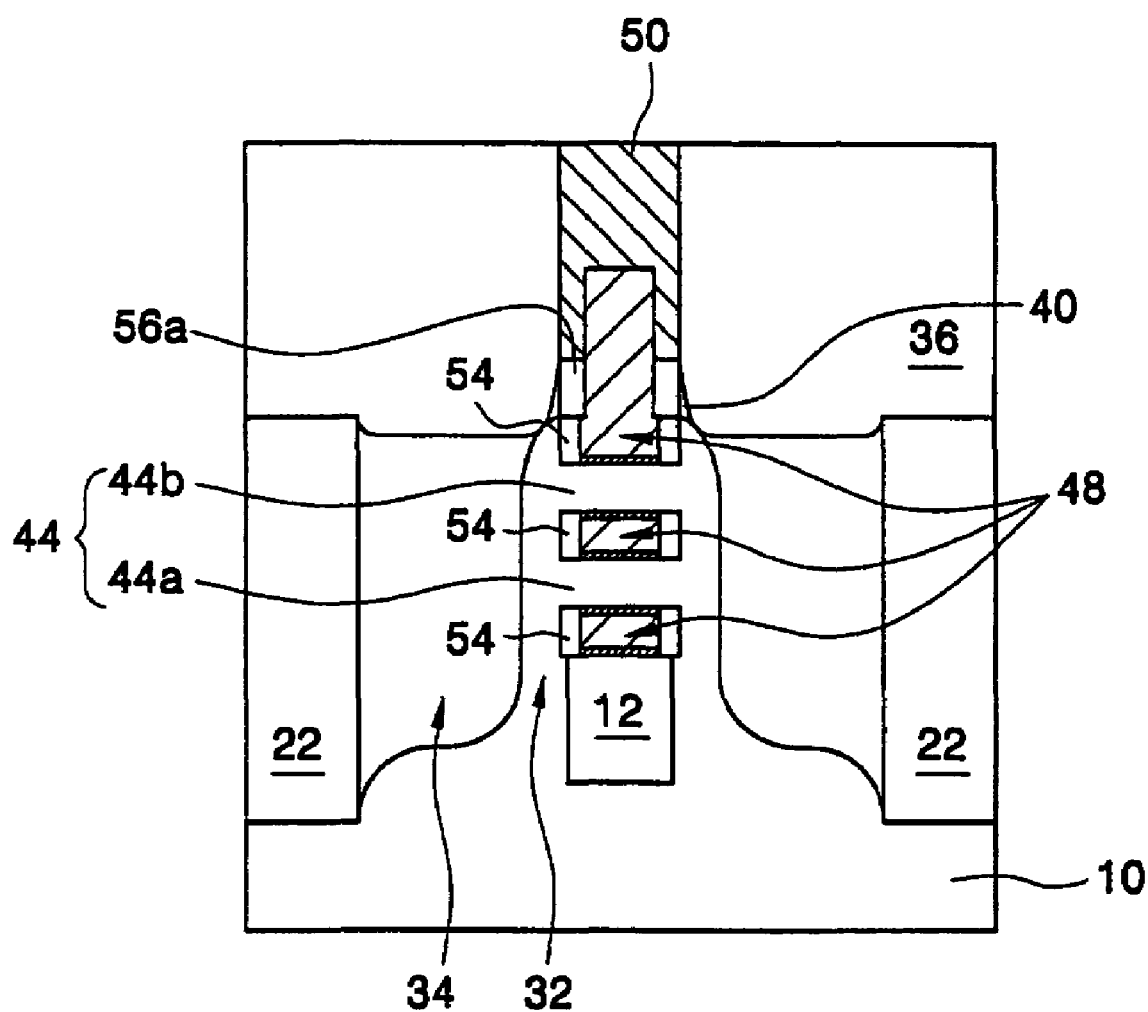

Referring to FIG. 7M, in the same manner as shown in FIG. 3G of Embodiment 1, a gate stack layer 50 having a metal silicide for reducing a gate resistance is formed on the top surface and a portion of the upper sidewalls of the exposed gate electrode 48. Here, the width of the gate stack layer 50 is same as the length of the channels 44a and 44b, while the width of the gate electrode 48 is same as the length of the tunnel 42. Accordingly, there is formed a notched gate profile where the gate stack layer 50 protrudes as compared with the gate electrode 48. The notched gate profile can reduce the contact resistance between the gate electrode 48 and the gate stack layer 50.

Next, the insulating layer spacers 56 and the mask patterns 36 are removed as shown in FIG. 6B.

According to the second embodiments of the present invention, the gate spacers 54 comprised of an insulating material are formed between the gate electrode 48 and the source/drain regions 34, which can decrease the overlap capacitance between the gate electrode and the source/drain. Further, the contact resistance between the gate electrode 48 and the gate stack layer 50 can be reduced because the gate stack layer 50 is formed to surround a portion of the sidewalls of the gate electrode 48.

Embodiment 3

Figure 8:
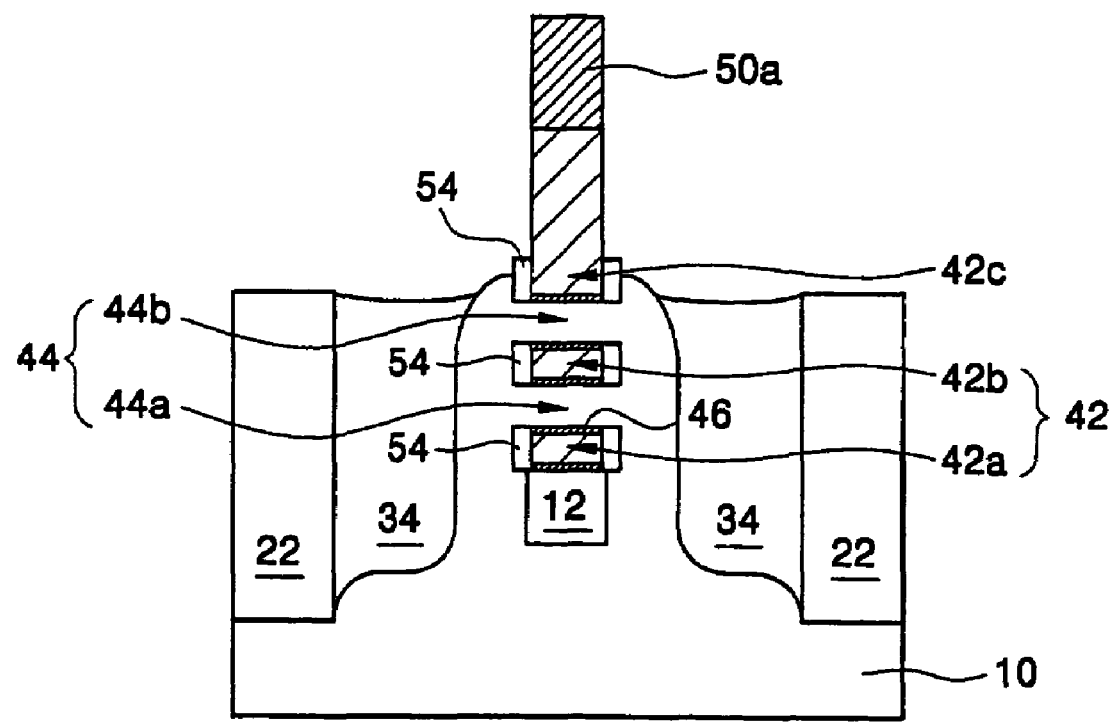
FIG. 8 is a cross-sectional view of a device in accordance with third embodiments of the present invention.

FIG. 8 is a cross-sectional view of a device in accordance with third embodiments of the present invention. A device of the present embodiments is similar to the device of Embodiment 2 except that the polysilicon gate electrode 48 has the same width as that of the gate stack layer 50a comprised of a metal silicide.

A gate-insulating layer 46 is formed in the same manner as shown in FIGS. 7A to 7J of Embodiment 2. Thereafter, a polysilicon gate electrode 48 is formed so as to extend through and/or fill the plurality of tunnels 42a and 42b and the tunnel groove 42c and to surround the plurality of channels 44a and 44b. Accordingly, the polysilicon gate electrode 48 is formed to have the same width as the horizontal width of the tunnels 42a and 42b.

After forming the gate stack layer 50 comprising a metal silicide on the polysilicon gate electrode 48, the insulating layer spacers 56 formed on the sidewalls of the gate trench 38 are removed. So, the gate stack layer 50 is formed to have the same width as that of the gate electrode 48.

In the same manner as in Embodiment 1, a conductive material is deposited and etched back to form source/drain regions 34, after growing an epitaxial single crystalline film on the sides of the active channel pattern of the channel region to form source/drain extension layers. Alternatively, the etched regions of the active pattern is provided with or filled with an epitaxial single crystalline film or a conductive material such as doped polysilicon, metal, metal silicide, etc., to thereby form the source/drain regions 34 as shown in FIG. 8.

Embodiment 4

FIGS. 9A to 9J are cross-sectional views illustrating methods of manufacturing semiconductor devices in accordance with fourth embodiments of the present invention. In the present embodiments, the same elements as those in Embodiment 1 are indicated by the same numerals.

Figure 9A:
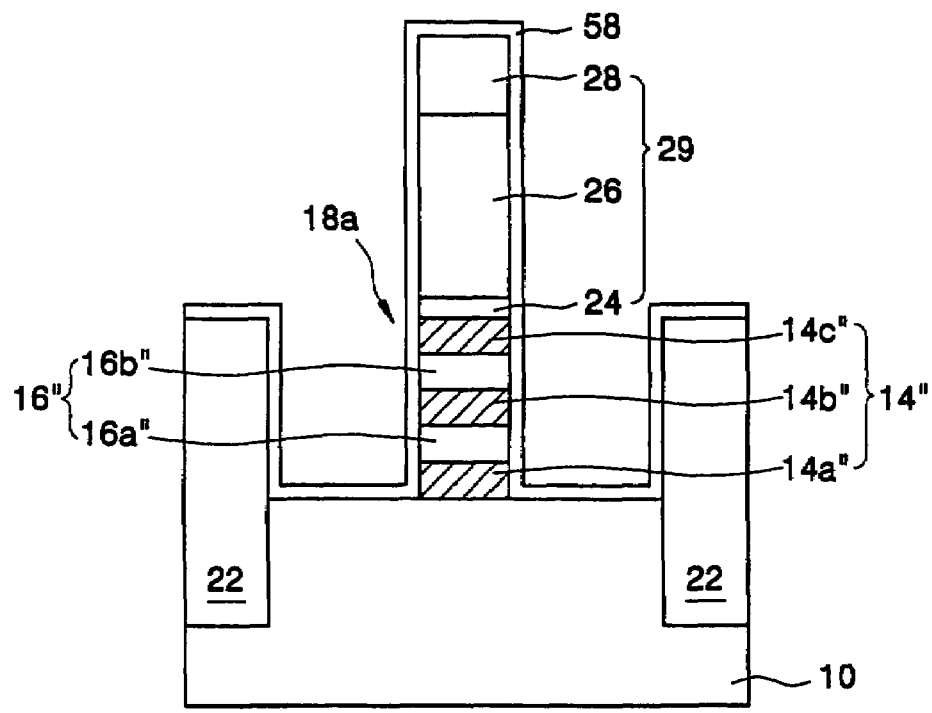
FIGS. 9A to 9J are cross-sectional views illustrating methods of manufacturing a device in accordance with fourth embodiments of the present invention.

Referring to FIG. 9A, in the same manner as shown in FIGS. 3A to 3F of Embodiment 1, an pre-active pattern 18 in which a plurality of interchannel layers 14 and a plurality of channel layers 16 are stacked alternately with each other and field regions 22 surrounding the pre-active pattern 18 are formed on a semiconductor substrate 10. In some embodiments, the interchannel layers 14 comprise single crystalline Ge film or single crystalline SiGe film, while the channel layers 16 comprise single crystalline Si film.

Next, a gate hard mask 29 comprising an etch-stopping layer pattern 24, a dummy gate pattern 26 and an anti-reflective layer pattern 28 is formed on the pre-active pattern 18.

Using the gate hard mask 29, the pre-active pattern 18 is etched away until the surface of the substrate 10 is exposed, thereby forming regions 30 where the source/drain regions are to be formed. Thus, on the channel region under the gate hard mask 29, an active channel pattern 18a comprising a second channel layer pattern 16" and a second interchannel layer pattern 14" is formed from the pre-active pattern 18 as shown. The second channel layer pattern 16" is comprised of a plurality of second channel layer patterns 16a" and 16b" and the second interchannel layer pattern 14" is comprised of a plurality of interchannel layer patterns 14a", 14b" and 14c". The etching process is further preformed for sufficient time to etch the upper portion of the substrate 10 to below the projected range of the heavily doped region 12.

Thereafter, an oxidation blocking layer 58 comprising a material having an etch selectivity with respect to the field regions 22, such as silicon nitride, is formed on the inner surfaces of the etched regions 30, the surface of the active channel pattern 18a and the surfaces of the field regions 22.

Figure 9B:
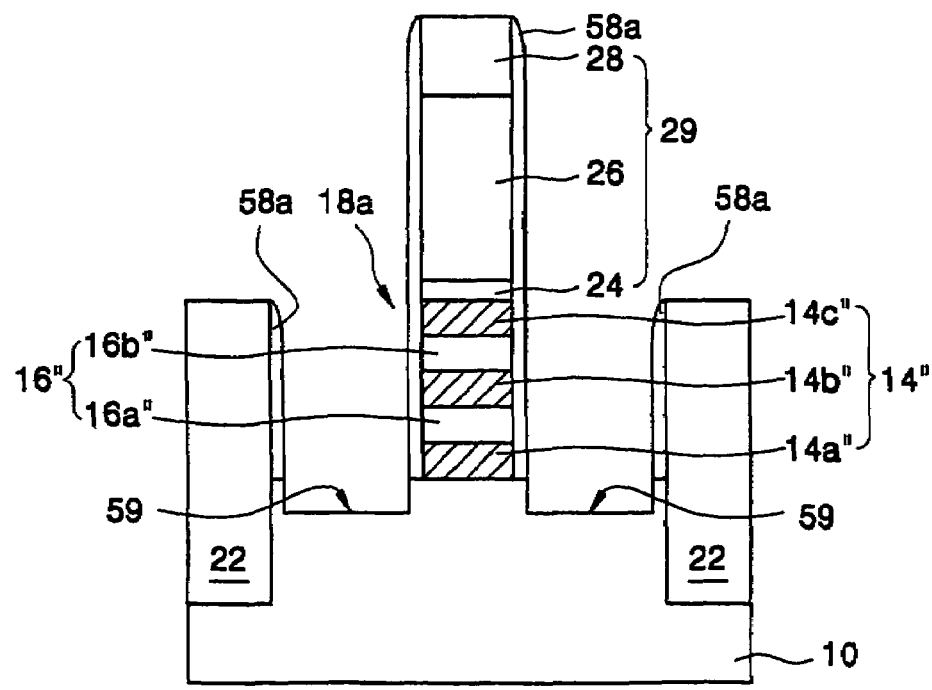

Referring to FIG. 9B, the oxidation blocking layer 58 is anisotropically etched away to form anti-oxidation spacers 58a only the sidewalls of the active channel pattern 18a and the inner sides of the etched regions 30 and simultaneously, to expose the surface 59 of the semiconductor substrate 10 of the etched regions 30, i.e., the bottoms of the source/drain.

Figure 9C:
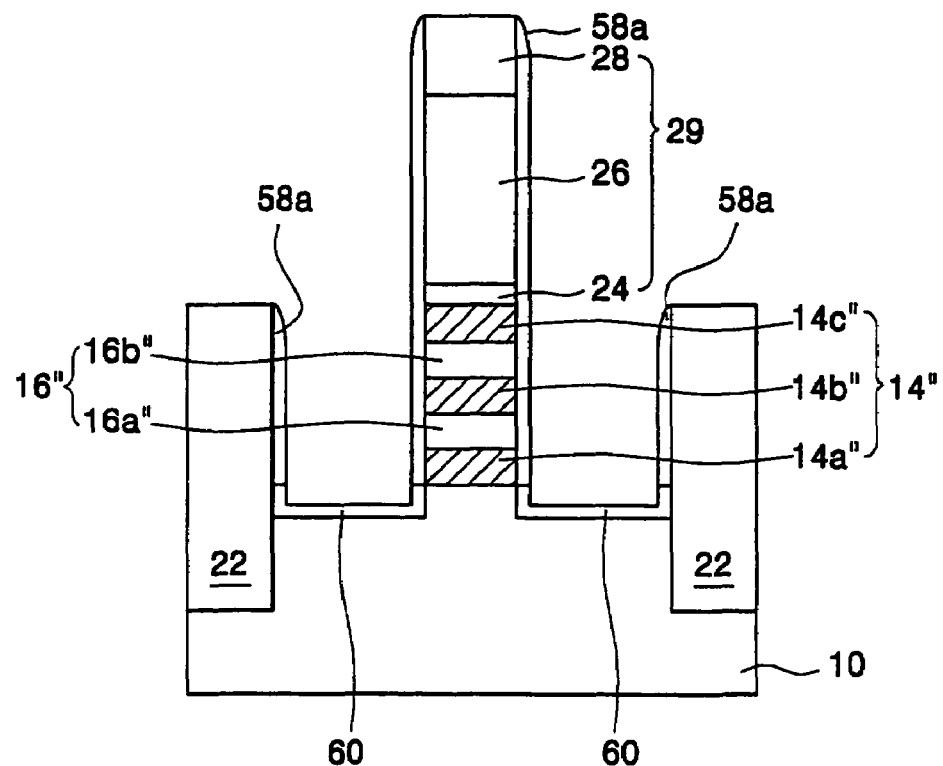
Figure 9D:
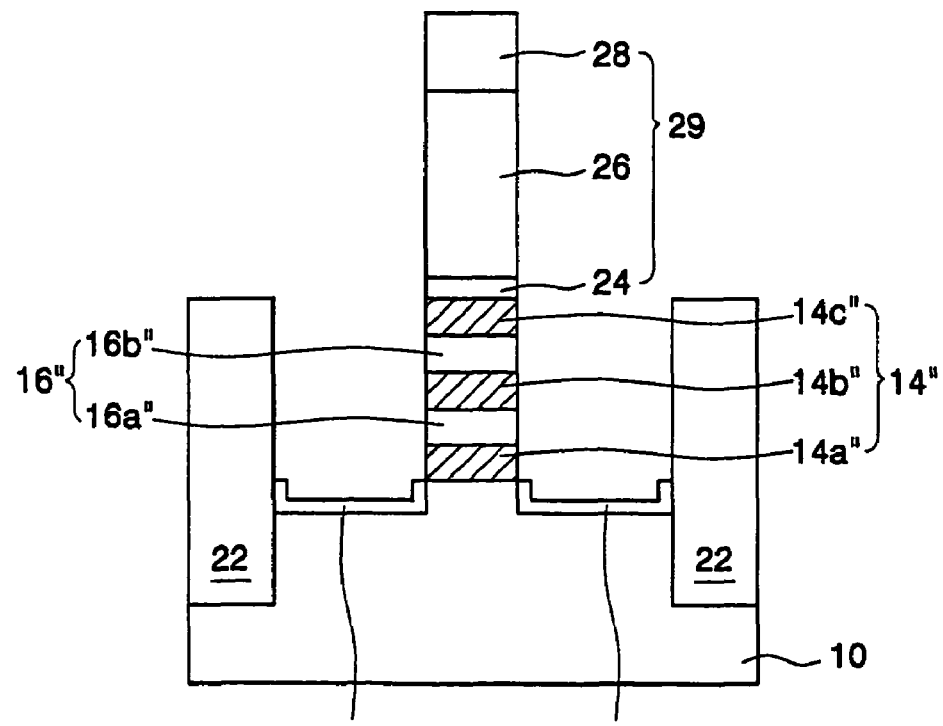
Figure 9E:
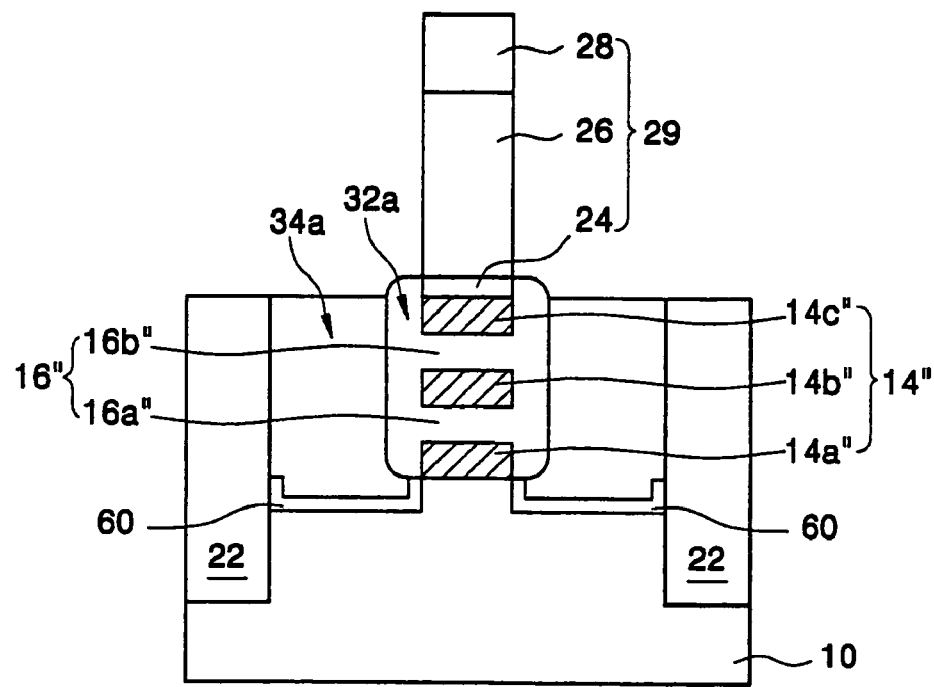

Referring to FIG. 9C, through a thermal oxidation process, the exposed surface of the substrate 59 is oxidized to form insulating layer patterns 60 comprised of silicon oxide only on the bottoms of the source/drain. Referring to FIG. 9D, the anti-oxidation spacers 58a are selectively removed through a wet etching process such as phosphoric acid stripping. Referring to FIG. 9E, in the same manner as shown in FIG. 3G of Embodiment 1, a selective epitaxial single crystalline film is partially grown on the sides of the active channel pattern 18a to form source/drain extension layers 32a.

In the same manner as shown in FIG. 3H of Embodiment 1, a conductive film such as doped polysilicon, metal, metal silicide, etc. is deposited on the surface of the resultant structure including the source/drain extension layers 32a and then, etched back to form source/drain regions 34a filling up the etched regions 30. Here, the epitaxial single crystalline film is thickly grown on the sides of the active channel pattern 18a because it is grown only on the silicon region excluding the insulating layer patterns 60. Accordingly, a tail 34a of the conductive film for source/drain may not remain under the sidewalls of the dummy gate pattern 26 in contrast to Embodiments 1 to 3.

Here, before depositing the conductive film, a tilted ion implantation may be executed to dope the source/drain extension layers 32a comprised of the selective epitaxial single crystalline film with impurities. Alternatively or in addition, the source/drain extension layers 32 can be doped by solid-phase diffusing a dopant from the source/drain regions in a subsequent annealing process. In either case, the source/drain extension layers 32a and the source/drain regions 34a can have uniform doping profile in a direction perpendicular to the channel region.

Figure 9F:
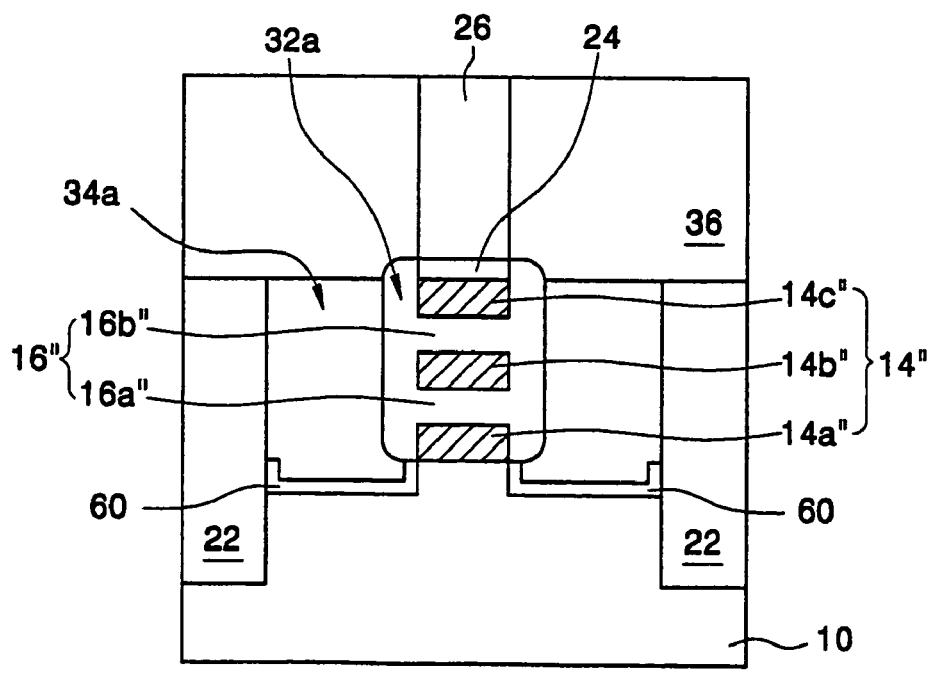

Referring to FIG. 9F, in the same manner as shown in FIG. 3I of Embodiment 1, silicon nitride is deposited on the source/drain regions 34a, the active channel pattern 18a of the channel region and the substrate 10, thereby forming a mask layer. Then, the mask layer is planarized until the surface of the dummy gate pattern 26 is exposed, thereby forming a mask pattern 36 exposing the dummy gate pattern 26.

Figure 9G:
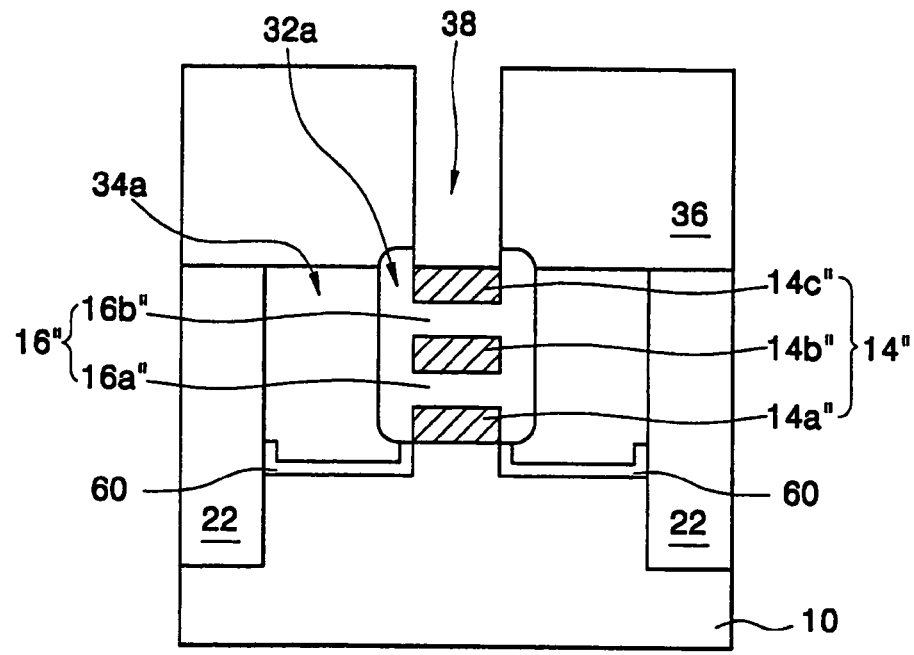

Referring to FIG. 9G, in the same manner as shown in FIG. 3K of Embodiment 1, the dummy gate pattern 26 is selectively removed by using the mask pattern 36, thereby forming a gate trench 38. Then, the etch-stopping layer pattern 24 exposed through the gate trench 38 is removed. If the active channel pattern 18a of the channel region is not doped, an impurity is locally ion-implanted through the gate trench 38 to thereby dope the active channel pattern 18a of the channel region. In some embodiments, the channel ion implantation is carried out such that the projected range is formed within each of the channel layers 16". Alternatively, in other embodiments, the channel ion implantation is executed such that the channel layers 16" have different doping concentrations from each other so that the obtained transistor successively operates according to the applied gate voltage.

Figure 9H:
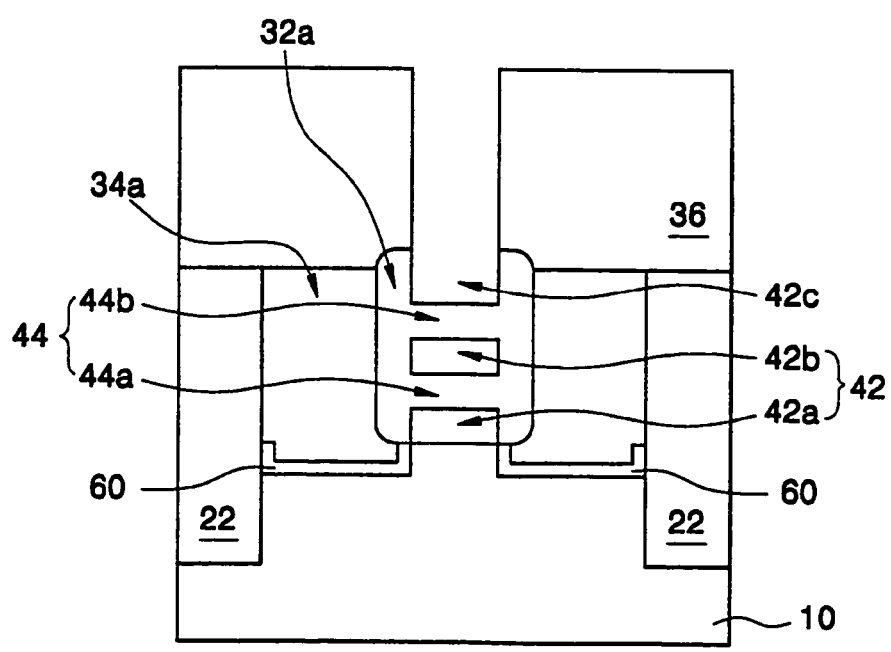

Referring to FIG. 9H, in the same manner as shown in FIG. 3M of Embodiment 1, the field regions 22 are selectively etched using the source/drain regions 34a as an etching mask, thereby exposing the sides of the active channel pattern 18a of the channel region. Then, in the same manner as shown in FIG. 3N of Embodiment 1, the plurality of interchannel layer patterns 14a", 14b" and 14c" are selectively removed through an isotropic etching process, thereby forming a plurality of tunnels 42 and 42b passing through the active channel pattern 18a and a tunnel groove 42c located at an uppermost position. Here, the second channel layer patterns 16a" and 16b" form a plurality of channels 44a and 44b.

Figure 9I:
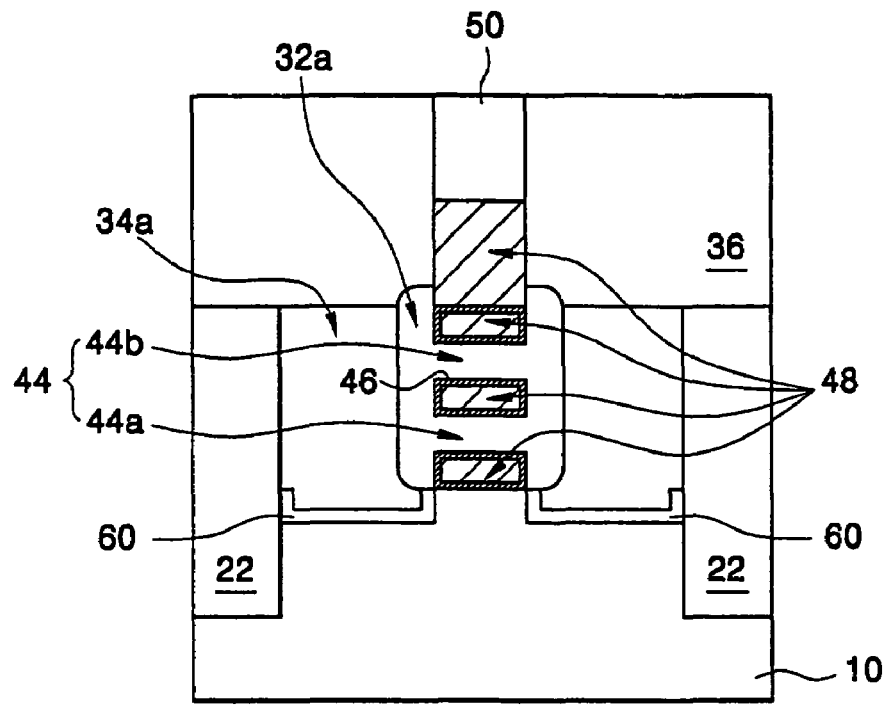

Referring to FIG. 9I, in the same manner as shown in FIG. 3O of Embodiment 1, a thermal oxidation process is carried out to form a gate-insulating layer 46 on the surfaces of the plurality of channels 44a and 44b (particularly, including the plurality of tunnels 42a and 42b and the tunnel groove 42c).

Here, in order to reduce the surface roughness of the channels 44a and 44b, a heat treatment may be performed at a high temperature in a hydrogen ($H_2$) or argon (Ar) ambient before forming the gate-insulating layer 46.

Then, in the same manner as shown in FIG. 3P of Embodiment 1, a polysilicon gate electrode 48 is formed so as to extend through and/or fill up the tunnels 42a and 42b and the tunnel groove 42c and to surround the plurality of channels 44a and 44b. A gate stack layer 50 comprising of metal silicide for reducing a gate resistance is formed on the top of the polysilicon gate electrode 48.

Figure 9J:
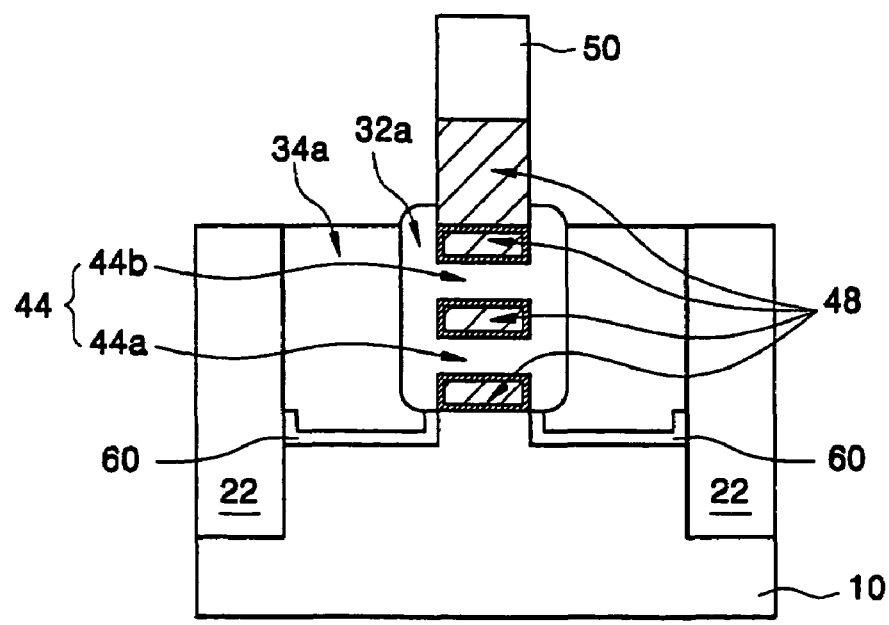

Referring to FIG. 9J, in the same manner as shown in FIG. 3R of Embodiment 1, the mask patterns 36 are removed and then, subsequent processes such as metal interconnection are carried out to complete the vertical MOS transistor.

According to the fourth embodiments of the present invention, the insulating layer patterns 60 are formed on the bottoms of the source/drain regions to thereby decrease the source/drain junction capacitance.

Embodiment 5

Figure 10:
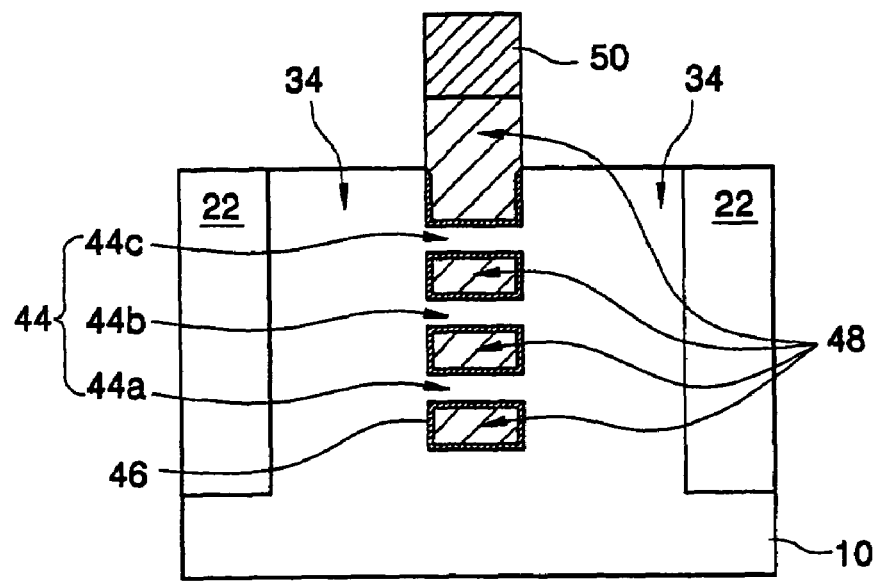
FIG. 10 is a cross-sectional view of a device according to fifth embodiments of the present invention.

FIG. 10 is a cross-sectional view of a device in accordance with fifth embodiments of the present invention. In the present embodiments, the same elements as those in Embodiment 1 are indicated by the same numerals.

In the present embodiments, after performing processes in the same manner as shown in FIGS. 3A to 3F of Embodiment 1, a pre-active pattern 18 is etched away to form etched regions 30 where the source/drain regions are to be formed and an active channel pattern 18a. Then, the etched regions 30 are filled with a selective epitaxial single crystalline film to form source/drain regions 34. Next, in the same manner as shown in FIGS. 3I to 3R, subsequent processes are executed to form the semiconductor device.

Accordingly, the present embodiment is similar to Embodiment 1 except that the etched regions 30 are completely filled by an epitaxial method to form the source/drain regions 34 without forming additional source/drain extension layers.

In the present embodiment, gate spacers 54 comprising an insulating material may be formed between a gate electrode 48 and the source/drain regions 34 by combining a method as shown in Embodiment 2 or 3. Further, insulating layer patterns 60 may be formed on the bottoms of the source/drain regions 34 by combining a method as shown in Embodiment 4.

Embodiment 6

Figure 11:
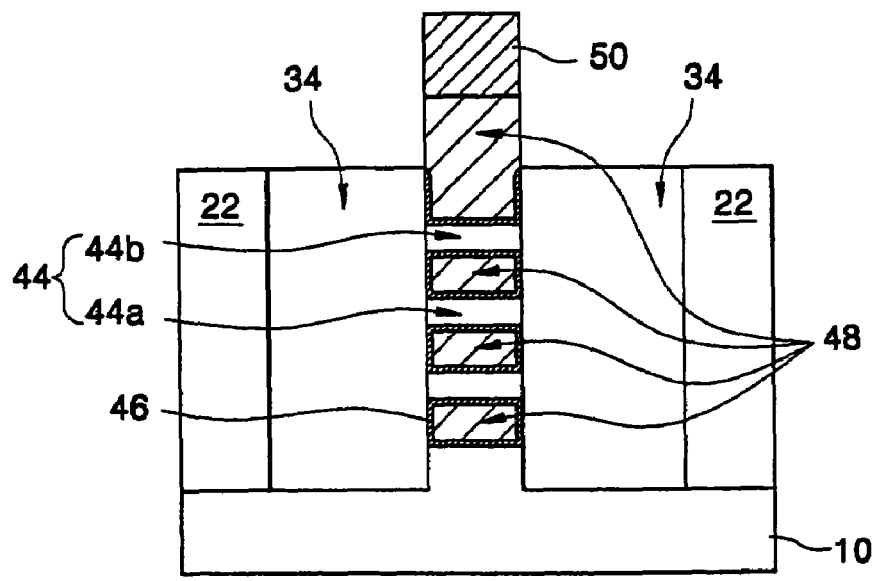
FIG. 11 is a cross-sectional view of a device according to sixth embodiments of the present invention.

FIG. 11 is a cross-sectional view of a semiconductor device in accordance with sixth embodiments of the present invention. In the present embodiments, the same elements as those in Embodiment 1 are indicated by the same numerals.

The semiconductor device of the present embodiments is similar to Embodiment 5 in which a pre-active pattern 18 is etched away to form etched regions 30 for source/drain and an active channel pattern 18a in the same manner as shown in FIGS. 3A to 3F of Embodiment 1, except that the conductive film such as doped polysilicon, metal, metal silicide, etc., is deposited and then, etched back to form source/drain regions 34 on the etched regions 30 instead of filling the etched regions 30 with a selective epitaxial single crystalline film as shown in Embodiment 5.

In the present embodiments, it may be unnecessary to form additional source/drain extension layers in the same manner as in Embodiment 5. Further, a vertical MOS transistor having multiple channels can be obtained by combining a method as shown in Embodiment 2, Embodiment 3 or Embodiment 4 with Embodiment 6.

Embodiment 7

Figure 12:
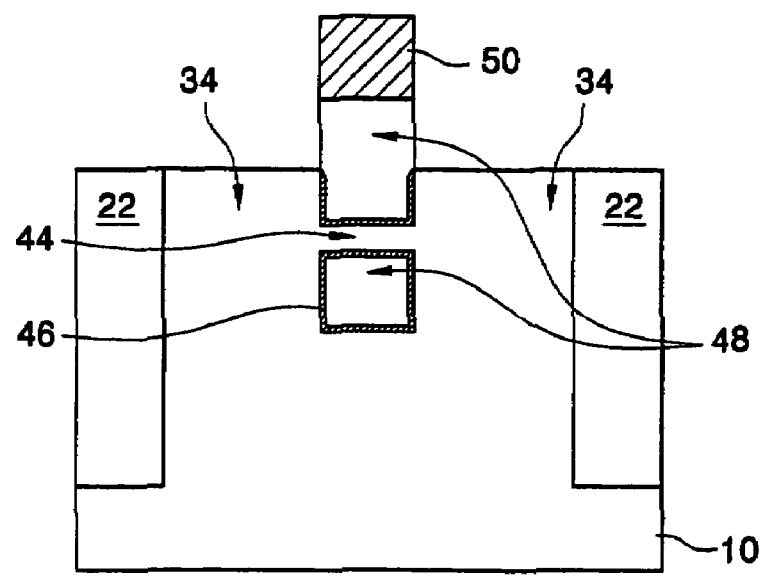
FIG. 12 is a cross-sectional view of a device in accordance with seventh embodiments of the present invention.

FIG. 12 is a cross-sectional view of a semiconductor device in accordance with seventh embodiments of the present invention. The semiconductor device of the present embodiment is similar to that of Embodiment 5 except that the number of channels 44 and the thickness of tunnels are different from those of the semiconductor device shown in Embodiment 5 by controlling the thickness and the repetitive number of the interchannel layers and the channel layers constituting the active pattern.

Embodiment 8

Figure 13:
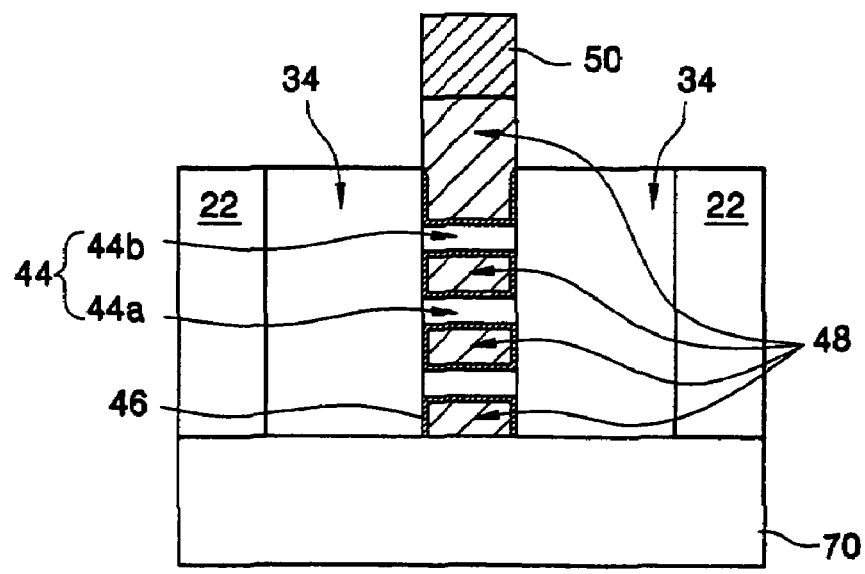
FIG. 13 is a cross-sectional view of a device in accordance with eighth embodiments of the present invention.

FIG. 13 is a cross-sectional view of a semiconductor device in accordance with eighth embodiments of the present invention. The semiconductor device of the present embodiments is formed on an oxide layer 70 of SOI substrate in the same manner as shown in Embodiment 5 or Embodiment 6.

Particularly, there is provided a vertical MOS transistor having an active channel pattern comprising a plurality of channels 44a, 44b and 44c on the oxide layer 70 of SOI substrate with tunnels interposed between each of the channels, source/drain regions 34 formed so as to connect with the plurality of channels 44a, 44b and 44c on both sides of the active channel pattern and a gate electrode 48 formed on the active channel pattern so as to extend through or fill up the tunnels and to surround the plurality of channels 44a, 44b and 44c.

The vertical MOS transistor can be obtained by combining a method as shown in the other previous Embodiments. As is well known to those having skill in the art, the SOI substrate has a lower semiconductor substrate (not shown) and the buried oxide layer 70 formed on the substrate.

In the present embodiments, a plurality of interchannel layers comprising single crystalline Ge or single crystalline SiGe film and a plurality of channel layers comprising single crystalline Si film are stacked alternately with each other on the buried oxide layer 70. Then, the plurality of interchannel layers and the plurality of channel layers are patterned to form a pre-active pattern.

Embodiment 9

Figure 14:
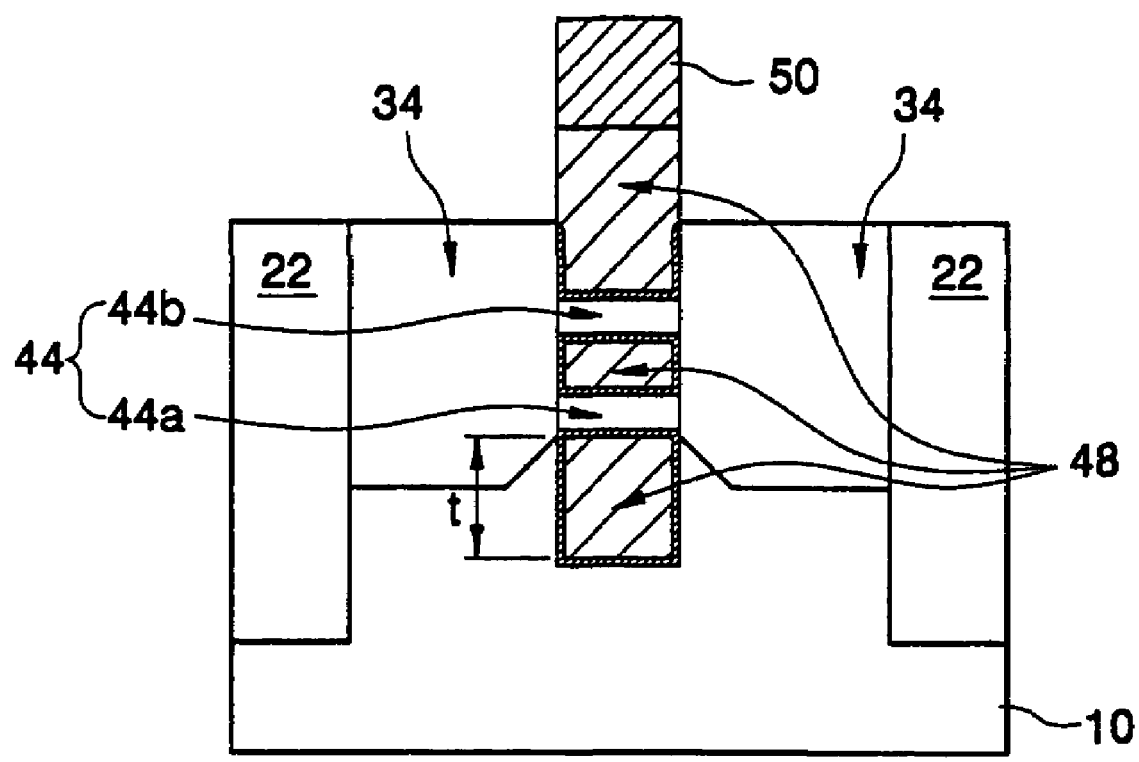
FIG. 14 is a cross-sectional view of a device according to ninth embodiments of the present invention.

FIG. 14 is a cross-sectional view of a semiconductor device in accordance with ninth embodiments of the present invention. The semiconductor device of the present embodiments is similar to that shown in FIG. 5 of Embodiment 5 except that the thickness (t) of the lowest tunnel filled with a gate electrode 48 is formed thicker than the other tunnels so as to reduce or prevent the operation of the parasitic transistor of the lowest channel 44a. The same numerals indicate the same elements.

Particularly, in the process illustrated by referring to FIG. 3B in Embodiment 1, the thickness (t) of the lowest interchannel layer 14a is formed thicker than the other interchannel layers 14b and 14c when a plurality of interchannel layers 14 and a plurality of channel layers 16 are stacked alternately with each other on a semiconductor substrate 10. In the same manner as shown in FIGS. 3D to 3F of Embodiment 1, the plurality of interchannel layers 14 and the plurality of channel layers 16 are patterned to form a pre-active pattern 18 and then, the pre-active pattern 19 is etched away until the surface of the substrate 10 is exposed, thereby defining regions where source/drain regions are to be formed and simultaneously, forming an active channel pattern 18a including interchannel layer patterns and channel layer patterns.

In the same manner as in Embodiment 5, an epitaxial single crystalline film is grown so as to fill up the etched regions and then, doped up to the upper portion of the lower interchannel layer, thereby forming source/drain regions 34. Subsequent processes are similar to the above-described embodiments.

Embodiment 10

FIGS. 15A to 15E are cross-sectional views illustrating methods of manufacturing a semiconductor device in accordance with tenth embodiments of the present invention.

Figure 15A:
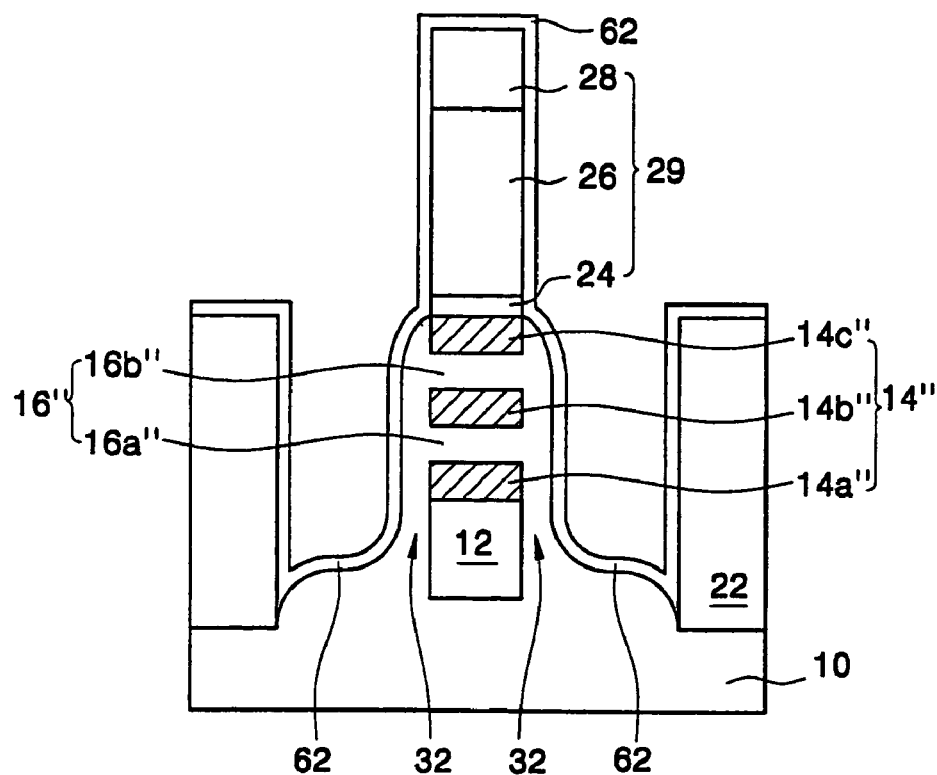
FIGS. 15A to 15F are cross-sectional views illustrating methods of manufacturing a device according to tenth embodiments of the present invention.

Referring to FIG. 15A, in the same manner as shown in FIGS. 3A to 3C of Embodiment 1, an pre-active pattern 18 in which a plurality of interchannel layers 14 and a plurality of channel layers 16 are stacked alternately with each other and field regions 22 surrounding the pre-active pattern 18 are formed on a substrate 10. In some embodiments, the plurality of interchannel layers 14 comprises single crystalline Ge or single crystalline SiGe film, while the plurality of channel layers 16 comprises single crystalline Si film.

Thereafter, in the same manner as shown in FIGS. 3D and 3E in Embodiment 1, a gate hard mask 29 including a dummy gate pattern (not shown) is formed on the pre-active pattern.

In the same manner as shown in FIG. 3F of Embodiment 1, the pre-active pattern 18 is etched away using the gate hard mask 29 until the surface of the substrate 10 is exposed, thereby forming regions 30 where source/drain are to be formed. As a result, only pre-active pattern 18 of the channel region remains.

Then, in the same manner as shown in FIG. 3G of Embodiment 1, a selective epitaxial single crystalline film is partially grown on the sides of the pre-active pattern 18 and the exposed surface of the substrate 10, thereby forming source/drain extension layers 32. A tilted ion implantation may be carried out to dope the source/drain extension layers 32 with impurities.

Next, as shown in FIG. 15A, silicon nitride is deposited on the entire surface of the resultant structure to form a first insulating layer 62. Particularly, the first insulating layer 62 comprised of an insulating material having an etch selectivity with respect to the pre-active pattern 18 and the field regions 22, e.g., silicon nitride, is formed on the entire surface of the substrate including the field regions 22 and the source/drain extension layers 32.

Figure 15B:
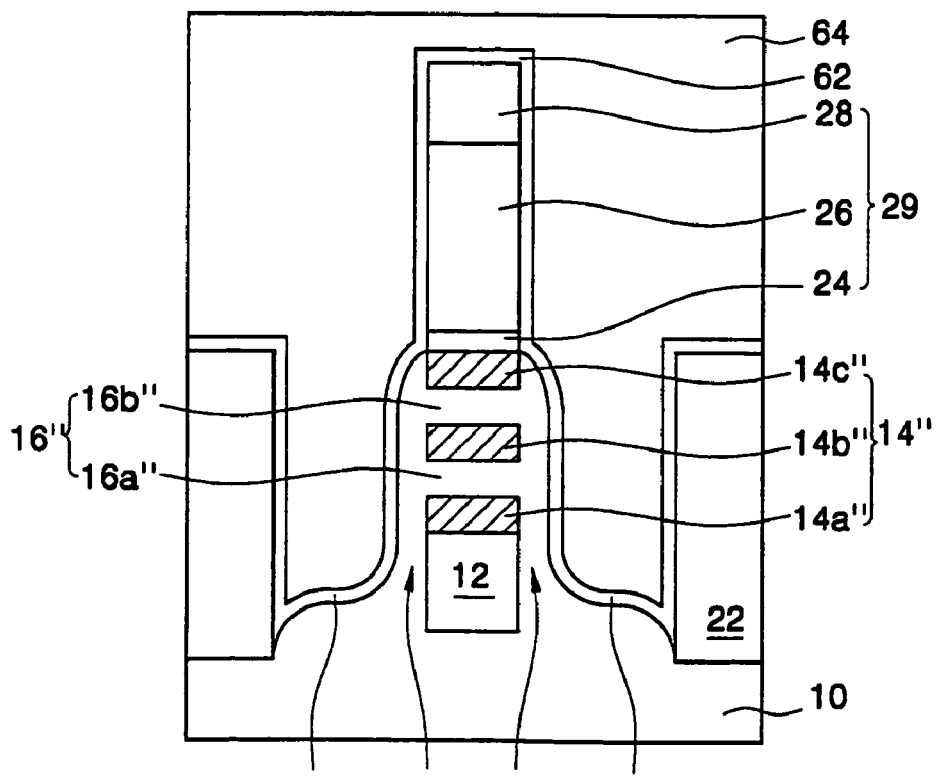

Referring to FIG. 15B, a second insulating layer 64 is deposited on the first insulating layer 62 so as to, in some embodiments, sufficiently fill up the regions where the source/drain are to be formed between the source/drain extension layers 32 and the field regions 22. The second insulating layer 64 comprises a material having an etch selectivity with respect to the first insulating layer 62. In some embodiments, the second insulating layer 64 is comprised of the same material as that constituting the field regions 62, e.g., silicon oxide.

Figure 15C:
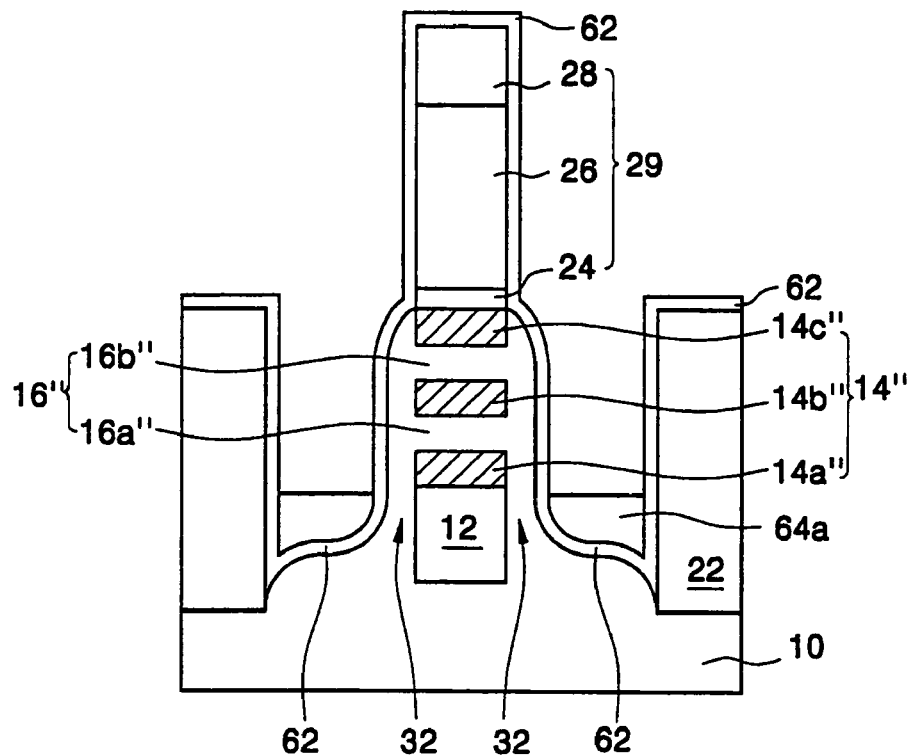

Referring to FIG. 15C, the second insulating layer 64 is etched back to the lowest tunnel, thereby forming second insulating layer patterns 64a on the bottoms of the regions where the source/drain are to be formed.

Figure 15D:
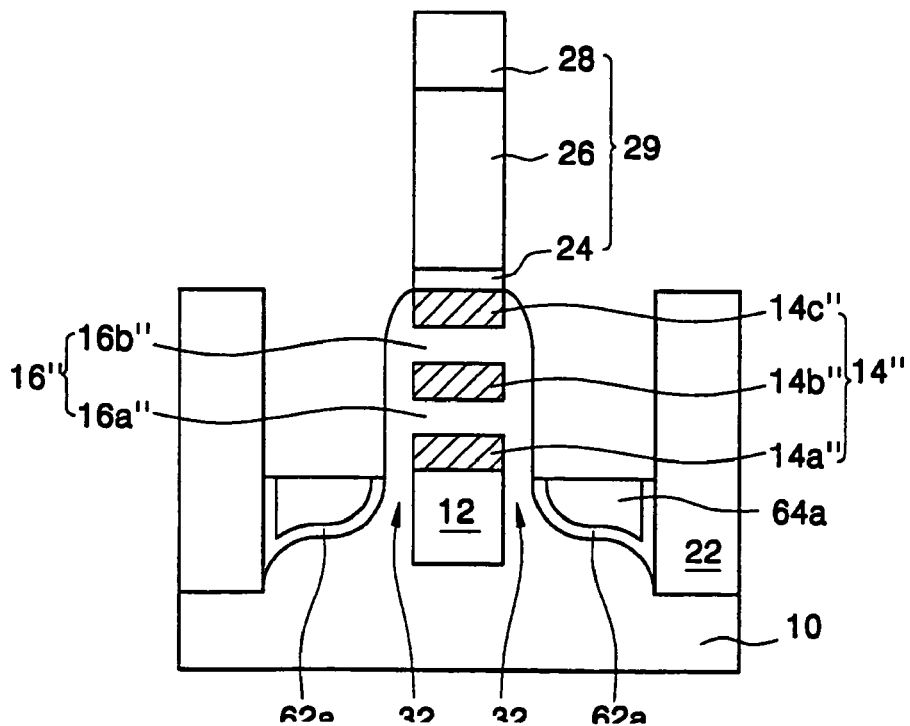

Referring to FIG. 15D, using the second insulating layer patterns 64a as an etching mask, the first insulating layer 62 is etched back to form first insulating layer patterns 62a under each of the second insulating layer patterns 64a.

Figure 15E:
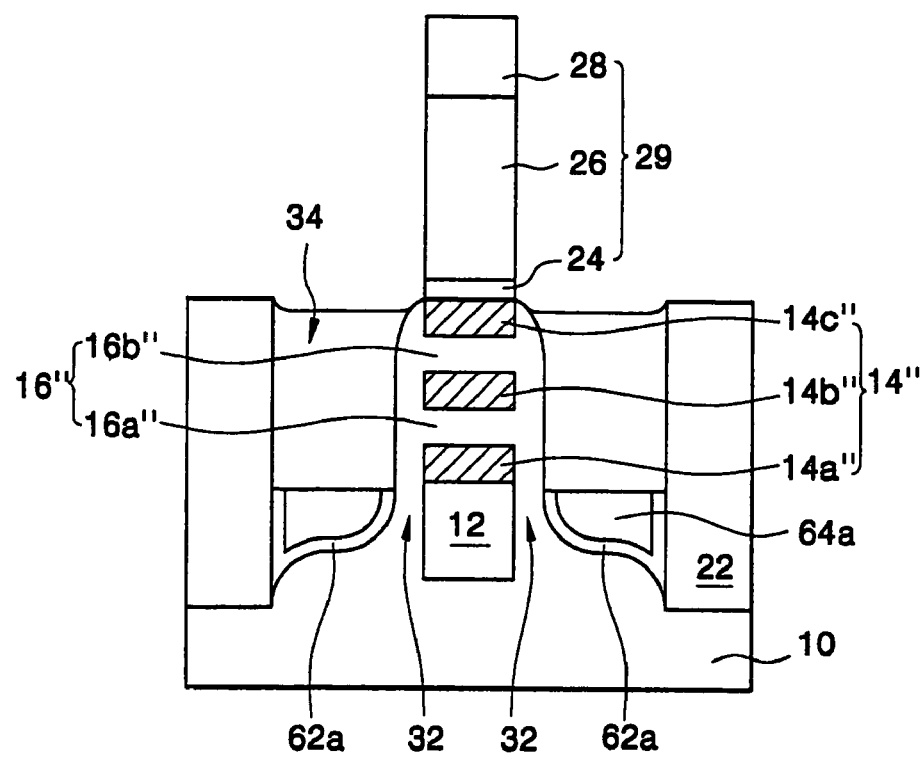

Referring to FIG. 15E, the regions where the source/drain are to be formed between the field regions 22 and the source/drain extension layers 32 are provided with or filled with a conductive film such as doped polysilicon, metal, metal silicide, etc., thereby forming source/drain regions 34.

Figure 15F:
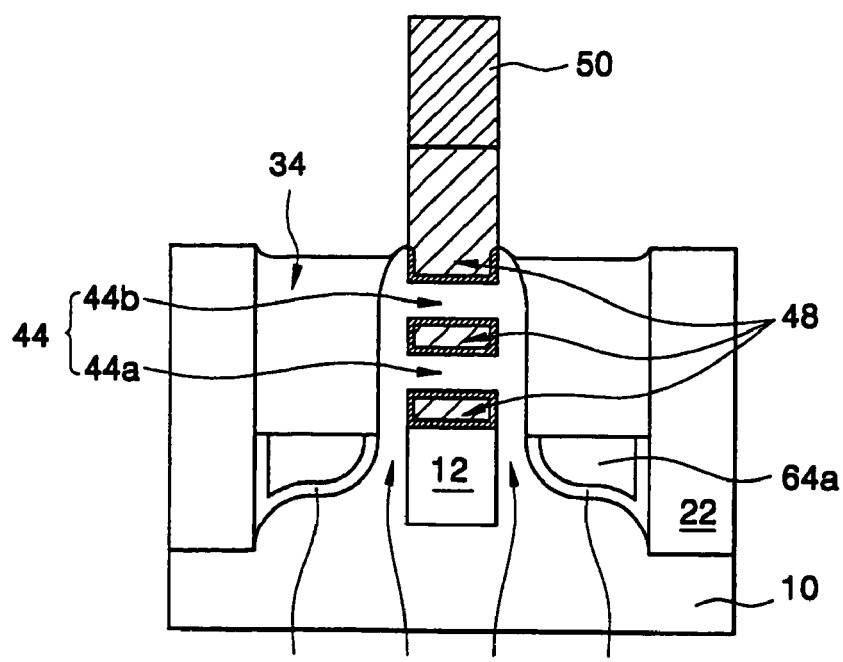

Next, in the same manner as shown in FIGS. 3I to 3R of Embodiment 1, the semiconductor device is manufactured as shown in FIG. 15F.

According to the present embodiments, an insulating layer stack structure including the first insulating layer pattern 62a and the second insulating layer pattern 64a is formed on the bottoms of the source/drain regions 34, which can decrease in the source/drain junction capacitance.

Embodiment 11

Figure 16A:
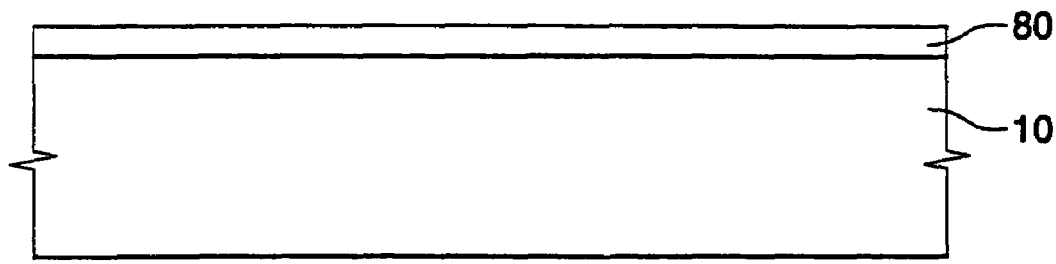
FIGS. 16A to 16C are cross-sectional views illustrating methods of manufacturing a device in accordance with eleventh embodiments of the present invention.
Figure 16B:
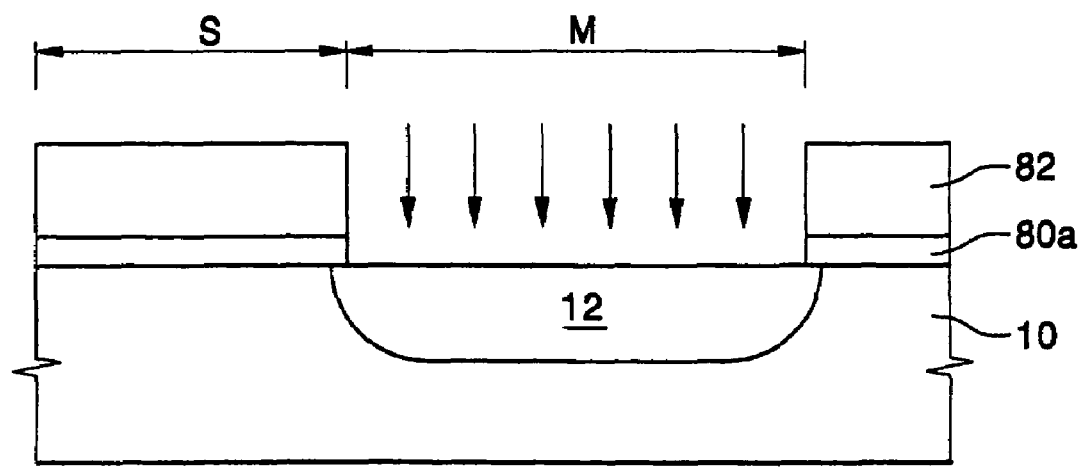
Figure 16C:
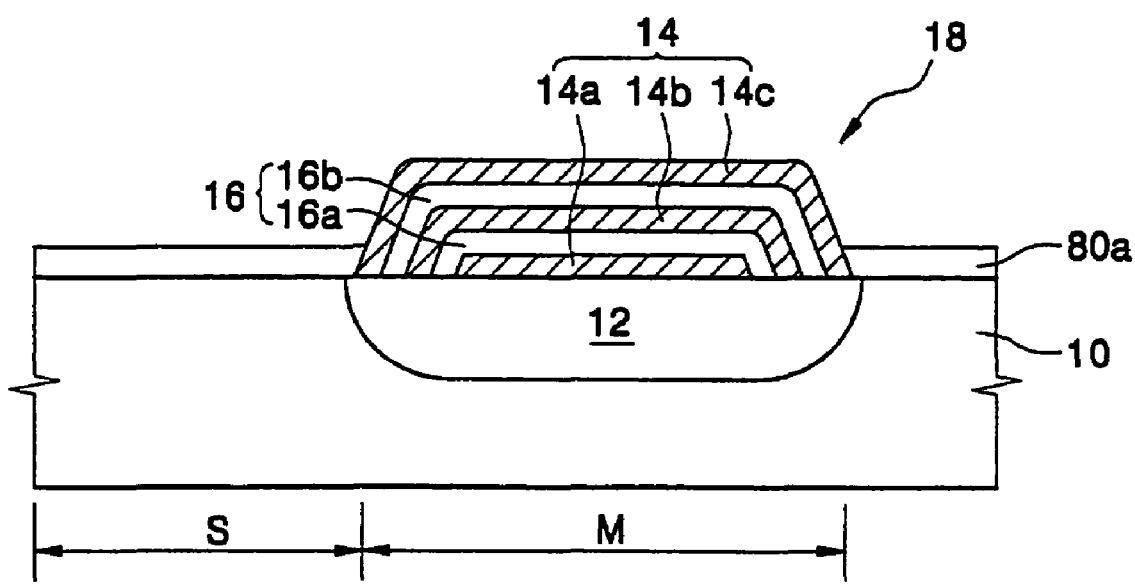

FIGS. 16A to 16C are cross-sectional views illustrating semiconductor devices and methods of manufacturing the same in accordance with eleventh embodiments of the present invention. In the present embodiments, the same elements as those in Embodiments 1 to 10 are indicated by the same numerals.

Referring to FIG. 16A, for example, through a chemical vapor deposition method, an oxide layer 80 is formed on a semiconductor substrate 10 comprised of silicon (Si), silicon germanium (Si—Ge), silicon-on-insulator (SOI), silicon germanium-on-insulator (SGOI) and/or other conventional substrates/layers.

Referring to FIG. 16B, a photoresist film is coated on the oxide layer 80 and then, exposed and developed to form photoresist patterns 82 opening a region M where multiple channels will be formed.

Then, using the photoresist patterns 82 as a mask, the oxide layer 80 is dry-etched away to form oxide layer patterns 80a defining a multiple channel region M and a single channel region S. That is, the oxide layer patterns 80a remain only on the typical single channel regions S.

Subsequently, an impurity of the same conductivity as that of the substrate 10 is ion-implanted in the exposed substrate surface of the multiple channel region M, thereby forming heavily doped region 12 for reducing or preventing the operation of the bottom transistor.

Referring to FIG. 16C, the photoresist patterns 82 are removed by ashing and stripping processes. Then, through a selective epitaxial growth method, a plurality of interchannel layers 14 and a plurality of channel layers 16 are stacked alternately with each other on the regions excluding the oxide layer patterns 80a, i.e., on the substrate surface of the multiple channel region M.

Particularly, a single crystalline Ge epitaxial film or a single crystalline Si—Ge epitaxial film is selectively grown to a thickness of about 300 Å on the surface of the substrate 10 excluding the oxide layer patterns 80a, thereby forming a first interchannel layer 14a. Then, a single crystalline Si epitaxial film having a thickness of about 300 Å is grown on the first interchannel layer 14a to thereby form a first channel layer 16a. Here, in order to previously perform the channel doping, the channel layer 16 may be formed of a doped single crystalline Si epitaxial film.

By doing so, no epitaxial film is grown on the single channel region S, while a pre-active pattern 18 in which the plurality of interchannel layers 14 and the plurality of channel layers 16 are stacked alternately each other is formed on the multiple channel region M.

Then, in the same manner as shown in Embodiments 1 to 10, subsequent processes are carried out to form the semiconductor device.

According to some embodiments of the present invention as described above, a plurality of thin channels is formed from one active pattern and the gate electrode is formed to surround the channels. Since the plurality of thin channels are stacked vertically, areas occupied by the channel region and the source/drain regions may be reduced as compared to the conventional fin-type MOS transistor.

Further, in some embodiments of the present invention, the source/drain regions are formed to have uniform doping profile in a direction perpendicular to the plurality of channels, so that uniform source/drain junction capacitance can be maintained even though the number and the area of the channels increase. Thus, while reducing or minimizing the junction capacitance, the current can increase to enhance the operating speed of the device.

According to some embodiments of the present invention, after alternately stacking the plurality of channel layers and the plurality of interchannel layers to form the active pattern, regions of the active pattern where source/drain regions are to be formed are etched away. In some embodiments, the etched regions are filled up with an epitaxial single crystalline film or a conductive material to form the source/drain regions. Since a horizontal length of the interchannel layer can be limited within a length region of the gate, the horizontal extension of the tunnels may be prevented when the interchannel layers are isotropically etched to form the tunnels in a subsequent process. So, a highly integrated MOS transistor having a gate length smaller than a channel width may be realized.

It will be understood that aspects of one or more embodiments of the present invention may be combined with each other to obtain a highly integrated vertical MOS transistor having the multiple channels.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An integrated circuit field effect transistor device comprising:
    a substrate having a surface;
    an active channel pattern on the surface comprising at least one tunnel that is stacked upon one another and spaced apart from one another and at least one channel between two adjacent tunnels or adjacent to the tunnel, the active channel pattern comprising single crystalline silicon;
    a gate electrode that surrounds the at least one channel and that extends through the at least one tunnel; and
    a pair of source/drain regions, a respective one of which is on the surface at a respective one of opposite sides of the active channel pattern and is electrically connected to the at least one channel.

2. The device as claimed in claim 1, further comprising a gate-insulating layer between the gate electrode and the channels.

3. The device as claimed in claim 1, further comprising a pair of source/drain extension layers, a respective one of which is between a respective one of the source/drain regions and the channels.

4. The device as claimed in claim 1, further comprising a heavily doped region in the substrate adjacent to the active channel pattern.

5. The device as claimed in claim 1, wherein a groove of a tunnel shape is formed at an uppermost portion of the active channel pattern and the gate electrode is formed to fill up the groove of the tunnel shape.

6. The device as claimed in claim 1, wherein a tunnel that is closest to the surface is thicker than remaining tunnels.

7. An integrated circuit field effect transistor device comprising:
    a substrate having a surface;
    an active channel pattern on the surface comprising at least one tunnel that is stacked upon one another and spaced apart from one another, and at least one channel between two adjacent tunnels or adjacent to the tunnel;
    a gate electrode tat surrounds the at least one channel and that extends through the at least one tunnel;
    a pair of source/drain regions, a respective one of which is on the surface at a respective one of opposite sides of the active channel pattern and is electrically connected to the at least one channel;
    a gate insulating layer formed on upper and lower surfaces of the at least one tunnel; and
    gate spacers on opposite sidewalls of the at least one tunnel and being thicker than the gate insulating layer.

8. The device as claimed in claim 7, further comprising an insulating layer between the source/drain regions and the surface of the substrate.

9. An integrated circuit field effect transistor device comprising:
    a substrate having a surface;
    an active channel pattern on the surface comprising at least one tunnel that is stacked upon one another and spaced apart from one another, and at least one channel between two adjacent tunnels or adjacent to the tunnel;
    a gate electrode that surrounds the at least one channel and that extends through the at least one tunnel;
    a pair of source/drain regions, a respective one of which is on the surface at a respective one of opposite sides of the active channel pattern and is electrically connected to the at least one channel;
    a gate insulating layer formed on inner surfaces of the at least one tunnel; and
    gate spacers on opposite sidewalls of the at least one tunnel and being configured so as to decrease an overlap capacitance between the gate electrode and the source/drain regions;
    wherein the gate spacers have a thickness corresponding to half a difference between a channel length and a tunnel length.

10. An integrated circuit field effect transistor device comprising:
    a substrate having a surface;
    an active channel pattern on the surface comprising at least one tunnel that is stacked upon one another and spaced apart from one another and at least one channel between two adjacent tunnels or adjacent to the at least one tunnel;
    a gate electrode that surrounds the at least one channel and that extends through the at least one tunnel; and
    a pair of source/drain regions, a respective one of which is on the surface at a respective one of opposite sides of the active channel pattern and is electrically connected to the at least one channel,
    wherein a tunnel that is closest to the surface is thicker than remaining tunnels.

11. The device as claimed in claim 10, wherein the source/drain regions comprise a single crystalline film that is doped up to an upper portion of a channel that is closest to the surface.

12. An integrated circuit field effect transistor device comprising:
    a substrate having a surface;
    an active channel pattern on the surface comprising at least one tunnel that is stacked upon one another and spaced apart from one another and at least one channel between two adjacent tunnels or adjacent to the tunnel;
    a gate electrode that surrounds the at least one channel and that extends through the at least one tunnel; and a pair of source/drain regions, a respective one of which is on the surface at a respective one of opposite sides of the active channel pattern and is electrically connected to the at least one channel, wherein a groove of a tunnel shape is formed at an uppermost portion of the active channel pattern.

13. The device as claimed in claim 12, wherein the gate electrode is formed to fill up the groove of the tunnel shape.

14. An integrated circuit field effect transistor device comprising:

a substrate having a surface;

an active channel pattern on the surface comprising a plurality of channels that are stacked upon one another and are spaced apart from one another to define at least one tunnel, a respective one of which is between respective adjacent ones of the channels;

a gate electrode that surrounds the plurality of channels and that extends through the at least one tunnel; and a pair of source drain regions, a respective one of which is on the surface at a respective one of opposite sides of the active channel pattern and is electrically connected to the at least one channel, wherein a groove of a tunnel shape is formed at an uppermost portion of the active channel pattern.

15. The device as claimed in claim 14, wherein the gate electrode is formed to fill up the groove of the tunnel shape.

16. The device as claimed in claim 7, wherein the gate spacers have a thickness corresponding to half a difference between a channel length and a tunnel length.

17. The device as claimed in claim 7 wherein the gate spacers are configured so as to decrease an overlap capacitance between the gate electrode and the source/drain regions.

* * * * *